(12) United States Patent
Kurokawa

(10) Patent No.: US 10,885,877 B2
(45) Date of Patent: Jan. 5, 2021

(54) DISPLAY SYSTEM AND ELECTRONIC DEVICE

(71) Applicant: SEMICONDUCTOR ENERGY LABORATORY CO., LTD., Atsugi (JP)

(72) Inventor: Yoshiyuki Kurokawa, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/465,301

(22) PCT Filed: Jan. 10, 2018

(86) PCT No.: PCT/IB2018/050138
§ 371 (c)(1),
(2) Date: May 30, 2019

(87) PCT Pub. No.: WO2018/134701
PCT Pub. Date: Jul. 26, 2018

(65) Prior Publication Data
US 2019/0348011 A1 Nov. 14, 2019

(30) Foreign Application Priority Data

Jan. 20, 2017 (JP) .................................. 2017-008039
Jan. 20, 2017 (JP) .................................. 2017-008040

(51) Int. Cl.
*G06N 3/08* (2006.01)
*G09G 5/14* (2006.01)
(Continued)

(52) U.S. Cl.
CPC .............. *G09G 5/14* (2013.01); *G06N 3/063* (2013.01); *G06N 3/08* (2013.01); *G09G 3/2092* (2013.01);
(Continued)

(58) Field of Classification Search
CPC .......... G09G 5/14; G09G 3/2092; G09G 3/22; G09G 3/3688; G09G 2320/02; G09G 3/20;
(Continued)

(56) References Cited

U.S. PATENT DOCUMENTS 7,457,458 B1* 11/2008 Daniel ..................... H04N 5/21
348/E17.005
7,674,650 B2 3/2010 Akimoto et al.
(Continued)

FOREIGN PATENT DOCUMENTS

CN 106251814 A 12/2016
EP 1104180 A 5/2001
(Continued)

OTHER PUBLICATIONS

Kawashima.S et al., "13.3-in. 8K x 4K 664-ppi OLED Display Using CAAC-OS FETs", SID Digest '14 : SID International Symposium Digest of Technical Papers, Jun. 3, 2014, pp. 627-630.
(Continued)

*Primary Examiner* — Jose R Soto Lopez
(74) *Attorney, Agent, or Firm* — Fish & Richardson P.C.

(57) ABSTRACT

A novel semiconductor device or display system is provided. The display system includes a correction circuit having a function of correcting an image signal by utilizing artificial intelligence. Specifically, learning by an artificial neural network enables the correction circuit to correct an image signal so as to alleviate the image discontinuity. Then, by making an inference (recognition) utilizing the artificial neural network which has finished the learning, the image signal is corrected and compensation for the image discontinuity can be made. In this manner, the junction can be inconspicuous on the displayed image, improving the quality of a high-resolution image.

10 Claims, 34 Drawing Sheets

US 10,885,877 B2

Page 2

(51) Int. Cl.
*G06N 3/063* (2006.01)
*G09G 3/20* (2006.01)
G09G 3/22 (2006.01)
G09G 3/36 (2006.01)

(52) U.S. Cl.
CPC .............. *G09G 3/22* (2013.01); *G09G 3/3688* (2013.01); *G09G 2320/02* (2013.01)

(58) Field of Classification Search
CPC ........ G09G 3/3233; G09G 3/36; G06N 3/063; G06N 3/08; G06N 3/0454; G06N 3/02; H01L 27/1214; H01L 27/1225
See application file for complete search history.

(56) References Cited

U.S. PATENT DOCUMENTS

| | | | |
|---|---|---|---|
| 9,614,022 B2 | 4/2017 | Miyake et al. | |
| 9,716,852 B2 | 7/2017 | Kurokawa | |
| 9,773,832 B2 | 9/2017 | Kurokawa | |
| 9,854,629 B2 | 12/2017 | Ikeda et al. | |
| 9,858,028 B2 | 1/2018 | Ikeda et al. | |
| 10,133,531 B2 | 11/2018 | Yoshitani et al. | |
| 10,141,069 B2 | 11/2018 | Ikeda et al. | |
| 10,159,135 B2 | 12/2018 | Ikeda et al. | |
| 2001/0040588 A1* | 11/2001 | Shiraiwa | H04N 1/6088 345/690 |
| 2005/0280823 A1* | 12/2005 | Lewis | G01D 7/12 356/407 |
| 2006/0262147 A1* | 11/2006 | Kimpe | G09G 3/20 345/690 |
| 2009/0027415 A1* | 1/2009 | Dispoto | G09G 5/02 345/604 |
| 2011/0115836 A1* | 5/2011 | Wan | G09G 5/02 345/691 |
| 2013/0342557 A1* | 12/2013 | Finlayson | H04N 1/60 345/589 |
| 2014/0085279 A1* | 3/2014 | Shiomi | G09G 3/3666 345/204 |
| 2014/0210851 A1* | 7/2014 | Hama | G09G 5/06 345/601 |
| 2016/0358574 A1* | 12/2016 | Hohjoh | G09G 3/3614 |
| 2016/0371316 A1* | 12/2016 | Okanohara | G06N 3/0454 |
| 2017/0063351 A1 | 3/2017 | Kurokawa | |
| 2017/0116512 A1 | 4/2017 | Kurokawa | |
| 2017/0118479 A1 | 4/2017 | Kurokawa | |
| 2017/0131608 A1* | 5/2017 | Jin | G02F 1/1368 |
| 2017/0329566 A1* | 11/2017 | Yuan | H04N 1/6058 |
| 2018/0152189 A1* | 5/2018 | Papadopoulos | H01L 27/1225 |
| 2018/0308871 A1* | 10/2018 | Wu | G09G 3/3233 |

FOREIGN PATENT DOCUMENTS

| | | |
|---|---|---|
| JP | 2001-197332 A | 7/2001 |
| JP | 2007-096055 A | 4/2007 |
| JP | 2007-123861 A | 5/2007 |
| JP | 2017-003712 A | 1/2017 |
| JP | 2018-106608 A | 7/2018 |
| JP | 2018-110386 A | 7/2018 |

OTHER PUBLICATIONS

International Search Repor (Application No. PCT/IB2018/050138) dated Apr. 24, 2018.

Written Opinion (Application No. PCT/IB2018/050138) dated Apr. 24, 2018.

* cited by examiner

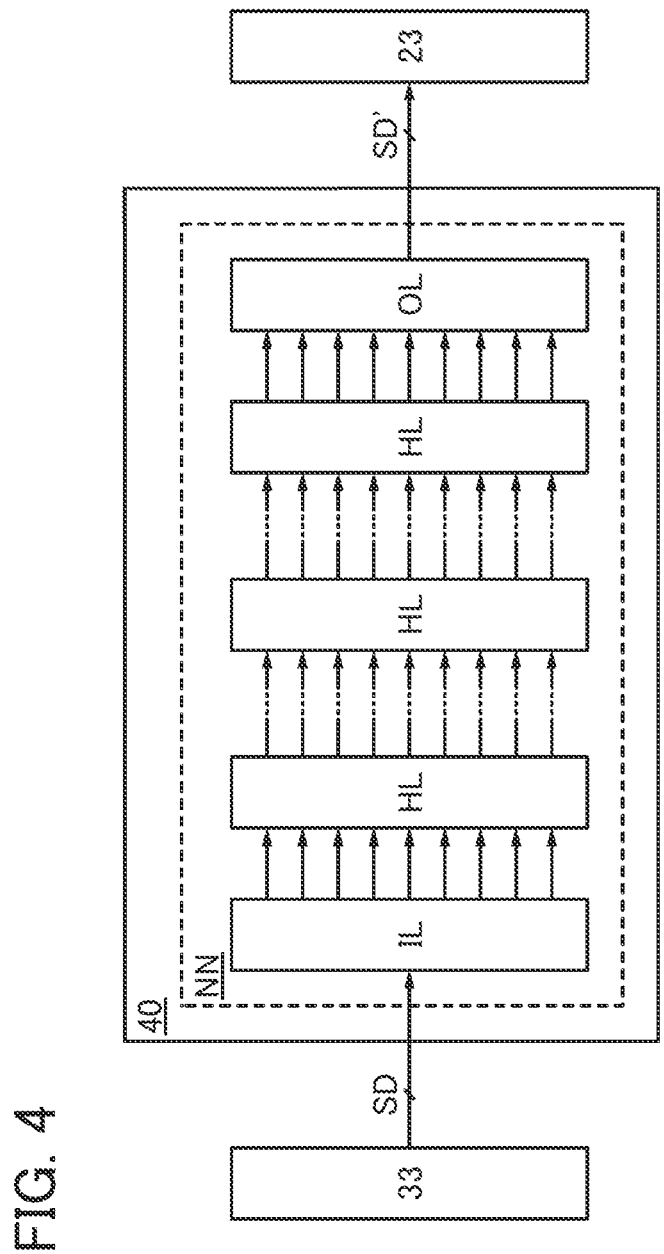

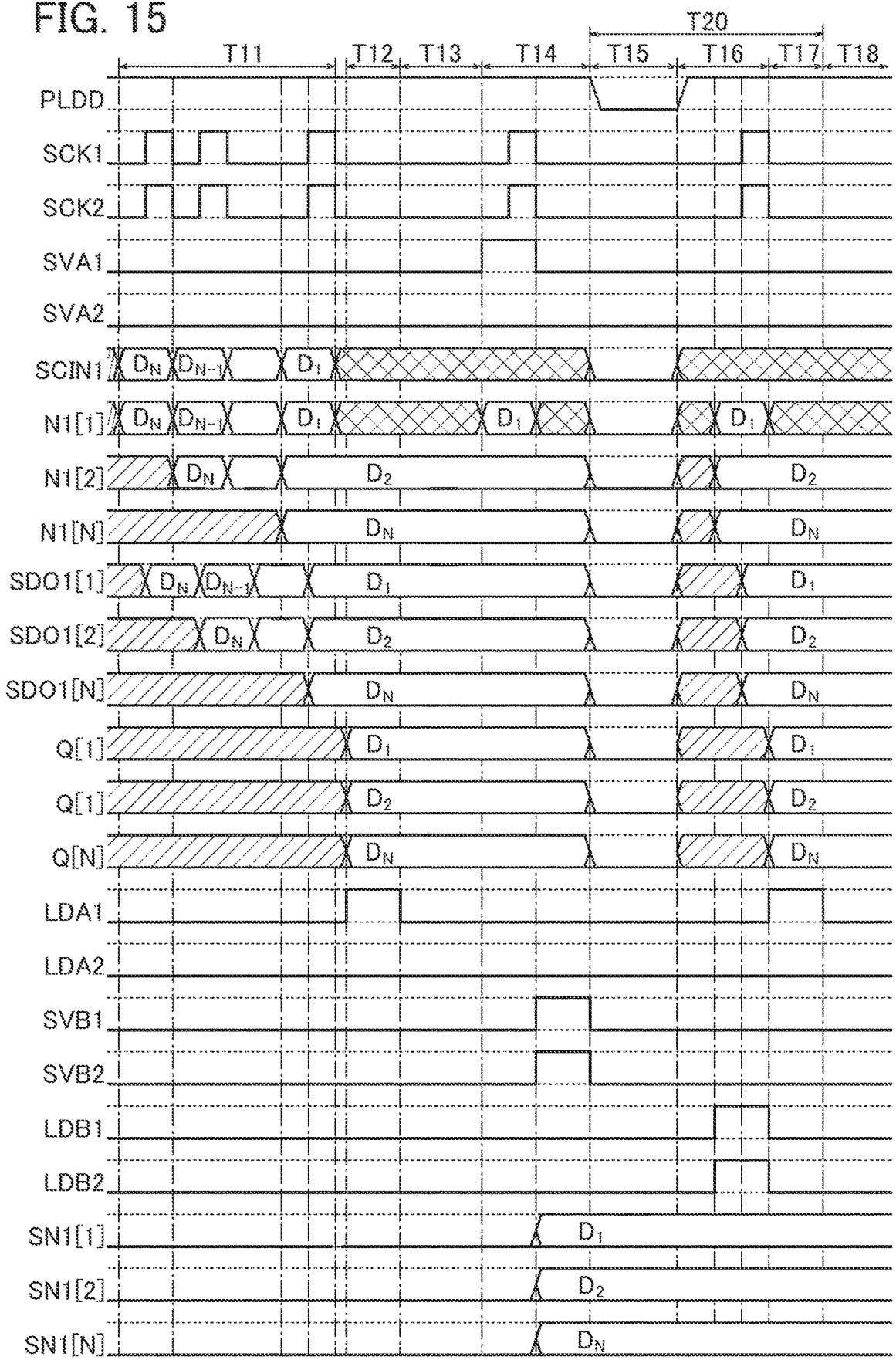

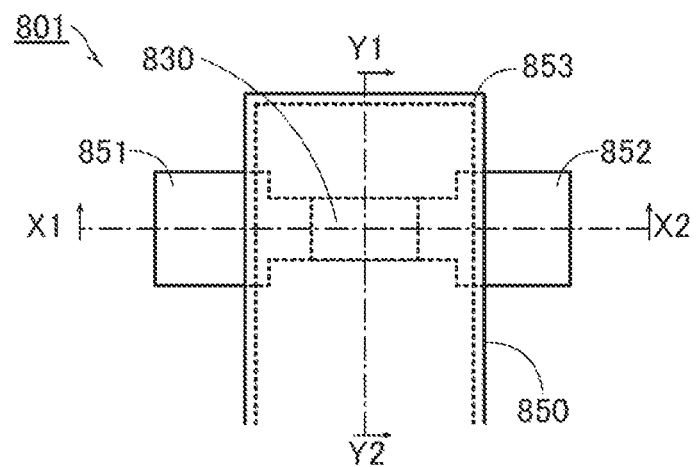
FIG. 31A
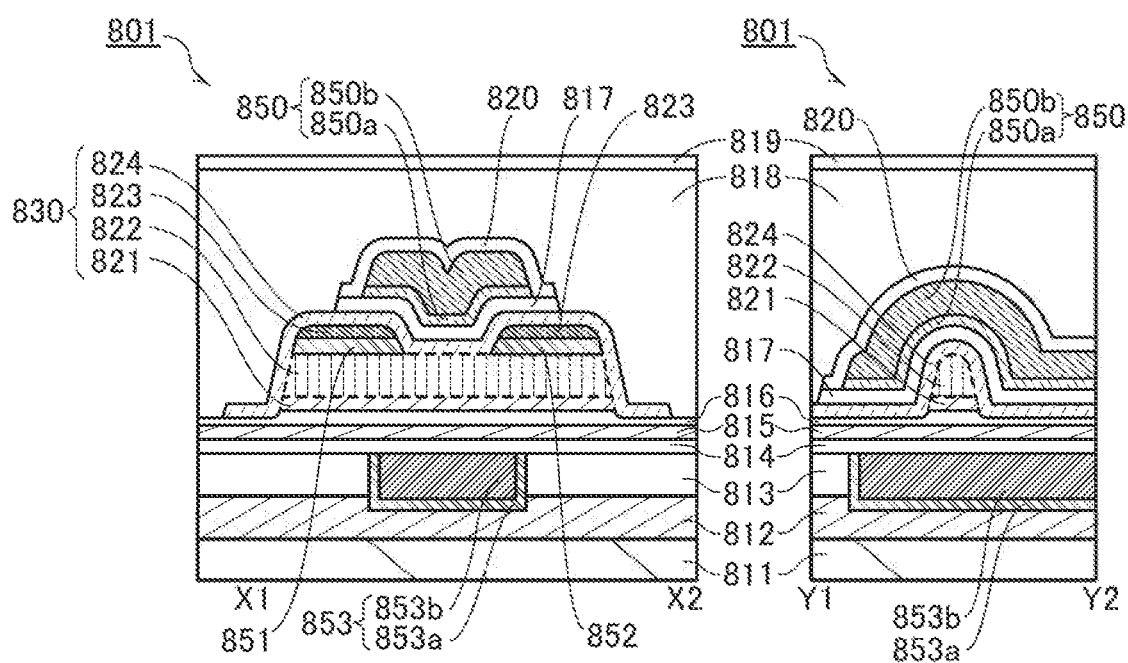
FIG. 31B
FIG. 31C

DISPLAY SYSTEM AND ELECTRONIC DEVICE

TECHNICAL FIELD

One embodiment of the present invention relates to a semiconductor display system, and an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

In this specification and the like, a semiconductor device means all devices that can operate by utilizing semiconductor characteristics. A transistor, a semiconductor circuit, an arithmetic device, a memory device, and the like are each an embodiment of the semiconductor device. In addition, a display device, an imaging device, an electro-optical device, a power generation device (e.g., a thin film solar cell and an organic thin film solar cell), and an electronic device may each include a semiconductor device.

BACKGROUND ART

As the screen of a television (TV) becomes larger, the resolution of images displayed on the screen is desired to be higher. Thus, ultra-high resolution TV broadcasting has been promoted. 8K test digital TV broadcasting started in 2016, and the formal launch of the broadcasting is planned. Therefore, various electronic devices which are compatible with 8K broadcasting have been developed (e.g., Non-Patent Document 1).

Flat panel displays typified by liquid crystal display devices and light-emitting display devices are widely used for displaying images. For example, silicon is chiefly used as a semiconductor material of transistors included in these display devices. Recently, a technique for using a transistor that includes a metal oxide in a pixel of a display device has also been developed (e.g., Patent Documents 1 and 2).

REFERENCE

Patent Document

[Patent Document 1] Japanese Published Patent Application No. 2007-90155
[Patent Document 2] Japanese Published Patent Application. No. 2007-123861

Non-Patent Document

[Non-Patent Document 1] S. Kawashima, et al., "13.3-In, 8K×4K 664-ppi OLED Display Using CAAC-OS FETs," SID 2014 DIGEST, pp. 627-630.

DISCLOSURE OF INVENTION

An object of one embodiment of the present invention is to provide a novel semiconductor device or display system. Another object of one embodiment of the present invention is to provide a semiconductor device or display system capable of displaying a high-quality image. Another object of one embodiment of the present invention is to provide a semiconductor device or display system capable of displaying a high-resolution image. Another object of one embodiment of the present invention is to provide a semiconductor device or display system capable of high-speed operation. Another object of one embodiment of the present invention is to provide a semiconductor device or display system with low power consumption.

Note that one embodiment of the present invention does not necessarily achieve all the objects listed above and only needs to achieve at least one of the objects. The description of the above-described objects does not preclude the existence of other objects. Other objects will be apparent from and can be derived from the description of the specification, the drawings, the claims, and the like.

A display system according to one embodiment of the present invention includes signal generation portion and a display portion. In the display system, the signal generation portion is configured to generate an image signal. The display portion is configured to display an image on the basis of the image signal. The display portion includes a pixel portion, a first driver circuit, and a second driver circuit. The display portion or the signal generation portion includes a correction circuit. The pixel portion includes a first region and a second region. The image signal is supplied from the first driver circuit to the first region. The image signal is supplied from the second driver circuit to the second region. The correction circuit includes a neural network. The neural network is configured to correct the image signal so as to compensate for image discontinuity at a boundary between the first region and the second region.

The display system according, to one embodiment of the present invention may further include an arithmetic processing device. In the display system, the arithmetic processing device may be configured to perform neural network learning, and a weight coefficient obtained by the learning may be supplied to the correction circuit.

In the display system according to one embodiment of the present invention, the learning may be performed by updating the weight coefficient so that a difference between the image signal and a signal corresponding to the image displayed on the display portion is equal to or lower than a certain value.

In the display system according to one embodiment of the present invention, the neural network may form an autoencoder. The autoencoder may include a decoder and an encoder. The encoder may be positioned in the signal generation portion, and the decoder may be positioned in the display portion.

In the display system according to one embodiment of the present invention, the pixel portion may include a plurality of pixek. Each of the pixels may include a transistor including hydrogenated amorphous silicon in a channel formation region.

In the display system according to one embodiment of the present invention, the pixel portion may include a plurality of pixels. Each of the pixels may include a transistor including a metal oxide in a channel formation region.

An electronic device according to one embodiment of the present invention includes any of the above-described display systems.

With one embodiment of the present invention, a novel semiconductor device or display system can be provided. With one embodiment of the present invention, a semiconductor device or display system capable of displaying a high-quality image can be provided. With one embodiment of the present invention, a semiconductor device or display system capable of displaying a high-resolution image can be provided. With one embodiment of the present invention, a semiconductor device or display system capable of high-speed operation can be provided. With one embodiment of the present invention, a semiconductor device or display system with low power consumption can be provided.

Note that the description of these effects does not preclude the existence of other effects. One embodiment of the present invention does not necessarily have all of these effects. Other effects will be apparent from and can be derived from the description of the specification, the drawings, the claims, and the like.

BRIEF DESCRIPTION OF DRAWINGS

In the accompanying drawings:

FIG. 4 illustrates a structure example of a correction circuit;

FIG. 15 is a timing chart;

FIGS. 31A to 31C illustrate a structure example of a transistor;

BEST MODE FOR CARRYING OUT THE INVENTION

Figure 1A:
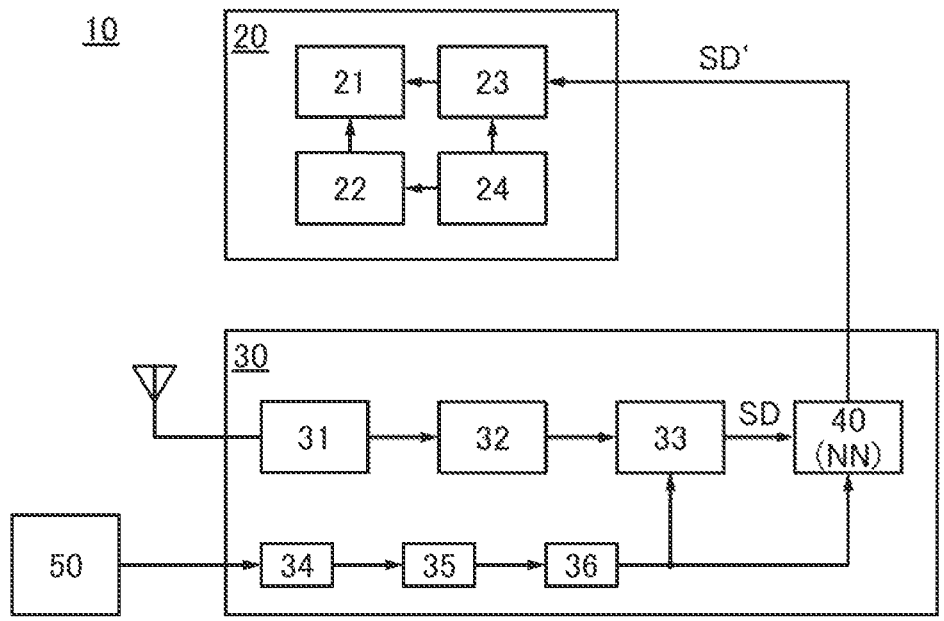
FIGS. 1A and 1B illustrate structure examples of a display system.

Embodiments of the present invention will be described below in detail with reference to the accompanying drawings. Note that the present invention is not limited to the following description of the embodiments and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as a semiconductor device, a memory device, a display device, an imaging device, and a radio frequency (RF) tag. Furthermore, the display device includes, in its category, a liquid crystal display device, a light-emitting device having pixels each provided with a light-emitting element typified by an organic light-emitting element, electronic paper, a digital micromirror device (DMD), a plasma display panel (PDP), a field emission display (FED), and the like.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a channel region of a transistor is called an oxide semiconductor in some cases. That is to say, a metal oxide that has at least one of an amplifying function, a rectifying function, and a switching function can be called a metal oxide semiconductor, or OS for short. In the following description, a transistor including a metal oxide in a channel region is also referred to as an OS transistor.

In this specification and the like, a metal oxide including nitrogen is also called a metal oxide in some cases. Moreover, a metal oxide including nitrogen may be, called a metal oxynitride. The details of a metal oxide are described later.

Furthermore, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected one or more circuits that enable a functional connection between X and (e.g., logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that components denoted by the same reference numerals in different drawings represent the same components, unless otherwise specified.

Even when independent components are electrically connected to each other in a drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device and a display system of one embodiment of the present invention are described.

Structure Example of Display System

FIG. 1A illustrates a structure example of a display system 10. The display system 10 has a function of generating a signal for displaying an image on the basis of data received from the outside and displaying an image on the basis of the signal. The display system 10 includes a display portion 20 and a signal generation portion 30.

The display portion 20 and the signal generation portion 30 can each be formed using a semiconductor device. Thus, the display portion 20 and the signal generation portion 30 can also be referred to as semiconductor devices.

The display portion 20 has a function of displaying an image on the basis of an image signal input from the signal generation portion 30. The display portion 20 includes a pixel portion 21, a driver circuit 22, a driver circuit 23, and a timing controller 24.

The pixel portion 21 includes a plurality of pixels and has a function of displaying an image. Each of the pixels includes a display element and has a function of displaying a predetermined gray level. The gray level of pixels is controlled with the signals output from the driver circuit 22 and the driver circuit 23, so that the pixel portion 21 displays a predetermined image.

The driver circuit 22 has a function of supplying a signal for selecting the pixels (hereinafter, this signal is also referred to as a selection signal) to the pixel portion 21. The driver circuit 23 has a function of supplying a signal for displaying a predetermined gray level on a pixel (hereinafter, this signal is also referred to as an image signal) to the pixel portion 21. When image signals are supplied to the pixels to which selection signals have been supplied, the pixel portion 21 displays a predetermined image. The driver circuit 22 can be referred to as a gate driver circuit or a gate driver, and the driver circuit 23 can be referred to as a source driver circuit or a source driver.

The timing controller 24 has a function of generating a timing signal used in the driver circuit 22, the driver circuit 23, or the like. The timing of outputting a selection signal from the driver circuit 22 or the timing of outputting an image signal from the driver circuit 23 are controlled by the timing signal generated by the timing controller 24. In the case where the driver circuit 22 or the driver circuit 23 is formed of a plurality of driver circuits, the timings for outputting signals from the plurality of driver circuits are synchronized by the timing signal generated by the timing controller 24.

The signal generation portion 30 has a function of generating an image signal on the basis of the data input from the outside. The signal generation portion 30 includes a front end portion 31, a decoder 32, an image processing circuit 33, a receiving portion 34, an interface 35, a control circuit 36, and a correction circuit 40.

The front end portion 31 has a function of performing signal processing in response to a signal input from the outside. Image data such as a broadcast signal is, input to the front end portion 31. The front end portion 31 can have a function of demodulating a received signal and a digital-analog conversion function. Furthermore, the front end portion 31 may also have a function of correcting an error.

The decoder 32 has a function of decoding a coded signal. In the case where a signal input to the front end portion 31 has been compressed, the signal is decompressed by the decoder 32. For example, the decoder 32 has a function of performing entropy decoding, inverse quantization, inverse orthogonal transform such as inverse discrete cosine transform (IDCT) or inverse discrete sine transform (IDST), intra-frame prediction, inter-frame prediction, and the like.

As to coding standard in 8K broadcast, a standard of H.265/MPEG-H high efficiency video coding (hereinafter referred to as HEVC) is employed. In the case where the signal input to the front end portion 31 is encoded with HEVC, context adaptive binary arithmetic coding (CABAC) decoding is performed by the decoder 32.

The image processing circuit 33 has a function of image-processing the signal input from the decoder 32. Specifically, the image processing circuit 33 can have a function of performing gamma correction, dimming, toning, or the like.

An image signal is generated by image processing by the image processing circuit 33 and is output to the correction circuit 40 as a signal SD.

The receiving portion 34 has a function of receiving a control signal input from the outside. The input of the control signal to the receiving portion 34 can be performed with a remote controller, a portable information terminal (e.g., a smartphone, a tablet), an operation button provided on the display portion 20, or the like.

The interface 35 has a function of processing the control signal received by the receiving portion 34 as appropriate and outputting the signal to the control circuit 36.

The control circuit 36 has a function of supplying the control signal to the circuits included in the signal generation portion 30. For example, the control circuit 36 has a function of supplying the control signal to the image processing circuit 33 and the correction circuit 40. The control by the control circuit 36 can be performed on the basis of the control signal received by the receiving portion 34.

The correction circuit 40 has a function of correcting the signal input from the image processing circuit 33. Specifically, in the case where the pixel portion 21 is divided into a plurality of regions, the correction circuit 40 has a function of correcting the signal SD so as to compensate for the image discontinuity at the boundary between the regions. The image signal corrected by the correction circuit 40 is output to the driver circuit 23 as a signal SD'. The division of the pixel portion 21 and compensation at the junction by the correction circuit 40 will be described below.

Figure 1B:
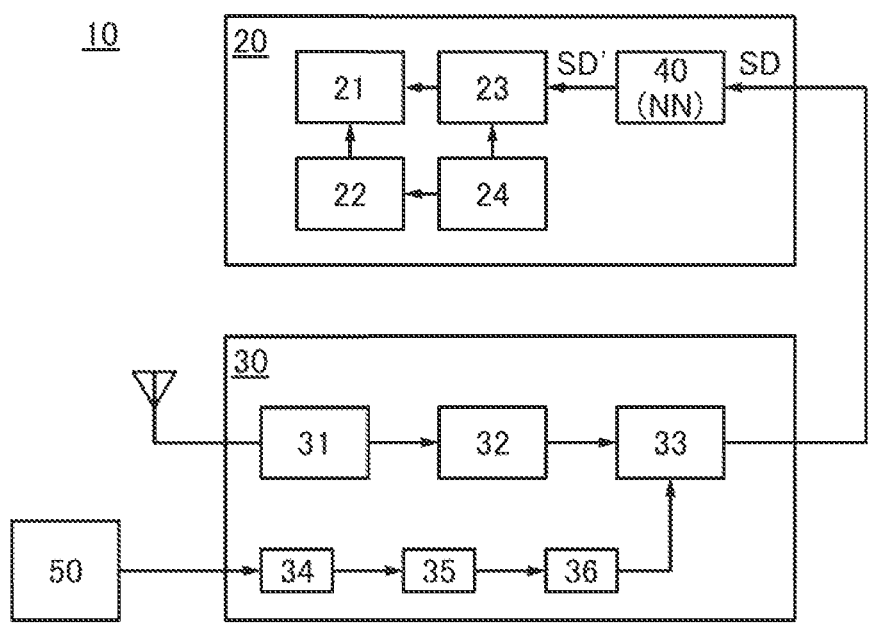
Figure 2:
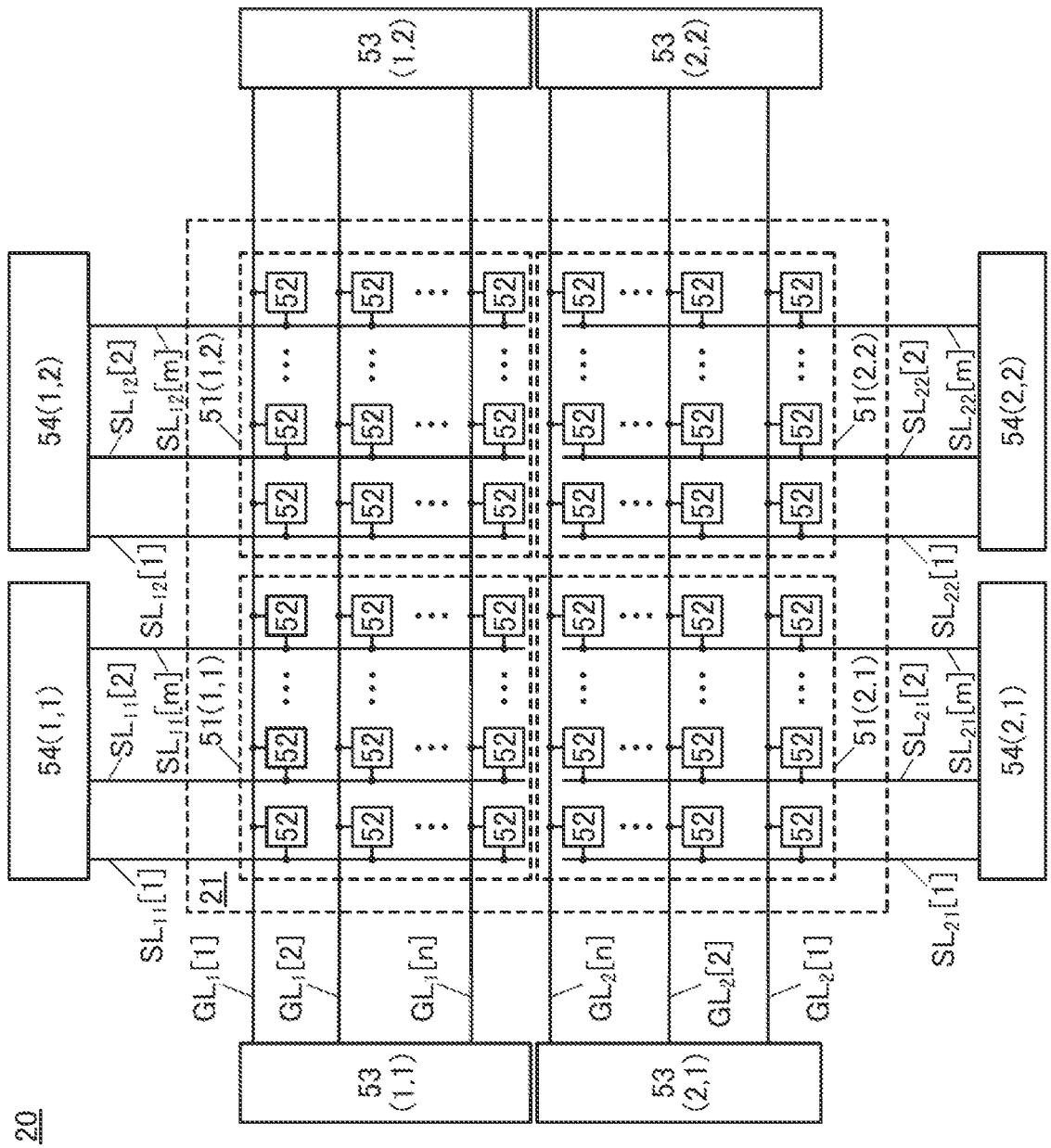
FIG. 2 illustrates a structure example of a display portion.

FIG. 2 illustrates a structure example of the display portion 20 in which the pixel portion 21 is divided. The display portion 20 includes the pixel portion 21 including a plurality of pixels 52, a plurality of driver circuits 53, and a plurality of driver circuits 54. Note that the plurality of driver circuits 53 form the driver circuit 22 in FIGS. 1A and 1B, and the plurality of driver circuits 54 form the driver circuit 23 in FIGS. 1A and 1B.

The pixels 52 each include a display element. Examples of the display element in the pixels 52 include a liquid crystal element and a light-emitting element. As the liquid crystal element, a transmissive liquid crystal element, a reflective liquid crystal element, a transflective liquid crystal element, or the like can be used. Alternatively, for example, a micro electro mechanical systems (MEMS) shutter element, an optical interference type MEMS element, or a display element using, a microcapsule method, an electrophoretic method, an electrowetting method, an Electronic Liquid Powder (registered trademark) method, or the like can be used as the display element. Examples of the light-emitting element include a self-luminous light-emitting element such as an organic light-emitting diode (OLED), a light-emitting diode (LED), a quantum-dot light-emitting diode (QLED), and a semiconductor laser. Specific structure examples of the pixels 52 will be described later.

The number of pixels 52 can be set freely. In order to display a high-resolution image, it is preferable to arrange many pixels. For example, the number of provided pixels is preferably more than or equal to 1920×1080 in the case where a 2K image is displayed. Furthermore, the number of provided pixels is preferably more than or equal to 2840×2160 or more than or equal to 4096×2160 in the case where a 4K image is displayed. Moreover, the number of provided pixels is preferably more than or equal to 7680×4320 in the case where an 8K image is displayed. Furthermore, the pixel portion 21 can also be formed so as to display an image that has resolution higher than 8K.

Each of the pixels 52 is connected to a wiring SL and a wiring GL. Furthermore, the wirings GL are connected to the driver circuit 22, and the wirings SL are connected to the driver circuit 23. Selection signals are supplied to the wirings GL, and image signals are supplied to the wirings SL.

The driver circuits 53 have a function of supplying selection signals to the pixels 52. Specifically the driver circuits 53 have a function of supplying selection signals to the wirings GL, and the wirings GL each have a function of transmitting the selection signals output from the driver circuits 53 to the pixels 52. Note that the driver circuits 53 can be referred to as a gate driver circuit or a gate driver. In addition, the wirings GL can also be referred to as selection signal lines, gate lines, or the like.

The driver circuits 54 have a function of supplying the image signals to the pixels 52. Specifically, the driver circuits 54 have a function of supplying the image signals to the wirings SL, and the wirings SL each have a function of transmitting the image signals output from the driver circuits 54 to the pixels 52. Note that the driver circuits 54 can be referred to as a source driver circuit or a source driver. In addition, the wirings SL can also be referred to as image signal lines, source lines, or the like.

In the case where many pixels 52 are provided in the pixel portion 21 display a high-resolution image such as a 2K, 4K, or 8K image, the length of the wirings GL and the wirings SL is increased, which causes an increase in parasitic resistance due to the wirings GL and the wirings SL. As illustrated in FIG. 2, the wirings GL and the wirings SL are provided so as to intersect with each other. When the number of pixels 52 is increased the number of intersections is also increased, causing an increase in parasitic capacitance formed by the wirings GL and the wirings SL. For this reason, in FIG. 2, the pixel portion 21 is divided into a plurality of regions 51, and each one of the regions 51 is provided with the driver circuit 53 and the driver circuit 54.

Specifically, in FIG. 2, the pixel portion 21 is divided into four regions 51 (51(1, 1) to 51(2, 2)), and the four regions 51 each include in columns and n rows of pixels 52 (m and n are natural numbers). In addition, four driver circuits 53 (53(1, 1) to 53(2, 2)) and four driver circuits 54 (54(1, 1) to 54(2, 2)) are provided.

Note that in FIG. 2, the wirings 1 connected to the driver circuits 53(1, 1) and 53(1, 2) are denoted by the wirings $GL_1$, and the wirings GL connected to the driver circuits 53(2, 1) and 53(2, 2) are denoted by the wirings $GL_2$. Furthermore, the wirings SL connected to the driver circuits 54(1, 1), 54(1, 2), 54(2, 1), and 54(2, 2) are denoted by the wirings $SL_{11}$, the wirings $SL_{12}$, the wirings $SL_{21}$, and the wirings $SL_{22}$, respectively. Furthermore, the wirings SL and the wirings GL connected to the pixels 52 in the i-th column and the j-th row (i is an integer more than or equal to 1 and less than or equal to m. j is an integer more than or equal to 1 and less than or equal to n.) are denoted by the wirings SL[i] and the wirings GL[j] respectively.

Image signals are supplied from the driver circuits 54(1, 1) to 54(2, 2) to the regions 51(1, 1), to 51(2, 2). Thus, image signals can be supplied from the upper driver circuits 54 (54(1, 1) and 54(1, 2)) to the pixels 52 belonging to the upper regions 51 (51(1, 1) and 51(1, 2)) in the pixel portion 21, and image signals can be supplied from the lower driver circuits 54 (54(2, 1) and 54(2, 2)) to the pixels 52 belonging to the lower regions 51 (51(2, 1) and 51(2, 2)) in the pixel portion 21. In this way, the wirings SL connected to one driver circuit 54 can be shortened, which can reduce parasitic resistance and parasitic capacitance and thereby enables a quick supply of image signals. Thus, a high-resolution image can be precisely displayed.

FIG. 2 illustrates a structure example in which the upper region in the pixel portion 21 is divided into two regions 51 (the regions 51(1, 1) and 51(1, 2)), and the lower region in the pixel portion 21 is divided into two regions 51 (the regions 51(2, 1) and 51(2, 2)). In this case, the timings for outputting image signals from the driver circuits 54(1, 1) and 54(1, 2) are synchronized, and the timings for outputting image signals from the driver circuits 54(2, 1)) and 54(2, 2) are synchronized. Note that the driver circuits which supply image signals to the regions 51(1, 1) and 51(1, 2) may be formed by a circuit in which the driver circuits 54(1, 1) and 54(1, 2) are integrated. Furthermore, the driver circuits which, supply image signals to the regions 51(2, 1) and 51(2, 2) may be formed by a circuit in which the driver circuits 54(2, 1) and 54(2, 2) are integrated. Furthermore, the driver circuits 54(1, 1), 54(1, 2), 54(2, 1), and 54(2, 2) may each be formed of a plurality of driver circuits.

Furthermore, in FIG. 2, two driver circuits 53 are connected to one wiring GL. Specifically, the pixels 52 included in the regions 51(1, 1) and 51(1, 2) are connected to the driver circuits 53(1, 1) and 53(1, 2) through the wirings GL. In addition, the pixels 52 included in the regions 51(2, 1) and 51(2, 2) are connected to the driver circuits 53(2, 1) and 53(2, 2) through the wirings GL. In this case, the timings for outputting selection signals from the driver circuits 53(1, 1) and 53(1, 2) are synchronized, and the timings for outputting selection signals from the driver circuits 53(2, 1) and 53(2, 2) are synchronized. In this way, selection signals can be supplied from both ends of the wirings GL, enabling a quick supply of the selection signals. Note that in the case where the transmission of selection signals is not hindered, one of the driver circuits 53(1, 1) and 53(1, 2) and one of the driver circuits 53(2, 1) and 53(2, 2) can be eliminated.

Although an example in which the pixel portion 21 is divided into four regions 51 is illustrated in FIG. 2, the division number is not particularly limited and can be set freely. Moreover, although an example in which the four regions 51 include the same number of columns and rows of pixels 52 is illustrated in FIG. 2, the number of columns and rows of pixels 52 is not limited to this example and can be independently set in each region 51.

Figure 3:
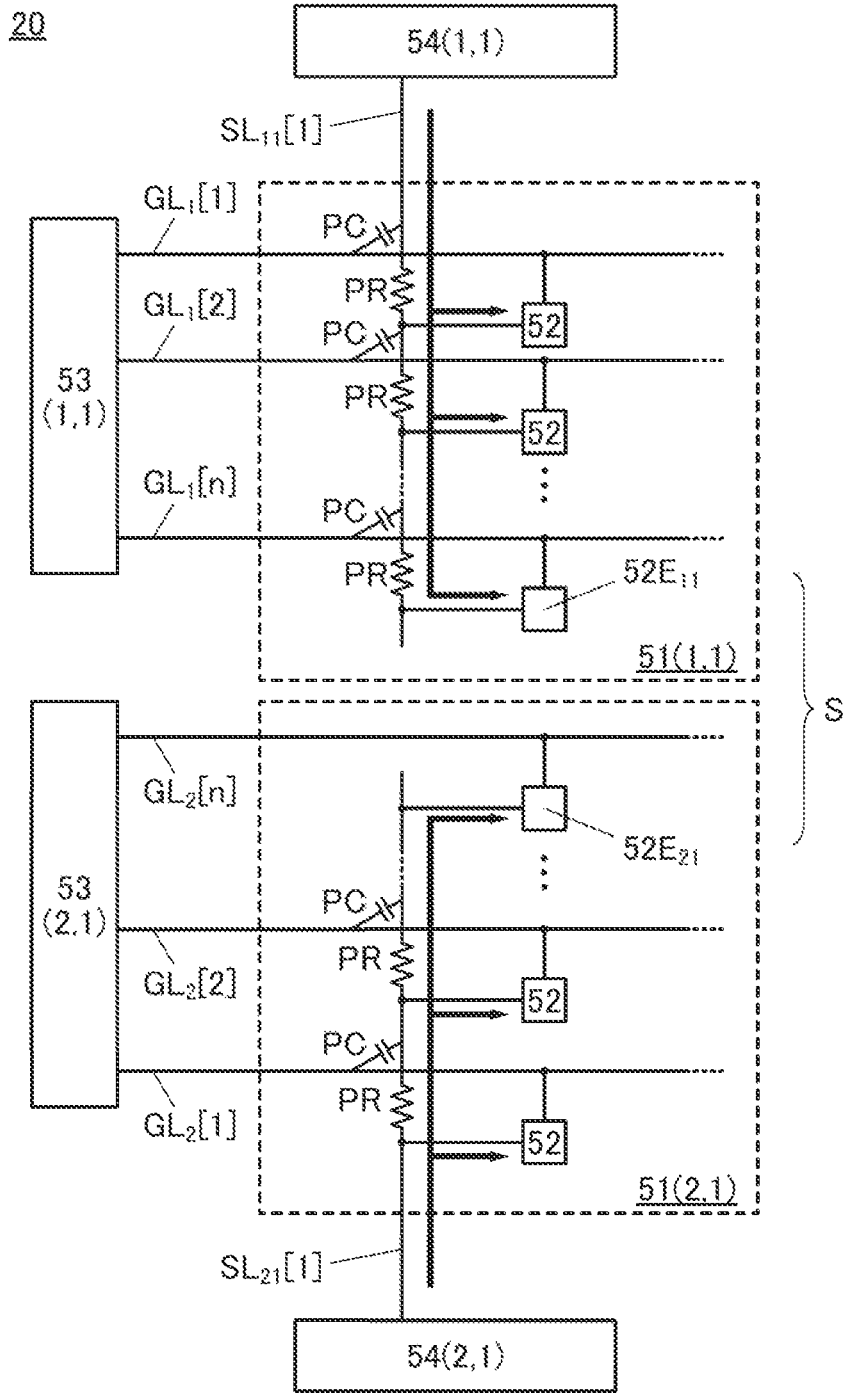
FIG. 3 illustrates an operation example of a display portion.

In the case where the pixel portion 21 is divided into the plurality of regions 51 as described above, the image continuity at junctions of the regions 51 is preferably ensured. However, an error of the gray level displayed by the pixels 52 tends to occur particularly in the vicinity of the junctions owing to the influence of the parasitic resistance or parasitic capacitance of the wirings SL or the like. As an example, a case in which image signals are supplied to the wirings $SL_{11}[1]$ and $SL_{21}[1]$ as illustrated in FIG. 3 is considered. Here, parasitic capacitance PC, parasitic resistance PR, or the like formed at the intersections of the wirings SL and the wirings GL or the like is added to the wirings SL. More specifically, as the distance between the pixel 52 and the driver circuit 54 is longer and the path of an image signal in the wiring SL is longer, the parasitic resistance PR increases. Moreover, as the number of intersections of the wirings GL and the wirings SL is larger, the parasitic capacitance PC increases. The increase in the parasitic resistance PR or the parasitic capacitance PC delays the image signal, and an error might be caused in the image signal supplied to the pixels 52.

The error of the image signal reaches its maximum when the image signal is supplied to the pixel 52 which is positioned farthest from the driver circuit 54 (the pixels $52E_{11}$ and $52E_{21}$ in the drawing). Thus, image discontinuity tends to occur particularly in the region where such pixels 52 are adjacent (a region S in the drawing).

To ensure the image continuity, the pulse width of selection signals can be determined in consideration of the pixels $52E_{11}$ and $52E_{21}$ provided in the vicinity of the ends of the wirings SL. However, in this case, the selection period for all the pixels 52 has to be long, increasing the time required to select all the rows. This lengthens the time required to update the image and accordingly lowers the operating speed.

Here, the display system 10 according to one embodiment of the present invention includes the correction circuit 40 having a function of correcting an image signal by utilizing artificial intelligence (AI). Specifically, learning by an artificial neural network (ANN) enables the correction circuit 40 to correct an image signal so as to alleviate the image discontinuity particularly at the junctions of the regions 51. Then, by making an inference (recognition) utilizing the artificial neural network which has finished the learning, the image signal is corrected and compensation for the image discontinuity can be made. In this manner, the junction can be inconspicuous on the displayed image, improving the quality of a high-resolution image.

Note that artificial intelligence refers to a computer that imitates the intelligence of human beings. The artificial neural network is a circuit that imitates a neural network composed of neurons and synapses, and is a kind of artificial intelligence. In this specification and the like, the term "neural network" particularly refers to the artificial neural network.

The correction circuit 40 illustrated in FIG. 1A includes a neural network NN. The correction circuit 40 using the neural network will be described below in detail.

Structure Example of Correction Circuit

FIG. 4 illustrates a structure example of the correction circuit 40. The correction circuit 40 includes a neural network NN and has a function of correcting the signal SD. The neural network NN includes an input layer IL, an output layer OL, and a plurality of middle layers HL. The neural network NN can perform deep learning by utilizing the plurality of middle layers HL. The output layer OL, the input layer IL, and the middle layers HL each include a plurality of neuron circuits, and the neuron circuits provided in the different layers are connected to each other through a synapse circuit.

When the signal SD is input to the neural network NN, arithmetic processing is performed in each layer. The arithmetic processing in each layer is executed by the product-sum operation of an output of the neuron circuits in the previous layer and a weight coefficient. Note that the connection between layers may be a full connection where all of the neuron circuits are connected or a partial connection where some of the neuron circuits are connected. Specific structure examples of the neural network NN will be described later.

Figure 5A:
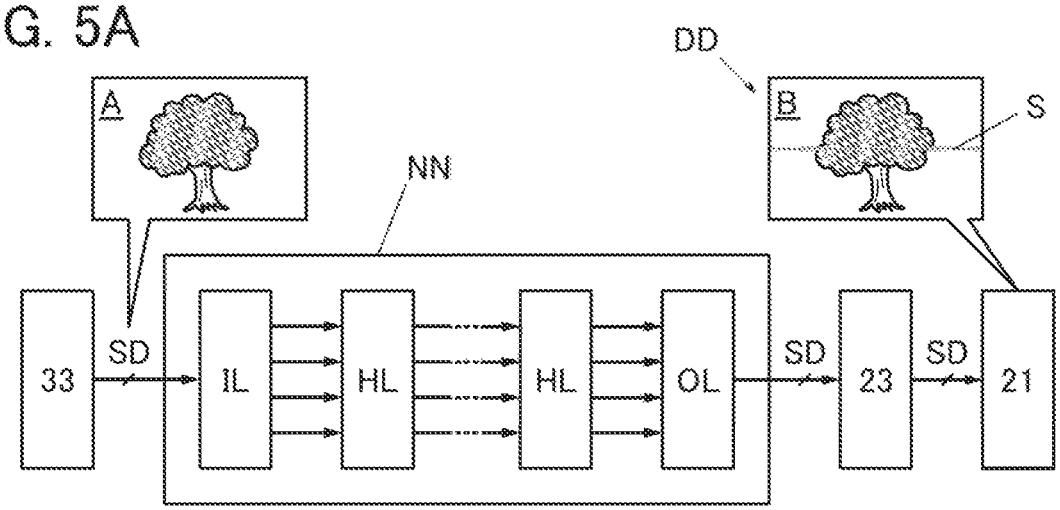
FIGS. 5A to 5C illustrate an operation example of a neural network.
Figure 5B:
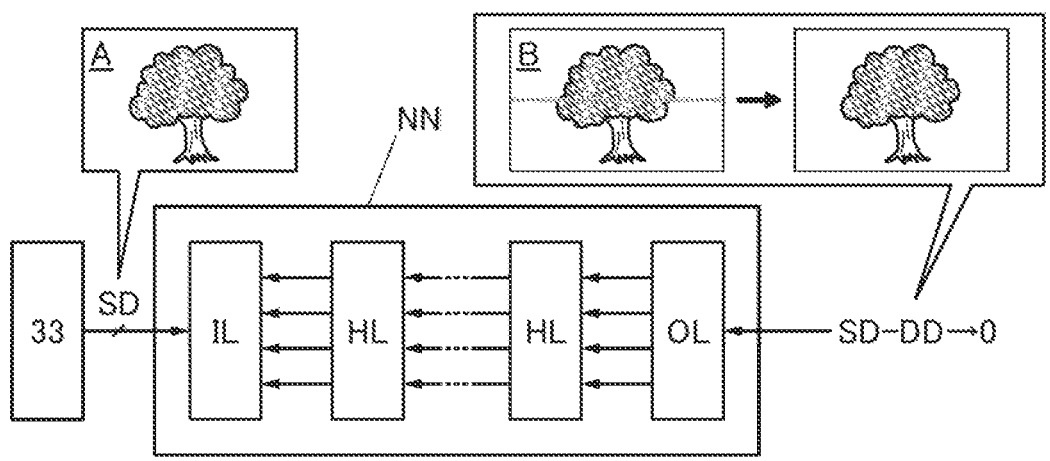
Figure 5C:
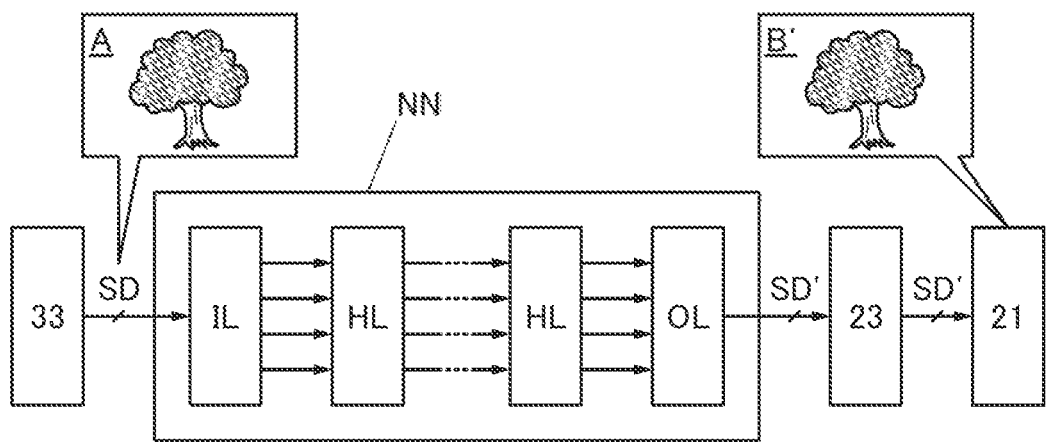

FIGS. 5A to 5C illustrate a specific learning and inference example in the neural network NN. FIG. 5A illustrates a state before learning by the neural network NN. FIG. 5B illustrates a state at the time of learning by the neural network NN. FIG. 5C illustrates a state at the time of inference by the neural network NN.

First in FIG. 5A, the signal SD is output from the image processing circuit 33. The signal SD is an image signal corresponding to an image A. Before learning by the neural network NN, the signal SD is not corrected and output to the driver circuit 23 through the neural network NN. The signal SD is supplied to the pixel portion 21, and the pixel portion 21 displays an image on the basis of the signal SD. The image displayed on the pixel portion 21 at this time is an image B.

Here, in the case where the pixel portion 21 is divided into a plurality of regions, image discontinuity might occur in the vicinity of the region S at the junction as described above (see FIG. 3). FIG. 5A illustrates a state in which the junction is recognized on the image B. In this case, a signal corresponding, to the image B which is actually displayed on the pixel portion 21 is referred to as a signal DD.

The signal DD can be obtained by taking the image displayed on the pixel portion 21 with an image sensor or the like, for example. Furthermore in the case where the gray levels of the pixels 52 can be determined, from the signals obtained from the pixels 52 (e.g., the potentials held in the pixels 52, the current flowing through the pixels 52), the signal DD can be obtained by reading out the signals.

In the case where the function is recognized on the image B, the neural network NN performs learning. To perform learning, the signal SD is used as a learning signal and a teaching signal. Specifically, as illustrated in FIG. 5B, the signal SD is supplied to the input layer IL of the neural network NN. Then, the weight coefficient of the neural network NN is updated so that a difference between the signal SD and the signal DD can be 0, that is, so that the image B that is actually displayed on the pixel portion 21 can be equal to the image which is intended to be displayed (image A). The update of the weight coefficient can be performed by backpropagation or the like.

The update of the weight coefficient repeats until the difference between the signal SD and the signal DD becomes equal to or lower than a certain value. Note that the calculation of the difference between the signal SD and the signal DD may be performed either inside or outside the output layer OL. In addition, the allowable range of the difference can be determined arbitrarily. When the difference between the signal SD and the signal DD finally becomes equal to or lower than the certain value, the neural network NN finishes learning.

The initial value of the weight coefficient of the neural network NN may be determined by random numbers. Because the initial value of the weight coefficient may influence the learning speed (e.g., the convergent speed of the weight coefficient, the prediction accuracy of the neural network NN), the initial value of the weight coefficient may be changed if the learning speed is low.

Next the signal SD is corrected by the inference of the neural network NN which has performed the above-described learning. As illustrated in FIG. 5C, when the signal SD is input to the input layer IL, the neural network NN performs an operation using the weight coefficient updated by the learning and corrects the signal SD. The operation result is output from the output layer OL as the signal SD' and supplied to the pixel portion 21 through the driver circuit 23.

Here, the signal SD' is an image signal corrected by the neural network NN which has performed the learning (FIG. 5B) so as to compensate for the junction on the image B. Therefore, the signal SD' is supplied to the pixel portion 21, so that an image B' whose junction is not recognized is displayed.

Note that the correction of the signal SD can be perforated on the pixel row basis or multiple pixel row basis. In this case, at the inference of the neural network NN, the weight coefficient is changed on the pixel row basis or multiple pixel row basis. Thus, details of the correction of the image signal can be varied in accordance with the distance from the junction.

The correction of the signal SD can also be performed on only the pixels in a certain region. For example, the correction is performed on the signals SD supplied to the pixels in a plurality of rows and/or columns which are in the vicinity of the boundary between the regions 51, and the correction is not performed on the other signals SD. In this case, the region from which the signal DD is obtained at the time of learning can be limited to the vicinity of the boundary between the regions 51.

Moreover, in the case where correction processing (e.g., gamma correction, dimming, toning) is performed by the image processing circuit 33, either the signal which has not been subjected to the correction processing or the signal which has been subjected to the correction processing can be used as learning data used for learning by the neural network NN. In the case where the signal which has not been subjected to the correction processing is used, at least part of the correction processing may be performed in the inference of the neural network NN. In this way, at least part of the correction processing can be eliminated in the image processing circuit 33, simplifying signal processing.

By correcting the image signal by using the neural network NN in the above-described manner, the junction is not recognized on the displayed image. Thus, the quality of a high-resolution image can be improved.

The above-described learning in the neural network NN can be performed using an arithmetic processing device 50 or the like provided outside the signal generation portion 30. As the arithmetic processing device 50, a calculator having high arithmetic processing properties, such as a dedicated server or a cloud, can be used. By loading a software supporting the neural network NN in the arithmetic processing device 50, learning by the neural network NN can be performed with the arithmetic processing device 50. Furthermore, the weight coefficient obtained by the learning is supplied to the correction circuit 40 through the receiving portion 34, so that the weight coefficient of the neural network NN provided in the correction circuit 40 can be updated. The leaning by the neural network NN outside the signal generation portion 30 can simplify the structure of the signal generation portion 30. Note that a register described later can be used to supply the weight coefficient to the correction circuit 40.

Furthermore, the update of the weight coefficient can also be performed by the transmission of a control signal to the receiving portion 34 with a remoter controller or the like by a user. This allows an easy upgrade of a produce by a user after the shipment of the product.

The permission for the update of the weight coefficient can be given to only the display system 10 which is utilized by a user having a specific right. Thus, service such as provision of high-quality TV broadcasting to only specific users is possible.

Although FIG. 1A illustrates a structure in which the correction circuit 40 is provided in the signal generation portion 30, the correction circuit 40 may be provided in the display portion 20 as illustrated in FIG. 1B. In this case, the signal generation portion 30 can also be used for another display portion 20; therefore, versatility of the signal generation portion 30 can be improved.

[Hierarchical Neural Network]

A hierarchical neural network can be used as a neural network NN provided in the correction circuit 40. A hierarchical neural network will be described below.

Figure 6:
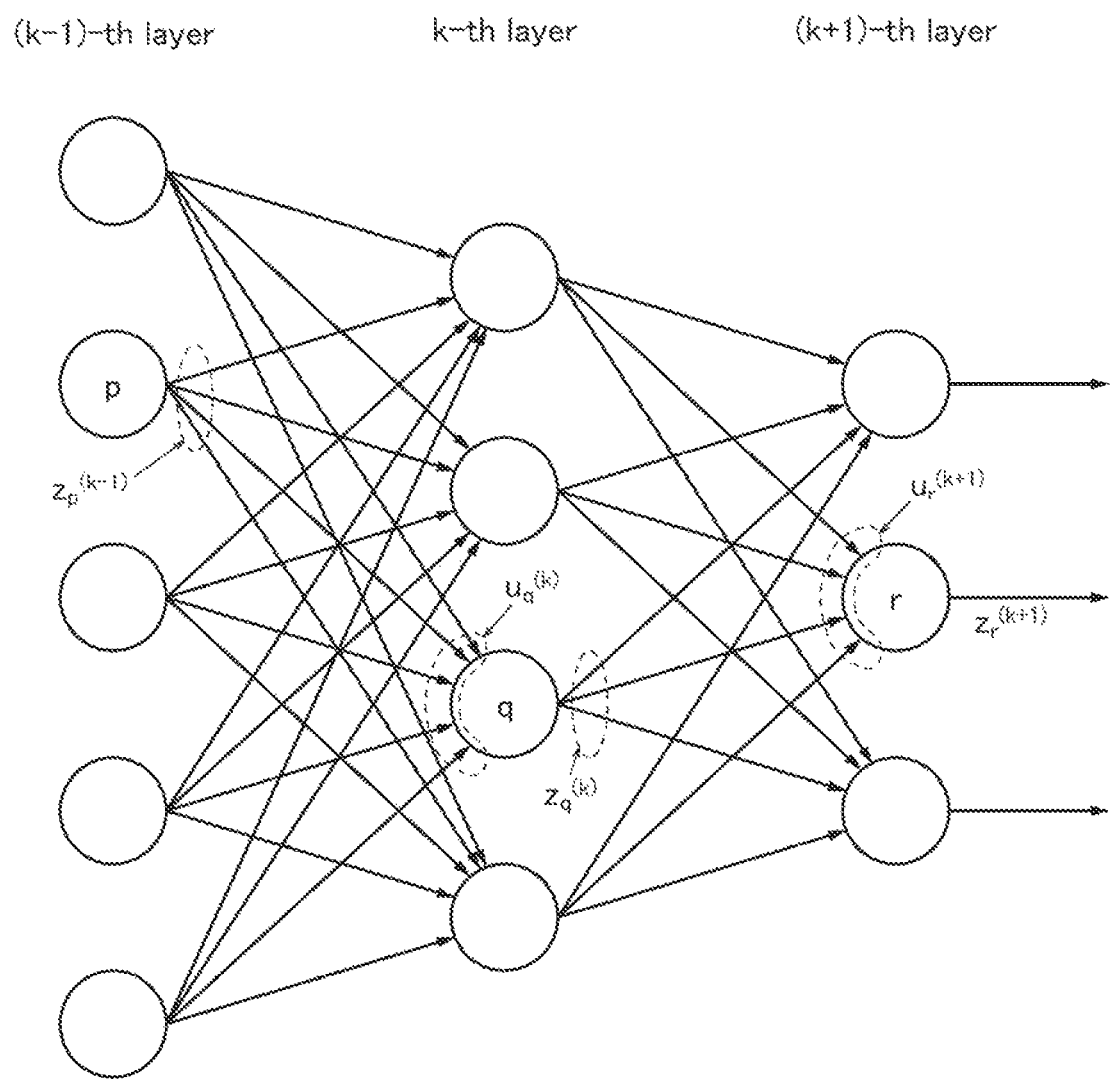
FIG. 6 illustrates a structure example of a neural network.

FIG. 6 is a diagram illustrating an example of a hierarchical neural network. A (k−1)-th layer (here, k is an integer greater than or equal to 2) includes P neurons (here, P is an integer greater than or equal to 1). A k-th layer includes Q neurons (here, Q is an integer greater than or equal to 1). A (k+1)-th layer includes R neurons (here, R is an integer greater than or equal to 1).

The product of an output signal $z_p^{(k-1)}$ of the p-th neuron (p is an integer greater than or equal to 1 and less than or equal to P) in the (k−1)-th layer and a weight coefficient $w_{qp}^{(k)}$ is input to the q-th neuron (q is an integer greater than or equal to 1 and less than or equal to Q) in the k-th layer. The product of an output signal $z_q^{(k)}$ of the q-th neuron in the k-th layer and a weight coefficient $w_{rq}^{(k+1)}$ is input to the r-th neuron (r is an integer greater than or equal to 1 and less than or equal to R) in the (k+1)-th layer. The output signal of the r-th neuron in the (k+1)-th layer is $z_r^{(k+1)}$.

In this case, the summation $u_q^{(k)}$ of signals input to the q-th neuron in the k-th layer is expressed by the following formula.

$$u_q^{(k)} = \Sigma w_{qp}^{(k)} z_p^{(k-1)} \tag{D1}$$

The output signal $z_q^{(k)}$ from the q-th neuron in the k-th layer is expressed by the following formula.

$$z_q^{(k)} = f(u_q^{(k)}) \tag{D2}$$

A function $f(u_q^{(k)})$ is activation function. A step function, a linear ramp function, a sigmoid function, or the lake can be used as the function $f(u_q^{(k)})$.

Note that the activation function may be the same among all neurons or may be different among neurons. Furthermore, the activation function may be the same in all the layers or may vary among the layers.

Figure 7:
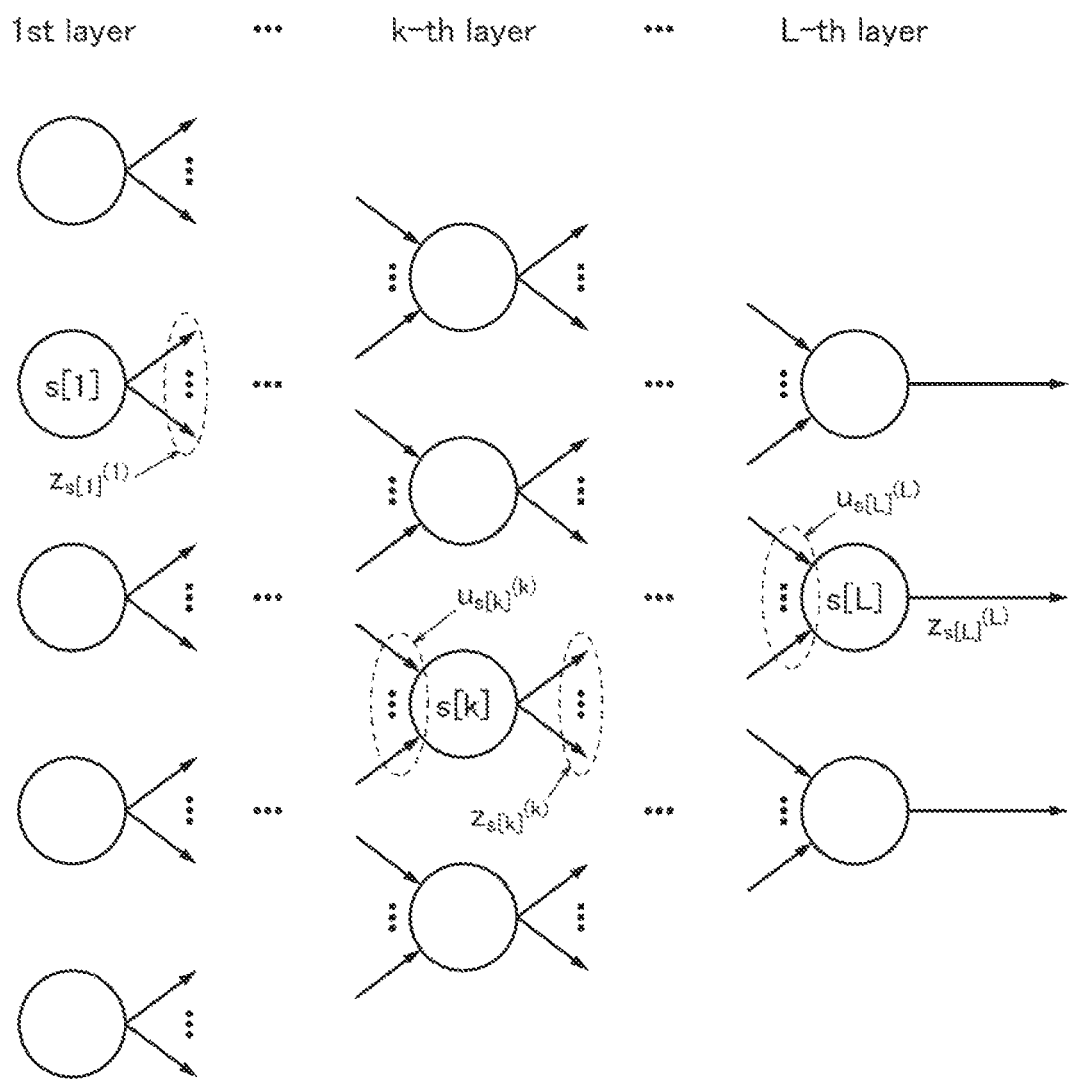
FIG. 7 illustrates a structure example of a neural network.

Here, a hierarchical neural network including layers (here, L, is an integer greater or equal to 3) in total illustrated in FIG. 7 will be described (that is, here, k is an integer greater than or equal to 2 and less than or equal to (L−1)). A first layer is an input layer of the hierarchical neural network, an L-th layer is an output layer of the hierarchical neural network, and second to (L−1)-th layers are hidden layers of the hierarchical neural network.

The first layer (input layer) includes P neurons, the k-th layer (hidden layer) includes Q[k] neurons (Q[k] is an integer greater than or equal to 1), and the L-th layer (output layer) includes R neurons.

An output signal of the s[1]-th neuron in the first layer (s[1] is an integer greater than or equal to 1 and less than or equal to P) is $z_{s[1]}^{(1)}$, an output signal of the s[k]-th neuron in the k-th layer (s[k] is an integer greater than or equal to 1 and less than or equal to Q[k]) is $z_{s[k]}^{(k)}$, and an output signal of the s[L]-th neuron in the L-th layer (s[L] is an integer greater than or equal to 1 and less than or equal to R) is $z_{s[L]}^{(L)}$.

The product $u_{s[k]}^{(k)}$ of an output signal $z_{s[k-1]}^{(k-1)}$ of the s[k−1]-th neuron in the (k−1)-th layer and a weight coefficient $w_{x[k]s[k\ldots 1]}^{(k)}$ (s[k−1] is an integer greater than or equal to 1 and less than or equal to Q[k−1]) is input to the s[k]-th neuron in the k-th layer. The product $u_{s[L]}^{(L)}$ of an output signal $z_{s[L-1]}^{(L-1)}$ of the s[L−1]-th neuron in the (L−1)-th layer and a weight coefficient $w_{s[L]s[L-1]}^{(L)}$ (s[L−1] is an integer greater than or equal to 1 and less than or equal to Q[L−1]) is input to the s[L]-th neuron in the L-th layer.

Figure 8:
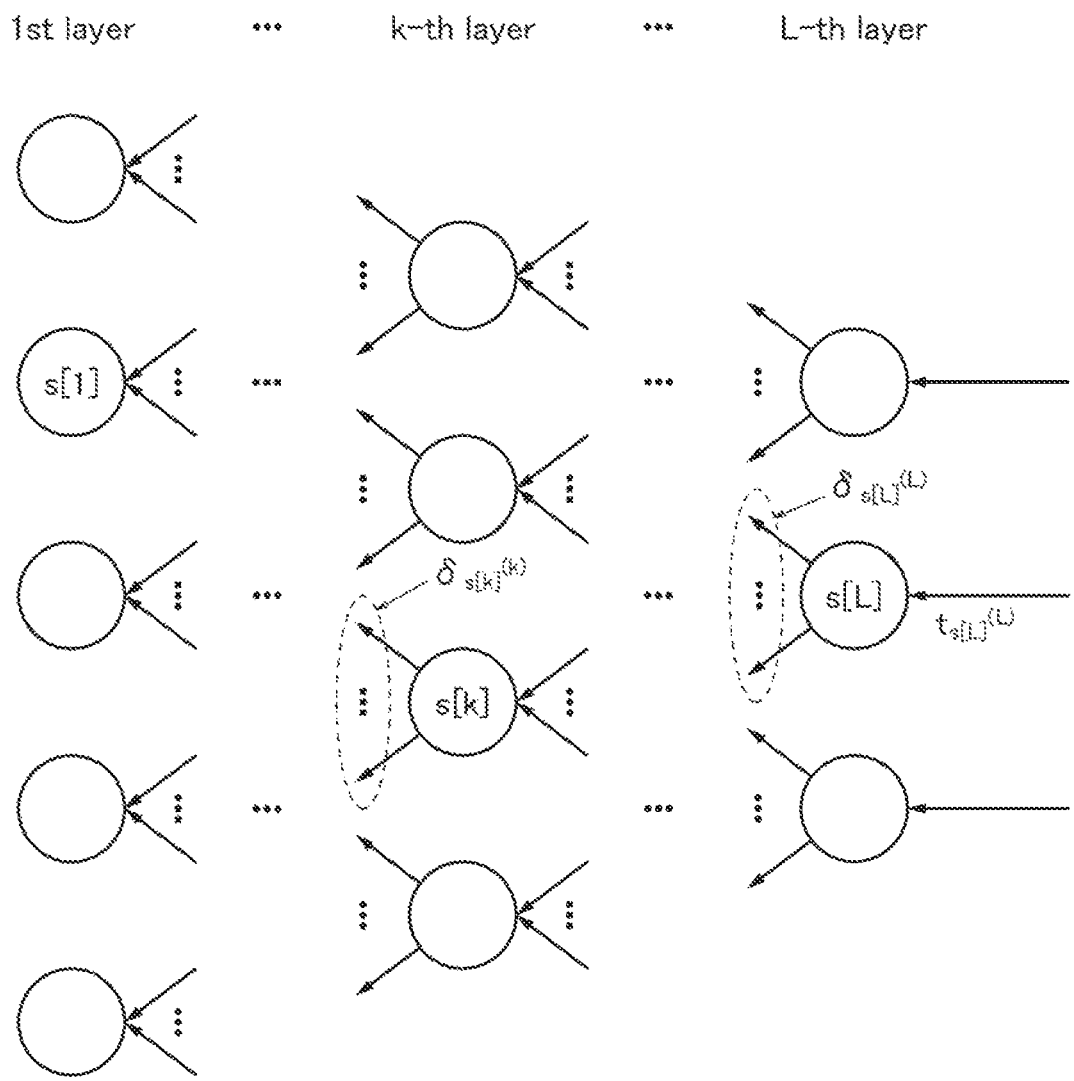
FIG. 8 illustrates a structure example of a neural network.

A learning method using backpropagation will be described. FIG. 8 is a diagram illustrating a learning method using back propagation. Backpropagation is a method for changing a weight coefficient so that an error between an output of a hierarchical neural network and a teaching signal becomes small.

For example, assume that input data is input to the s[L]-th neuron in the first layer and output data $z_{s[L]}^{(L)}$ is output from the s[L]-th neuron in the L-th layer. Here, error energy E can be expressed using output data $z_{s[L]}^{(L)}$ and a teaching signal $t_{s[L]}^{(L)}$, when a teaching signal for the output data $z_{s[L]}^{(L)}$ is $t_{s[L]}^{(L)}$.

The update amount of a weight coefficient $w_{s[k]s[k-1]}^{(k)}$ of the s[k]-th neuron in the k-th layer with to the error energy E is set to $\partial E/\partial w_{s[k]s[k-1]}^{(k)}$, whereby the weight coefficient can be updated. Here, when an error $\partial_{s[k]}^{(k)}$ of the output value $z_{s[k]}^{(k)}$ of the s[k]-th neuron in the k-th layer is defined as $\partial E/\partial_{ks[k]}^{(k)}$ and $\partial E/\partial w_{s[k]s[k-1]}^{(k)}$ can be expressed by the following respective formulae.

$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \tag{D3}$$

$$\frac{\partial E}{\partial w_{s[k]s[k-1]}^{(k)}} = \delta_{s[k]}^{(k)} \cdot z_{s[k-1]}^{(k-1)} \tag{D4}$$

A function $f(u_{s[k]}^{(k)})$ is the derivative of an activation function. The derivative of the activation function can be obtained by connecting an arithmetic circuit that can execute a desired derivative to an output terminal of an operational amplifier, for example.

Here, when the (k+1)-th layer is an output layer, or the L-th layer, $\delta_{s[L]}^{(L)}$ and $\partial E/\partial w_{s[L]s[L-1]}^{(L)}$ can be expressed by the following respective formulae.

$$\delta_{s[L]}^{(L)} = (z_{s[L]}^{(L)} - t_{s[L]}) \cdot f'(u_{s[L]}^{(L)}) \tag{D5}$$

$$\frac{\partial E}{\partial w_{s[L]s[L-1]}^{(L)}} = \delta_{s[L]}^{(L)} \cdot z_{s[L-1]}^{(L-1)} \tag{D6}$$

The errors $\delta_{s[k]}^{(k)}$ and $\delta_{[L]}^{(L)}$ of all neuron circuits can be calculated by Formulae (D1) to (D6). Note that the update amounts of the weight coefficients are set on the basis of the errors $\delta_{s[k]}^{(k)}$ and $\delta_{s[L]}^{(L)}$, predetermined parameters, and the like.

In the correction circuit 40, the weight coefficient is updated so as to reduce the error between the signal SD and the signal DD illustrated FIG. 5B by the above-mentioned backpropagation. Accordingly, learning can be performed in the neural network NN.

[Neural Network Capable of Changing Structure]

As the neural network NN provided in the correction circuit 40, a neural network capable of changing not only the weight coefficient but also the structure of the network can be used. A structure example of such a neural network NN is illustrated in FIG. 9.

Figure 9:
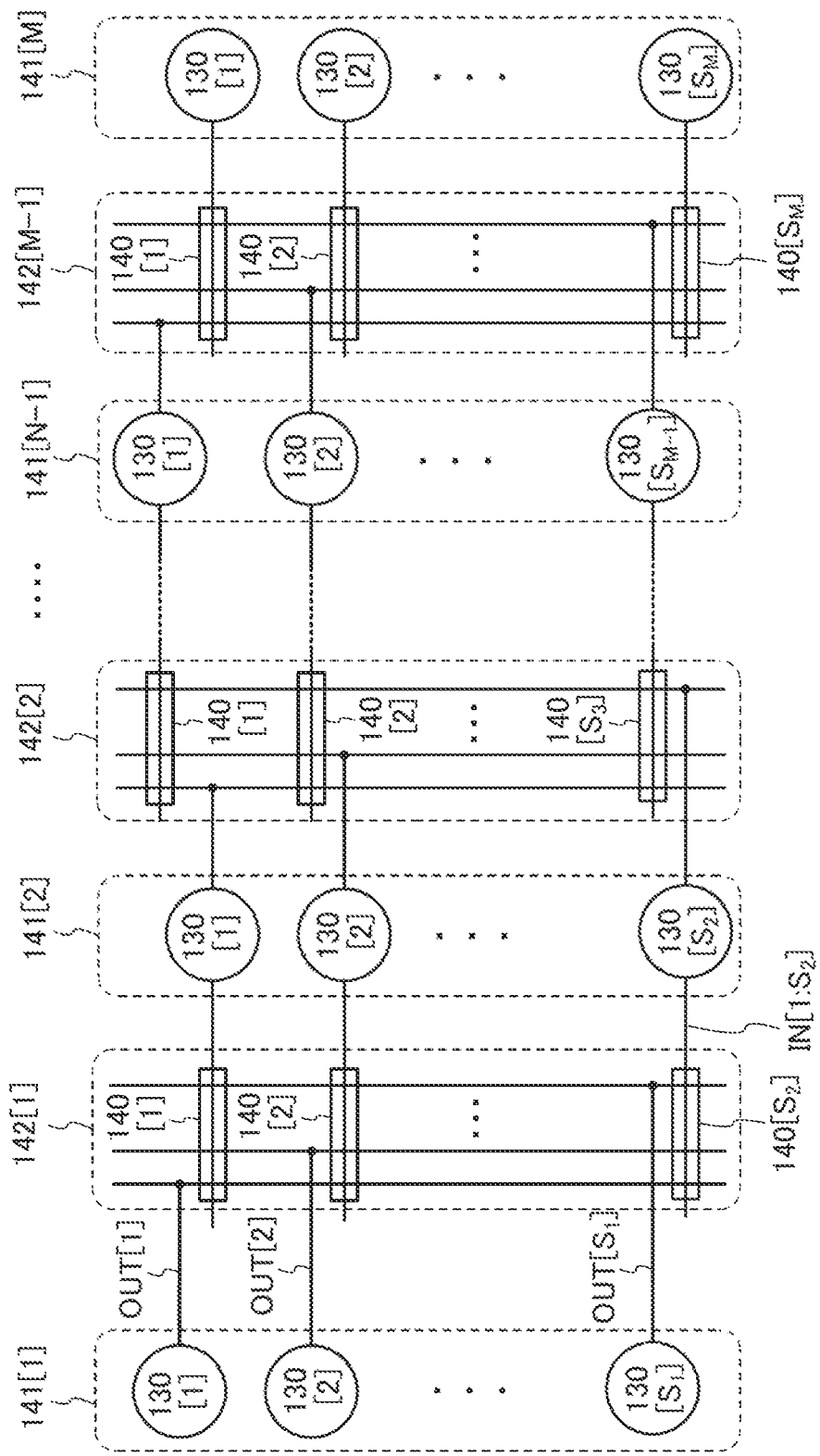
FIG. 9 illustrates a structure example of a neural network.

The neural network NN illustrated in FIG. 9 has a hierarchical stricture formed of arithmetic layers 141[1] to 141[M] and switching layers 142[1] to 142[M−1]. Note that M is an integer of 2 or more.

The arithmetic layer 141[1] includes product-sum operation elements 130[1] to 130[$S_1$], and the arithmetic layer 141[M] includes product-sum operation elements 130[1] to 130[$S_M$]. The switching layer 142[1] includes programmable switches 140[1] to 140[$S_2$], and the switching layer 142[M−1] includes programmable switches 140[1] to 140[$S_M$]. Note that $S_1$ to $S_M$ are each an integer of 1 or more. The switching layer 142 has a function of controlling a connection between two different arithmetic layers 141.

The programmable switch 140 has a function of controlling a connection between the plurality of product-sum operation elements 130 included in a first arithmetic layer 141 and the product-sum operation elements 130 included in a second arithmetic layer 141. For example, in FIG. 9, the programmable switch 140[$S_2$] has a function of controlling a connection between the product-sum operation elements 130[1] to 130[$S_1$] included in the arithmetic layer 141[1] and the product-sum operation element 130[$S_2$] included in the arithmetic layer 141[2].

In this specification, the product-sum operation element 130 is also referred to as a neuron.

Figure 10:
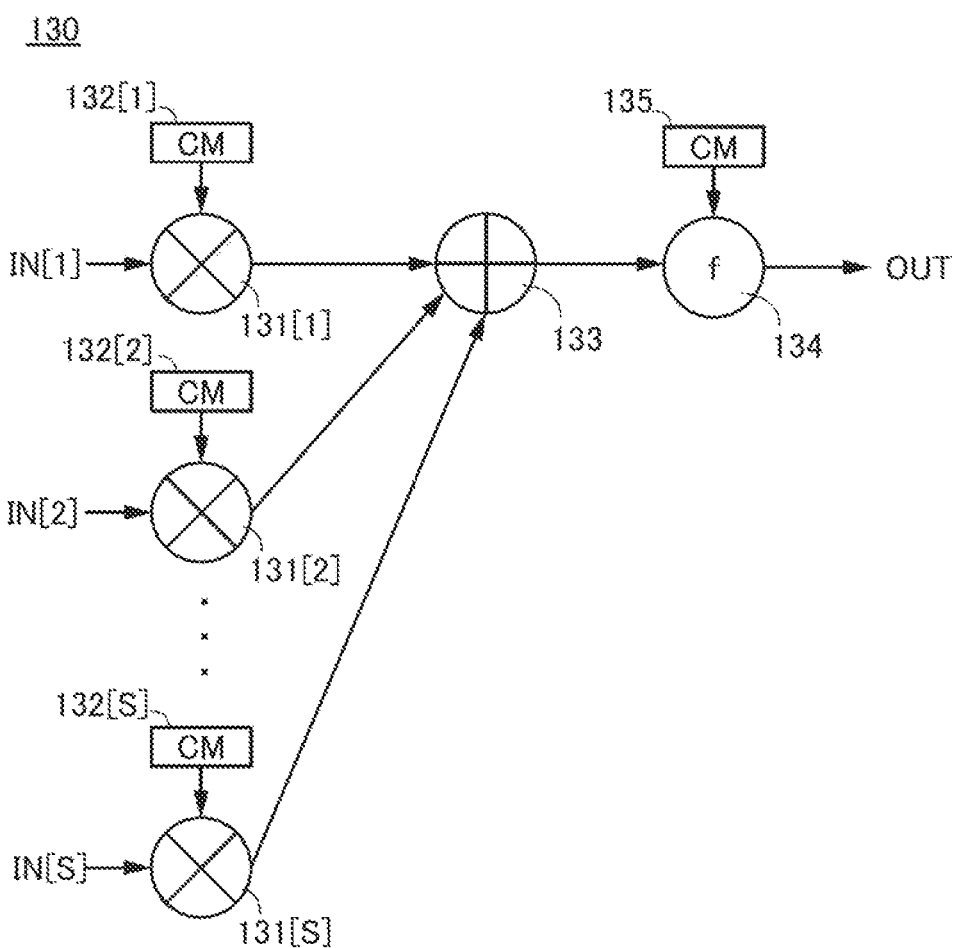
FIG. 10 illustrates a structure example of a product-sum operation element.

FIG. 10 is a block diagram illustrating a structure example of the product-sum operation element 130. The product-sum operation element 130 includes multiplier elements 131[1] to 131[S] for their respective input signals IN[1] to IN[S], an adder element 133, an activation function element 134, configuration memories (CM) 132[1] to 132[5], and a CM 135. Note that S is an integer of 1 or more.

The multiplier element 131 has a function of multiplying the data stored in the CM 132 by the input signal M. The data on the weight coefficient is stored in the CM 132.

The adder element 133 has a function of adding all the outputs (multiplication results) from the multiplier elements 131[1] to 131[S].

The activation function element 134 performs an operation on the output (product-sum operation result) from the adder element 133 on the basis of the function defined by the data stored in the CM 135 and outputs an output signal OUT. The function can be a sigmoid function, a tan h function, a softmax function, a ReLU function, a threshold function, or the like. This function is implemented in the form of a table, broken line approximation, or the like, and the corresponding data is stored in the CM 135 as configuration data.

Furthermore, the CMs 132[1:S] and the CM 135 preferably have their own writing circuits. In this case, an update of the data in the CMs 132[1:S] and an update of the data in the CM 135 can be independently performed. That is, the update of the data in the CMs 132[1:S] can be repeated a plurality of times without updating the data in the CM 135. In this way, during the learning by the neural network, only the update of the weight coefficient can be repeated a plurality of times, leading to efficient learning.

Figure 11A:
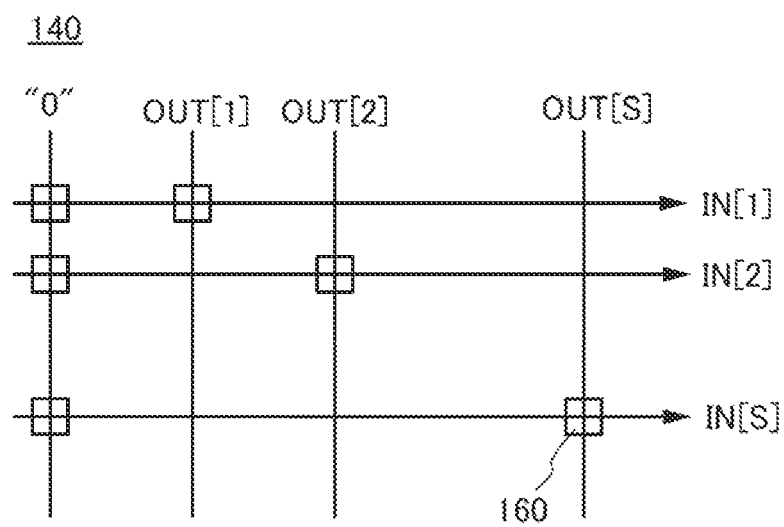
FIGS. 11A and 11B illustrate a structure example of a programmable switch.

FIG. 11A is a circuit diagram illustrating structure of the programmable switch 140. The programmable switch 140 includes a switch 160.

The programmable switch 140 has a function of transmitting the output signals OUT[1] to OUT[S] as the input signals IN[1] to N[S]. For example, in FIG. 9, the programmable switch 140[$S_2$] has a function of controlling a connection between the output signals OUT[1] to OUT[$S_1$] of the arithmetic layer 141[1] and the input signal IN[1:$S_2$] of the product-sum operation element 130[$S_2$] included in the arithmetic layer 141[2].

Furthermore, the programmable switch 140 has a function of controlling a connection between a signal "0" and the input signals IN[1] IN[S] of the product-sum operation element 130.

Figure 11B:
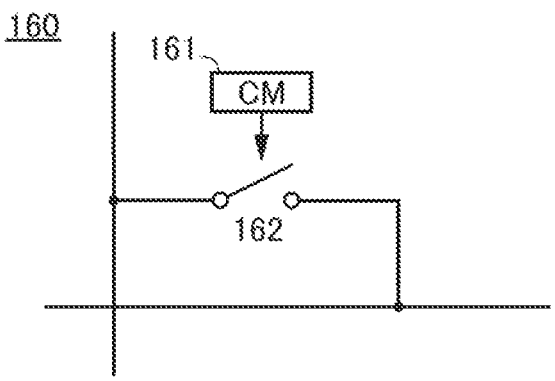

FIG. 11B is a circuit diagram illustrating a structure example of the switch 160. The switch 160 includes a CM 161 and a switch 162. The switch 162 has a function of controlling an electrical connection between OUT[i] and IN[i]. In addition, the switch 162 has a function of controlling an electrical connection between "0" and IN[i]. The configuration data stored in the CM 161 controls on/off of the switch 162. A transistor can be used as the switch 162.

In the case where the product-sum operation element 130 does not use OUT[i] that is output from the immediately preceding arithmetic layer 141 as an input, is supplied to the product-sum operation element 130 as IN[i]. At this time, the power consumption of the multiplier element 131[$i$] corresponding to IN[i] can be reduced by the stop of power supply (power gating). For example, in FIG. 9, in the case where the product-sum operation element 130[$S_2$] included in the arithmetic layer 141[2] does not use OUT[1] that is output form the arithmetic layer 141[1] as an input, "0" is supplied to the product-sum operation element 130[$S_2$] as IN[1] to stop power supply to the multiplier element 131[1].

Furthermore, in the case where OUT[i] that is output from the product-sum operation element 130 included in one arithmetic layer 141 is not supplied to any product-sum operation element 130 included in the other arithmetic layers 141, power supply to the entire product-sum operation element 130 which outputs the OUT[i] can be stopped, so that power consumption can be reduced. For example, in FIG. 9, in the case where the product-sum operation element 130[$S_1$] included in the arithmetic layer 141[1] is not connected to any product-sum operation element 130 included in the other arithmetic layers 141, power supply to the entire product-sum operation element 130[$S_1$] is stopped.

In the above-described structure, the configuration memories may be static random access memories (SRAM), magnetoresistive random access memories (MRAM), or memories that use OS transistors (also referred to as OS memories below). By using OS memories as the configuration memories, the power consumption of the neural network NN can be drastically reduced.

When the CMs 132[1] to 132[S] and the CM 135 illustrated in FIG. 10 are OS memories for example, the neural network NN can construct a low power consuming network with a small number of elements.

When the CM 161 illustrated in FIG. 11B is an OS memory for example, the neural network NN can be a low power consuming network with a small number of elements.

Furthermore, when an analog circuit is used as the multiplier elements 131 and the adder element 133, the number of transistors included in the product-sum operation element 130 can be reduced.

Moreover, when the input and output signals of the product-sum operation element 130 are analog signals, the number of wirings which form the network can be reduced.

The neural network NN in FIG. 9 can generate configuration data of the programmable switch 140 for forming a desired network structure and can perform learnt on the basis of the configuration data. In the case where the weight coefficient is updated by the learning, changing only the configuration data of the weight coefficient repeatedly without changing the configuration data of the programmable switch 140 is effective. Therefore, the configuration data supplied to the CMs 132[1:S] included in the product-sum operation element 130 and the configuration data supplied to the CM 161 included in the programmable switch 140 are preferably written from different circuits.

By controlling the programmable switch 140 in the above-described manner, the number of layers in the neural network, the number of product-sum operation elements 130 used for the operation, or the like can be controlled. Thus, the neural network NN which can change the network structure in accordance with the image signal can be achieved.

<Change of Weight Coefficient>

As described above, the correction of the signal SD can be performed on the pixel row basis or multiple pixel row basis. The correction of the signal SD can also be performed on only the pixels in a certain region. In this case, the weight coefficient of the neural network NN needs to be updated in a period when the wirings GI, are sequentially scanned. Thus, it is preferable to update the weight coefficient at high speed.

Here, in order to update the weight coefficient at high speed, a structure which uses a register including a plurality of scan chain register portions which store a set of weight coefficients is effective. In this case, by switching the scan chain register portion which outputs the weight coefficient to the neural network NN, the output of weight coefficient can be switched quickly. A structure example of the register having such a structure will be described below.

Structure Example of Register

Figure 12:
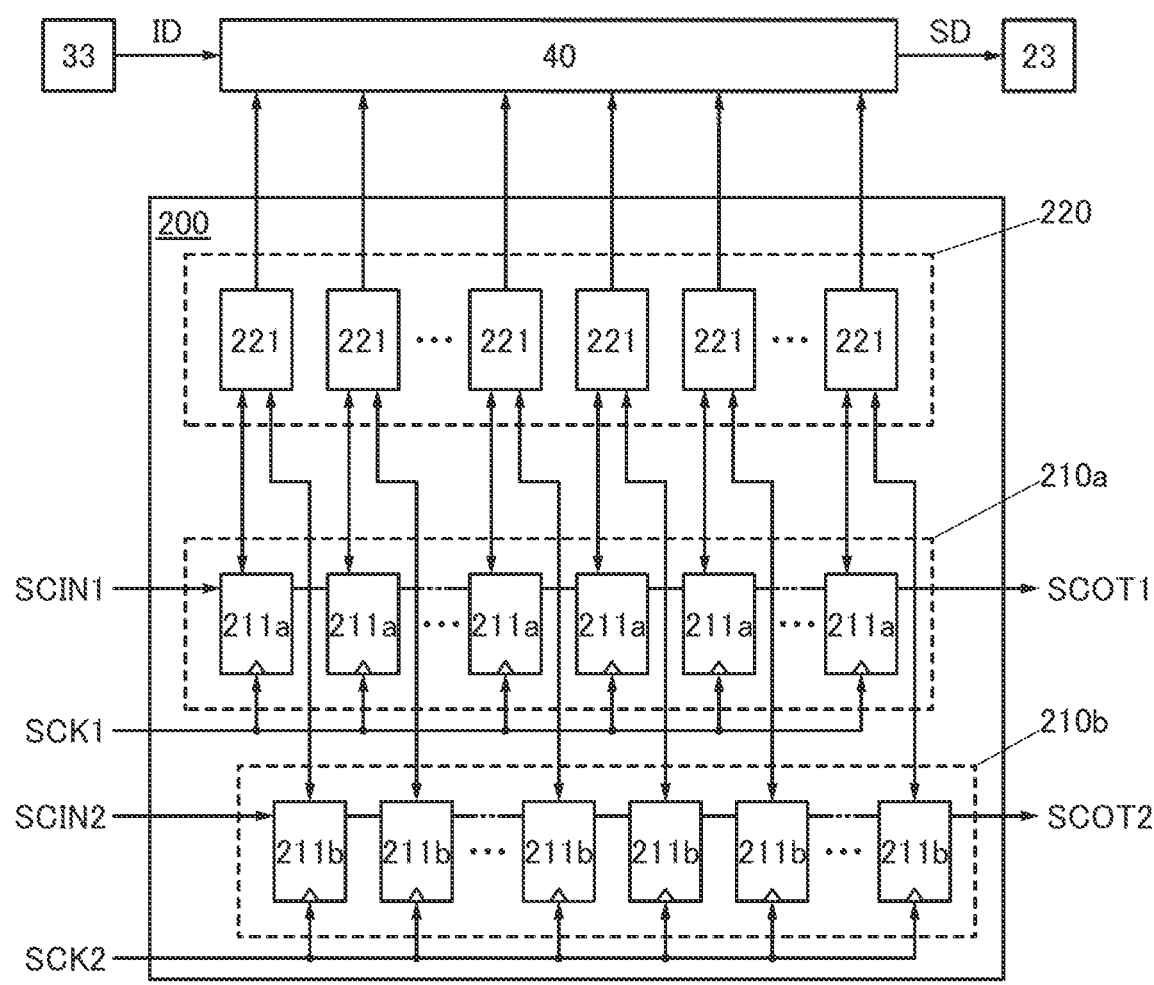
FIG. 12 illustrates a structure example of a register.

FIG. 12 illustrates a structure example of a register 200. The register 200 includes a plurality of scan chain register portions 210 and a register portion 220. The scan chain register portions 210 each store a set of weight coefficients of the neural network NN used for the correction of image signals. Note that the register can be provided in the display portion 20 or the signal generation portion 30.

Although the structure provided with the two scan chain register portions 210 (210a, 210b) is described here, the number of scan chain register portions 210 can be an arbitrary number of three or more. Each of the scan chain register portions 210a and 210b can store a set of parameters for generating a selection signal having a predetermined pulse width.

The register portion 220 includes a plurality of registers 221. The scan chain register portion 210a includes a plurality of registers 211a and nodes SCIN1 and SCOT1. The scan chain register portion 210b includes a plurality of registers 211b nodes SCIN2 and SCOT2.

The registers 211a and 211b are nonvolatile registers, which do not lose data even when power supply is stopped. Each of the registers 211a and 211b is provided with a retention circuit including an OS transistor to be nonvolatile.

Because a metal oxide has a larger energy gap and a lower minority carrier density than a semiconductor such as silicon, a current flowing between a source and a drain of an OS transistor when the OS transistor is in an off state (such a current is also referred to as an off-state current) can be extremely low. Accordingly, when OS transistors are used in the registers 211a and 211b, data can be retained for a long period as compared with the case where transistors including silicon in their channel formation regions (hereinafter, also referred to as Si transistors) are used. This enables data retention even in a period when the power supply to the registers 211a and 211b is stopped.

Meanwhile, the registers 221 are volatile registers. There is no particular limitation on the circuit structure of the registers 221; the registers 221 can be any circuit capable of storing data, and a latch circuit, a flip-flop circuit, or the like can be used. The data on weight coefficient is output from the register portion 220 and supplied to the correction circuit 40.

To update data stored in the register 200, first, data in the scan chain register portions 210a and 210b are changed. To change data in the scan chain register portion 210a, data is input from the node SCIN1 while a scan clock signal SCK1 is toggled. By the data input from the node SCIN1, data in each register 211a is updated in accordance with the scan clock, signal SCK1. The last-stage register 211a outputs data from the node SCOT1. Similar change data in the scan chain register portion 210b, data is input from the node SCIN2 while a scan clock signal SCK2 is toggled. By the data input from the node SCIN2, data in each 211b is updated in accordance with the scan clock signal SCK2. The last-stage register 211b outputs data from the node SCOT2.

In the case where the data on weight coefficient is stored in the scan chain register portions 210a and 210b, for example, the data on weight coefficients are sequentially input to the nodes SCIN1 and SCN2 from the arithmetic processing device (e.g., a dedicated server or a cloud) or the like which performs learning in the neural network NN.

After the data of each register 211a in the scan chain register portion 210a is rewritten, the data of the registers 211a are collectively loaded into the corresponding registers 221 in the register portion 220. Alternatively, after the data of each register 211b in the scan chain register portion 210b is rewritten, the data of the registers 211b are collectively loaded into the corresponding registers 221 in the register portion 220. Accordingly, the correction circuit 40 can correct the image signal by using the collectively updated weight coefficient. The operation of the correction circuit 40 can be stable because simultaneity in weight coefficient update is maintained. By including the scan chain register portions 210a and 210b and the register portion 220, data in the scan chain register portions 210a and 210b can be updated even while the correction circuit 40 is in operation.

Note that power supply to the register 200 can be temporarily stopped (power gating) in a period when the register 200 is not accessed. When the register 200 is power-gated, power is blocked after data is stored (saved) in the retention circuit of the registers 211a and 211b. After the power supply is restored, normal operation is restarted after the data in the register 211a or 211b is restored (loaded) to the register 221. Note that in the case where the data stored in the register 211a or 211b and the data stored in the register 221 do not match each other, it is preferable to save the data of the register 221 in the register 211a or 211b and then store the data again in the retention circuit of the registers 211a and 211b. When the above data do not match, data in the scan chain register portions 210a and 210b may have been changed, for example.

Figure 13:
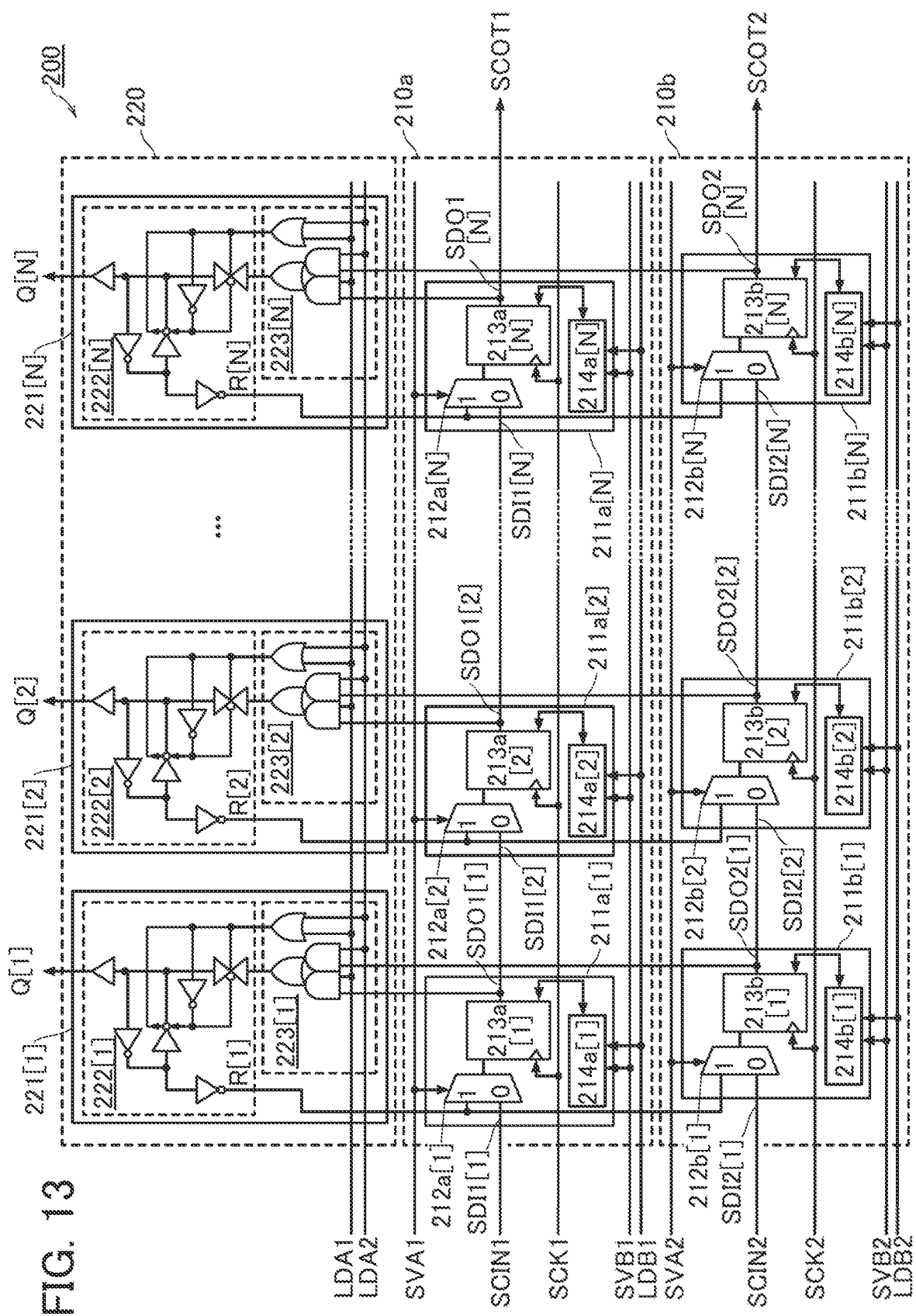
FIG. 13 illustrates a structure example of a register.

A circuit configuration example of the register 200 will be described with reference to FIG. 13 and FIG. 14.

The register portion 220 includes N registers 221 (N is an integer of 2 or more). Signals LDA1 and LDA2 are input to the register portion 220. The signals LDA1 and LDA2 are signals for controlling data loading.

The scan chain register portion 210a includes N registers 211a, and the scan chain register portion 210b includes N registers 211b. The scan clock signal SCK1 and signals SVA1, SVB1 and LDB1 are input to the scan chain register portion 210a. The scan clock signal SCK2 and signals SVA2, SVB2, and LDB2 are input to the scan chain register portion 210b. The signals LDB1 and LDB2 are signals for controlling data loading. The signals SVA1, SVA2, SVB1, and SVB2 are signals for controlling data saving.

The register 221 includes a latch circuit 222 and a multiplexer (MUX) 223. The register 211a includes a selector 212a, a flip-flop circuit 213a, a retention circuit 214a, and nodes SDI1 and SDO1. The register 211b includes a selector 212b, a flip-flop circuit 213b, a retention circuit 214b, and nodes SDI2 and SDO2. The nodes SDI1 and SDI2 are nodes to which data is input. The nodes SDO1 and SDO2 are nodes from which data is output.

The register is a volatile register. Nodes Q and R are output nodes of the latch circuit 222 and output data with the same logic. The node Q is connected to the correction circuit 40. The node R is connected to the registers 211a and 211b. There is no particular limitation on the latch circuit 222, and another circuit such as a flip-flop circuit may be provided.

The MUX 223 has a function of selecting data to be input to the latch circuit 222. The signals LDA1 and LDA2 are control signals for the MUX 223, in the example of FIG. 13, data in the latch circuit 222 is updated by data of the node SDO1 when the signal LDA1 is at high level and the signal LDA2 is at low level. On the other hand, when the signal LDA1 is at low level and the signal LDA2 is at high level, data in the latch circuit 222 is updated by data of the node SDO2.

The registers 211a and 211b are nonvolatile registers. A more specific circuit configuration example of the registers 211a and 211b will be described with reference to FIG. 14.

In the register 211a, the selector 212a and the flip-flop circuit 213a constitute a scan flip-flop circuit. When the scan chain register portion 210a operates as a shift register, the register 211a takes data from the node SDI1 and outputs the data from the node SDO1. The data of the node SDO1 is input to the node SDI1 in the next-stage register 211a.

The signal SVA1 is a control signal for the selector 212a. When the signal SVA1 is at high level, the selector 212a establishes electrical continuity between an input node of the flip-flop circuit 213a and the node R in the register 221. When the signal SVA1 is at low level, the selector 212a establishes electrical continuity between the input node of the flip-flop circuit 213a and the node SDI1.

Figure 14:
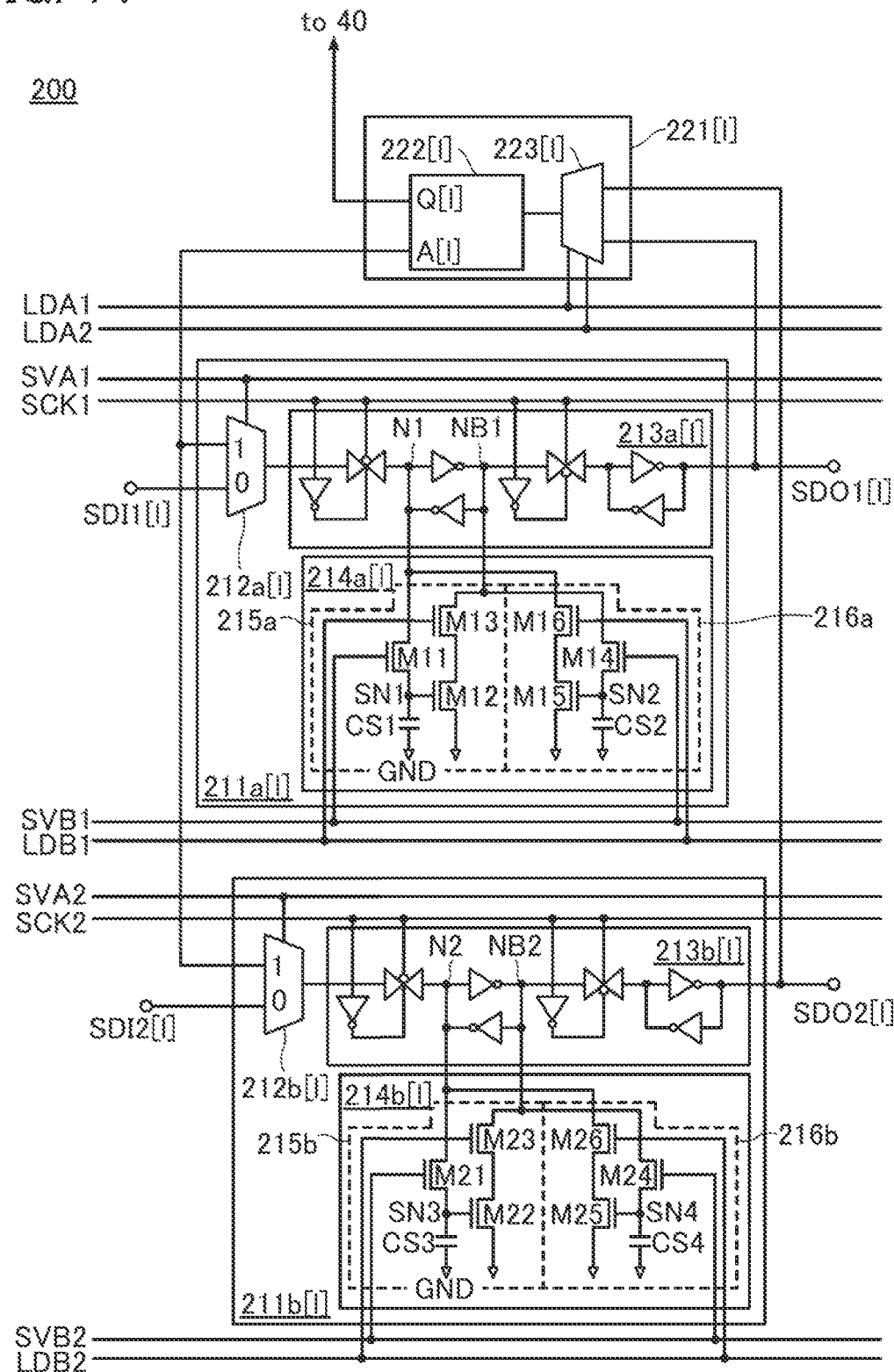
FIG. 14 illustrates a structure example of a register.

The flip-flop circuit 213a is not limited to having the circuit configuration in FIG. 14 and can be any of a variety of flip-flop circuits. The retention circuit 214a is connected to nodes N1 and NB1 in the flip-flop circuit 213a. The signals LDB1 and SVB1 are control signals for the retention circuit 214a.

The retention circuit 214a is a circuit for storing data retained in the flip-flop circuit 213a and includes two memory circuits 215a and 216a. Here, each of the memory circuits 215a and 216a is composed of a three-transistor gain cell. The memory circuit 215a includes transistors M11 to M13, a capacitor CS1, and a node SN1. The memory circuit 216a includes transistors M14 to M16, a capacitor CS2, and a node SN2. The nodes SN1 and SN2 are retention nodes of the respective memory circuits 215a and 216a.

The memory circuit 215a has a function of backing up data of the node N1 and loading the backed-up data into the node NB1. The memory circuit 216a has a function of backing up data of the node NB1 and loading the backed-up data into the node N1. In accordance with the signal SVB1, the memory circuit 215a writes data of the node N1 to the node SN1 and the memory circuit 216a writes data of the node NB1 to the node SN2. In accordance with the signal LDB1, the memory circuit 215a writes data of the node SN1 to the node NB1 and the memory circuit 216a writes data of the node SN2 to the node N1.

The transistors M11 and M14 are OS transistors; thus, the retention circuit 214a can retain data for a long time even when power supply is stopped. In the register 211a, the transistors other than the transistors M11 and M14 may be Si transistors.

The circuit configuration of the register 211b is similar to that of the register 211a; therefore, the description of the register 211a can be referred to for the details of the register 211b.

In the register 211b, the selector 212b and the flip-flop circuit 213b constitute a scan flip-flop circuit. The selector 212b selects one of the node R and the node SDI2 in accordance with the signal SVA2, and establishes electrical continuity between the selected node and an input node of the flip-flop circuit 213b.

The retention circuit 214b is connected to nodes N2 and NB2 in the flip-flop circuit 213b. The retention circuit 214b includes memory circuits 215b and 216b. The circuit 215b includes transistors M21 to M23, a capacitor CS3, and a node SN3. The memory circuit 216b includes transistors M24 to M26, a capacitor CS4, and a node SN4. The memory circuit 215b stores data of the flip-flop circuit 213b in accordance with the signal SVB2, and loads the retained data into the flip-flop circuit 213b accordance with the signal LDB2.

The transistors M21 and M24 are OS transistors; thus, the retention circuit 214b can retain data for a long time even when power supply is stopped. The transistors M21 and M24 may have a back gate. The same applies to the transistors M11 and M14.

In the register 211b, the transistors other than the transistors M21 and M24 may be Si transistors.

Note that FIG. 14 shows an example in which the retention circuit 214b backs up complementary data of one inverter loop (closer to the input node) in the flip-flop circuit 213b. The retention circuit 214b may be provided so as to back up complementary data of the next inverter loop (closer to the output node) in the flip-flop circuit 213b. The same applies to the register 211a. The retention circuits 214a and 214b having such a configuration enable asynchronous loading of backed-up data, resulting in high-speed data loading. Thus, the time it takes to restore the power-gated register 200 to a normal operation state from a power-off state can be shortened.

Operation Example of Register

An operation example of the register 200 will be described with reference to FIG. 15. FIG. 15 is a timing chart showing an operation example of the register 200. PLDD refers to a wiring that supplies a potential VDD to the register 200. The potential VDD is a power supply potential. A hatched portion of a waveform pattern for the node N1 and the like denotes that the logic is undefined (the logic is not determined to be whether at high level or at low level).

In the period T11, the scan chain register portions 210a and 210b perform scan operation, and data is written to each of the scan chain register portions 210a and 210b. In this period, the signals SVA1 and SVA2 are at low level, and the scan clock signals SCK1 and SCK2 are active. Thus, electrical continuity between the node SDI1 and the input node of the flip-flop circuit 213a is established by the selector 212a, and electrical continuity between the node SDI2 and the input node of the flip-flop circuit 213b is established by the selector 212b.

To write data to the N registers 211a in the scan chain register portion 210a, data of the node SCIN1 is updated in synchronization with the scan clock signal SCK1. In the register 211a[l] (l is an integer of 1 to N), data of the node SDO1[l] is updated in synchronization with the rising edge of the scan clock signal SCK1, and data of the node N1[l+1] is updated by the data of the node SDO1[l] in synchronization with the falling edge of the scan clock signal SCK1. As the scan clock signal SCK1 repeatedly toggled, data of the node SCIN1 is shifted within the registers 211a. Data stored in each register 211a can be sequentially obtained from the node SCOT1.

Shift operation of the scan chain register portion 210b is performed in a similar manner to that of the scan chain register portion 210a. Data or the node SDO2 is updated synchronization with the rising edge of the scan clock signal SCK2.

In the period T12, data in the register portion 220 is updated. The signal LDA1 changes to high level, whereby electrical continuity between the node SDO1[*l*] and an input node of the latch circuit 222[*l*] is established by the MUX 223[*l*]. The latch circuit 222[*l*] stores data $D_k$ that is retained in the register 211a[*l*]. The data $D_l$ is output from the nodes Q[1] and A[1]. In other words, by setting the signal LDA1 to high level, data $D_1$ to data $D_N$ retained in the scan chain register portion 210a are collectively loaded into the register portion 220. Accordingly, the weight coefficient and the like used in the correction circuit 40 can be collectively changed.

In order to update data in the register portion 220 by data retained in the scan chain register portion 210b, the signal LDA2 is set to high level while the signal LDA1 is kept at low level.

In the period T12, electrical continuity is established between the node N1[1] and the node SCIN1 when the scan clock signal SCK1 and the signal SVA1 become low; hence, the potential of the node N1[1] changes in accordance with the potential of the node SCIN1. Similarly, when the scan dock signal SCK2 and the signal SVA2 become low, the potential of the node N1[2] changes in accordance with the potential of the node SCIN2.

In a period T13, the register 200 operates normally. The data $D_1$ to data $D_N$, which are written in the period T12, are output from the nodes Q[1] to Q[N]. In this period, the scan chain register portion 210a may perform scan operation to change data in the scan chain register portion 210a. After data in the scan chain register portion 210a is changed, data in the register portion 220 may be rewritten by setting the signal LDA1 to high level. The same applies to the scan chain register portion 210b.

In a period T20, power gating operation of the register 200 is performed. The power gating operation is broadly divided into backup operation for the register 200, operation of turning off power, and recovery operation for the register 200.

In a period 114, the backup operation for the register 200 is performed. First, the signal SVA1 is set to high level, and then the scan clock signal SCK1 is set to high level; hence, the data $D_1$ to data $D_N$ stored in the register portion 220 are written to the flip-flop circuit 213a in the scan chain register portion 210a. In the example of FIG. 15, the scan dock signal SCK2 is set to high level together with the scan clock signal SCK1 to simplify signal control; however, the scan clock signal SCK2 may be kept at low level.

By setting the signal SVA1 to high level, the selector 212a establishes electrical continuity between the node A of the latch circuit 222 and the input node of the flip-flop circuit 213a. When the scan clock signal SCK1 is at low level, data of the node A is written to the node N1 of the flip-flop circuit 213a. When the scan clock signal SCK1 changes to high level, electrical continuity between the node N1 and the node A is broken, and electrical continuity between the node N1[1] and the node SCIN1 is broken.

Note that in the case where data stored in the register portion 220 is data loaded from the scan chain register portion 210b, the data in the register portion 220 is backed up in the scan chain register portion 210b. In this case, the signal SVA2 is set to high level, and then the scan dock signal SCK2 is set to high level.

Next, backup operation for the scan chain register portions 210a and 210b is performed. During the operation, the signals SVB1 and SVB2 are set to high level. When the signal SVB1 becomes high, data of the nodes N1 and NB1 in the flip-flop circuit 213a are written to the nodes SN1 and SN2 in the retention circuit 214a. When the signal SVB2 becomes high, data of the nodes N1 and NB1 in the flip-flop circuit 213b are written to the nodes SN3 and SN4 in the retention circuit 214b.

By setting the signals SVB1 and SVB2 to low level, the backup operation for the register 200 is completed.

In a period T15, the operation of turning off power is conducted. Specifically, supply of the potential VDD to the wiring PLDD is stopped. The wiring PLDD is gradually discharged. Since the potential of the wiring PLDD decreases, data in the latch circuit 222 and the flip-flop circuits 213a and 213b are lost: however, data in the retention circuits 214a and 214b are not lost.

In a period T16, recovery operation for the scan chain register portions 210a and 210b is carried out. First, supply of the potential VDD to the wiring PLDD ailed. The potential of the wiring PLDD increases and then becomes the potential VDD.

Next, the signals LDB1 and LDB2 are set to high level, and one clock of the scan clock signal SCK1 and one clock of the scan clock signal SCK2 are input. When the signal LDB1 becomes high, the retention circuit 214a writes data of the nodes SN1 and SN2 to the nodes N1 and NB1 in the flip-flop circuit 213a. The data of the node N1 is input to the node SDO1 in synchronization with the rising edge of the scan clock signal SCK1. When the signal LDB2 becomes high, the retention circuit 214b writes data of the nodes SN3 and SN4 to the nodes N2 and N132 in the flip-flop circuit 213b. The data of the node N2 is input to the node SDO2 in synchronization with the rising edge of the scan dock signal SCK2.

By setting the signals LDB1 and LDB2 to low level, the recovery operation is completed.

In a period T17, recovery operation for the register portion 220 is performed. The signal LDA1 is set to high level to restore the register portion 220 to the state in the period T13. The recovery operation in the period T17 is the same as the operation of updating data in the register portion 220 in the period T13; thus, the data $D_1$ to data $D_N$ retained in the scan chain register portion 210a are collectively loaded into the register portion 220. By setting the signal LDA1 to low level, the recovery operation is completed.

In a period T18, the register 200 operates normally and outputs the data $D_1$ to data $D_N$, which are written in the period T17, from the nodes Q[1] to Q[N].

Through the above-described, operation, a collective change of the weight coefficient that is used in the correction circuit 40 and power gating of the register 200 can be performed.

Structure Example of Pixel

Next, a specific structure example of the pixels 52 in FIG. 2 wilt be described.

Figure 16A:
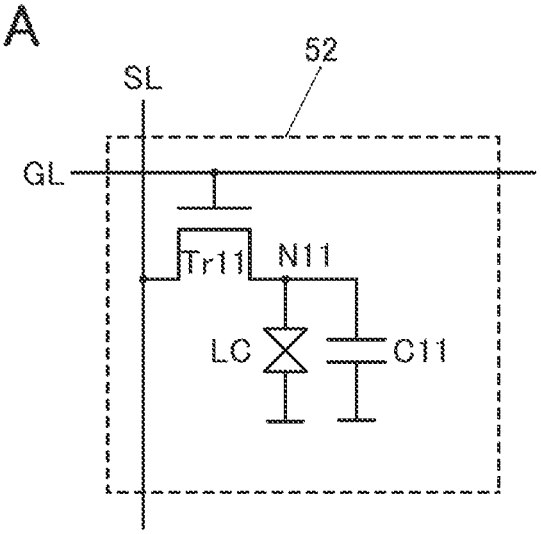
FIGS. 16A and 16B each illustrate a structure example of a pixel.

FIG. 16A illustrates a structure example of a pixel using a liquid crystal element. The pixel 52 in FIG. 16A includes a transistor Tr11, a capacitor C11, and a liquid crystal element LC. Although the transistor Tr11 is of an n-channel type here, the polarity of the transistor can be changed as appropriate.

A gate of the transistor Tr11 is connected to the wiring GL. One of a source and a drain of the transistor Tr11 is connected to one electrode of the liquid crystal element LC and one electrode of the capacitor C11. The other of the source and the drain of the transistor Tr11 is connected to the wiring SL. The other electrode of the liquid crystal element LC and the other electrode of the capacitor C11 are each connected to a wiring to which a predetermined potential is supplied. A node which is connected to the one of the source and the drain of the transistor Tr11, the one electrode of the liquid crystal element LC, and the one electrode of the capacitor C11 is a node N11.

Note that a source of a transistor in this specification and the like means a source region that is part of a semiconductor layer functioning as a channel region, a source electrode connected to the semiconductor layer, or the like. Similarly, a "drain" of a transistor means a drain region that is part of the semiconductor layer, a drain electrode connected to the semiconductor layer, or the like. A gate means a gate electrode or the like.

The terms "source" and "drain" of a transistor interchange with each other depending, on the conductivity type of the transistor or levels of potentials applied to the terminals. In general, in an n-channel transistor, a terminal to which a lower potential is applied is referred to as a source, and a terminal to which a higher potential is applied is referred to as a drain. In a p-channel transistor, a terminal to which a lower potential is applied is referred to as a drain, and a terminal to which a higher potential is applied is referred to as a source. In this specification, although the connection relationship of the transistor is described assuming that the source and the drain are fixed in some cases for convenience, actually, the source and the drain interchange with each other depending on the relationship of the potentials.

The potential of the other electrode of the liquid crystal element LC may be a common potential among the plurality of pixels 52 or may be the same potential as the other electrode of the capacitor C11. The potential of the other electrode of the liquid crystal element LC may differ between the pixels 52. The capacitor C11 has a function of a storage capacitor for holding a potential of the node N11.

The transistor Tr11 has a function of controlling the supply of a potential of the wiring SL to the node N11. Specifically, the potential of the wiring GL is controlled to turn on the transistor Tr11, whereby the potential of the wiring SL (corresponding to the image signal) is supplied to the node N11 and is written to the pixel 52. Then, the potential of the wiring GL is controlled to turn off the transistor Tr11, whereby the potential of the node N11 is held.

The liquid crystal element LC includes a pair of electrodes and a liquid crystal layer containing a liquid crystal material to which the voltage between the pair of electrodes is applied. The alignment of the liquid crystal molecules included in the liquid crystal element LC changes in accordance with the value of the voltage applied between the pair of electrodes, and thus the transmittance of the liquid crystal layer is changed. Therefore, when the potential supplied from the wiring SL to the node N11 is controlled, the gray level of the pixel 52 can be controlled.

Figure 16B:
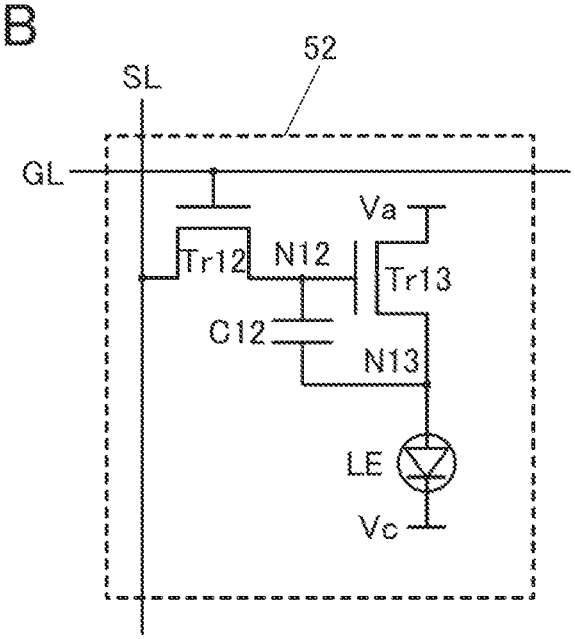

FIG. 16B illustrates a structure example of the pixel 52 including a light-emitting element. The pixel 52 in FIG. 16B includes transistors Tr12 and Tr13, a capacitor C12, and a light-emitting element LE. Although the transistors Tr12 and Tr13 are described as being n-channel transistors, the polarities of the transistors can be set as appropriate.

A gate of the transistor Tr12 is connected to a wiring GL. One of a source and a drain of the transistor Tr12 is connected to a gate of the transistor Tr13 and one electrode of the capacitor C12. The other of the source and the drain of the transistor Tr12 is connected to a wiring SL. One of a source and a drain of the transistor Tr13 is connected to the other electrode of the capacitor C12 and one electrode of the light-emitting element LE. The other of the source and the drain of the transistor Tr13 is connected to a wiring to which the potential Va is supplied. The other electrode of the light-emitting element LE is connected to a wiring to which the potential Vc is supplied. A node which is connected to the one of the source and the drain of the transistor Tr12, the gate of the transistor Tr13, and the one electrode of the capacitor C12 is referred to as a node N12. A node which is connected to the one of the source and the drain of the transistor Tr13 and the other electrode of the capacitor C12 is referred to as a node N13.

Here, the case where the potential Va is a high power supply potential and the potential Vc is a low power supply potential is described. The capacitor C11 functions as a storage capacitor for retaining the potential of the node N12.

The transistor Tr12 is configured to control supply of the potential of the wiring SL to the node N12. Specifically, the potential of the wiring GL is controlled to turn on the transistor Tr12, whereby the potential of the wiring SL (corresponding to the image signal) is supplied to the node N12 and is written to the pixel. Then, the potential, of the wiring GL is controlled to turn off the transistor Tr12, whereby the potential of the node N12 is retained.

The amount of current flowing between the source and the drain of the transistor Tr13 is controlled in accordance with the voltage between the nodes N12 and N13. The light-emitting element LE emits light with a luminance corresponding to the amount of flowing current. Accordingly, the gray level of the pixel 52 can be controlled. Note that the transistor Tr13 preferably operates in a saturation region.

The above-described operation is performed for the wirings GL one by one, whereby an image for a first frame can be displayed.

The selection of any of the wirings GL may be performed by either progressive scan or interlaced scan. The supply of the image signals to the wirings SL may be performed by dot sequential driving in which video signals are sequentially supplied to the wirings SL, or line sequential driving in which image signals are concurrently supplied to the wirings SL. Alternatively, supply of image signals may be performed for every set of wirings SL.

Next, in a second frame period, an image is displayed by an operation similar to that of a first frame period. Thus, the image displayed on the pixel portion 21 is rewritten.

As the semiconductor of the transistors included in the pixels 52, a Group 14 element such as silicon or germanium, a compound semiconductor such as gallium arsenide, an organic semiconductor, a metal oxide, or the like can be used. Alternatively, the semiconductor may be a non-single-crystal semiconductor, amorphous semiconductor, microcrystalline semiconductor, or polycrystalline semiconductor) or a single crystal semiconductor.

Here, the transistors included in the pixels 52 preferably include an amorphous semiconductor, in particular, hydrogenated amorphous silicon (a-Si:H) in channel formation regions. Because the transistors including an amorphous semiconductor can be easily formed over a large-sized substrate, the manufacturing process of a large-screen display device which is compatible with 2K, 4K, or 8K broadcasting or the like can be simplified, for example. Furthermore, as described above, the display portion 20 according to one embodiment of the present invention can operate at high speed in the case where the pixel portion 21 is divided into the plurality of regions 51. For this reason, when the transistors provided in the pixels 52 include an amorphous semiconductor with which a high field-effect mobility is relatively difficult to obtain, the employment or the structure of the display portion 20 is especially effective.

Furthermore, the transistors included in the pixels 52 may be transistors including a metal oxide in channel formation regions, that is, OS transistors. Because OS transistors have an extremely low off-state current, in the case where OS transistors are used as the transistors Tr11 or Tr12, image signals can be held in the pixels 52 for a significantly long period. This enables the update frequency of an image signal to be extremely low in a period, when there is no change in the image displayed on the pixel portion 21 or a period when the change is at a certain level or lower. The update frequency of the image signal can be, for example, less than once every 0.1 seconds, less than once every second, or less than once every 10 seconds. In particular, when many pixels 52 are provided for 2K, 4K, or 8K broadcasting or the like, the low-frequency update of the image signal can effectively reduce the power consumption.

As described above, in one embodiment of the present invention, an image signal corrected using artificial intelligence can be supplied to the pixel portion 21 divided into the plurality of regions 51. This can compensate for the image discontinuity at the boundary between the regions 51, improving the high-resolution image quality.

This embodiment can be implemented in combination with any of the other embodiments as appropriate.

Embodiment 2

In this embodiment, another structure example of the display system described in the above embodiment will be described. Specifically, a structure in which the correction circuit 40 has functions of both an encoder and a decoder will be described.

Figure 17:
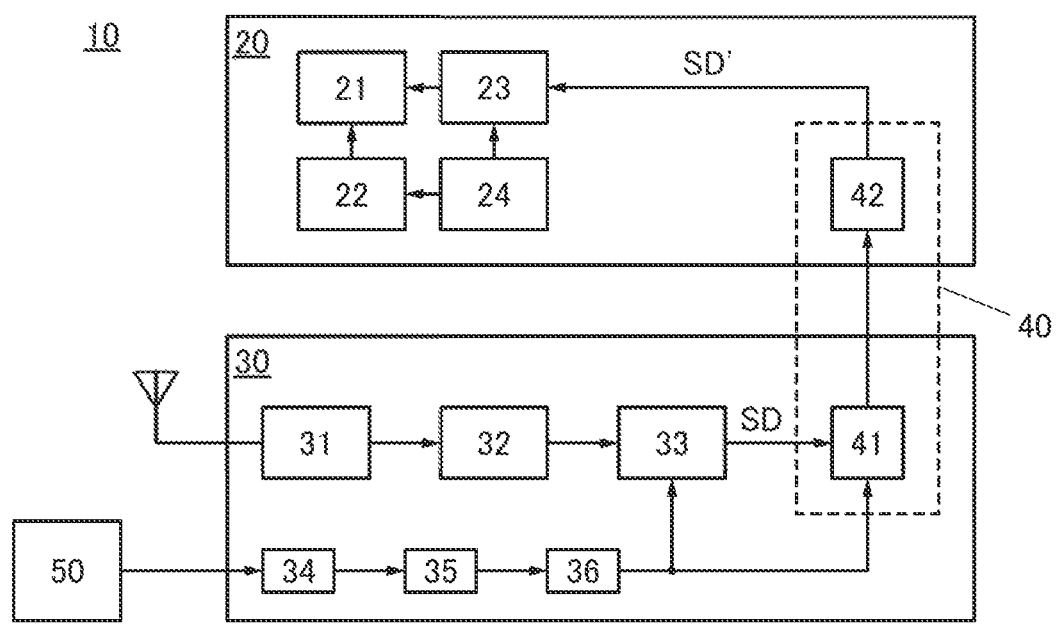
FIG. 17 illustrates a structure example of a display system.

The display system 10 illustrated in FIG. 17 is different from those in FIGS. 1A and 1B in that the correction circuit 40 is divided into an encoder 41 and a decoder 42. The encoder 41 is provided in the signal generation portion 30, and the decoder 42 is provided in the display portion 20. For the other points, the description of the display system 10 illustrated in FIGS. 1A and 1B can be referred to.

The encoder 41 has a function of extracting features of the image signal generated by the image processing circuit 33 and compressing the image signal. Furthermore, the decoder 42 has a function of decompressing the image signal that has been compressed by the encoder 41. That is, the correction circuit 40 has both the above-described function of correcting the image signal and a function of compressing and decompressing the image signal.

Here, an autoencoder can be formed by the encoder 41 and the decoder 42. In this case, the encoder 41 extracts features of the image signal by using the neural network and compresses the image signal. In addition, the decoder 42 decompresses the image signal that has been compressed by using the neural network.

Figure 18:
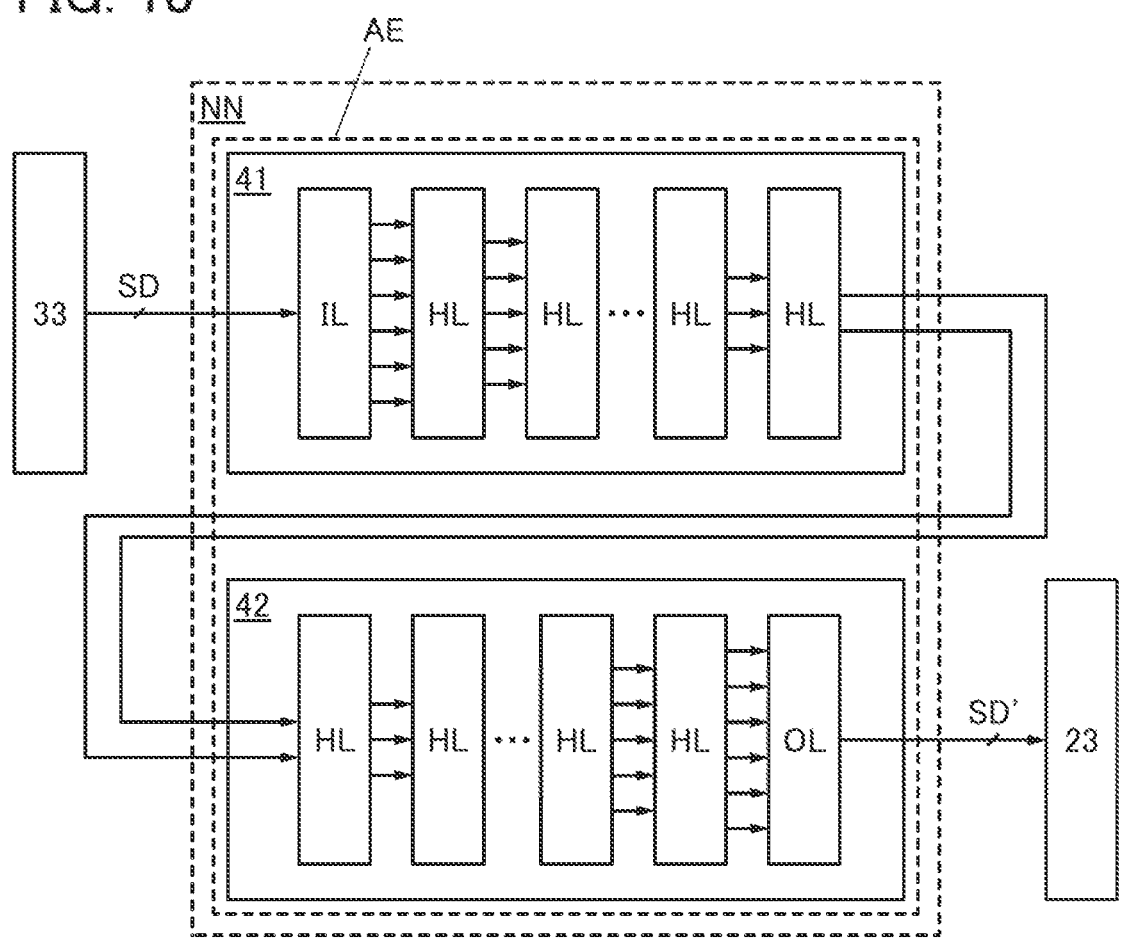
FIG. 18 illustrates a structure example of an autoencoder.

FIG. 18 illustrates a structure example of an autoencoder. By the neural network NN provided in the correction circuit 40, an autoencoder AE including the encoder 41 and the decoder 42 is formed. The signal SD generated by the image processing circuit 33 is output to the driver circuit 23 through the autoencoder AE. In this case, the neural network NN has both a function of a correction circuit which corrects the signal SD to the signal SD' and a function of the autoencoder AE.

The encoder 41 includes a neural network formed of an input layer IL and a plurality of middle layers HL. In the neural network in the encoder 41, the number of neurons decreases as the processing moves forward in the hierarchy. Note that as long as the number of outputs from the encoder 41 is smaller than the number of neurons in the input layer IL, a structure in which the number of neurons in a middle layer HL is larger than that in a previous middle layer HL can also be used.

The decoder 42 includes a neural network formed of an output layer OL and a plurality of middle layers HL. Contrary to the encoder 41, the decoder 42 includes the neural network in which the number of neurons increases as the processing moves forward in the hierarchy. Note that as long as the number of inputs to the encoder 42 is smaller than the number of neurons in the output layer OL, a structure in which the number of neurons in a middle layer HL is smaller than that in a previous middle layer HL can also be used.

Note that the number of middle layers HL included in the encoder 41 and the decoder 42 is not limited and may be determined as necessary.

The encoder 41 extracts features of an input image signal in accordance with the weight coefficient determined by learning. Simply speaking, the encoder 41 extracts the coordinates of three vertexes of a triangle as feature points from an image signal corresponding to a triangular image. In other words, the encoder 41 converts the triangular image into three pieces of coordinate data, thereby reducing the amount of data.

The decoder 42 demodulates the image signal using the data input from the encoder 41 in accordance with the weight coefficient determined by learning. The demodulated image signal has the same resolution as the image signal input to the encoder 41. In the above-described example, the decoder 42 generates an image signal corresponding to a triangular image from the three coordinate data.

The neural networks included in the encoder 41 and the decoder 42 can learn in the following manner: learning data is input to the autoencoder AE and the weight coefficient is updated so that the output from the autoencoder AE can become equal to the learning data. In other words, the neural networks can learn by way of unsupervised learning. Note that as the learning data, a part of the image signal is preferably used. Note that the learning can be performed by backpropagation or the like.

The learning of the neural networks included in the encoder 41 and the decoder 42 can be performed with a calculator having high processing properties or the like as described in Embodiment 1.

The display portion 20 and the signal generation portion 30 are connected with a cable such as flexible printed circuits (FPCs) in many cases. For example, in the case where a high-resolution image such as a 2K, 4K, or 8K image is displayed, many image signals are transmitted from the signal generation portion 30 to the display portion 20; however, the transmission takes time in some cases owing to the physical limit on the number of wirings in the FPCs. Moreover, as the display portion 20 becomes larger in size, the physical length of the cable connecting the display portion 20 and the signal generation portion 30 becomes longer, increasing the transmission loss of the image signal.

Here, by using the structure illustrated in FIG. 17, an image signal is transmitted from the signal generation portion 30 to the display portion 20 in the compressed state. Thus, high speed transmission of the image signal can be achieved. Furthermore, the power needed to transmit the image signal can be reduced.

Note that the image signal input to the encoder 41 and the image signal output from the decoder 42 may have different resolutions. For example, the resolution of image signals for a program which does not discontent viewers even when the image quality is somewhat low, such as animation for children or news programs, may be intentionally decreased. In such a case, the image data output from the decoder 42 has a lower resolution than the image data input to the encoder 41. Thus, power consumption in the display portion 20 can be reduced.

Thus, dividing the correction circuit 40 into the encoder 41 and the decoder 42 enables the compression and decompression of the image signal as well as the correction of the image signal.

This embodiment can be implemented in combination with any of the other embodiments as appropriate.

Embodiment 3

In this embodiment, another structure example of the display portion described in the above embodiment will be described.

Figure 19:
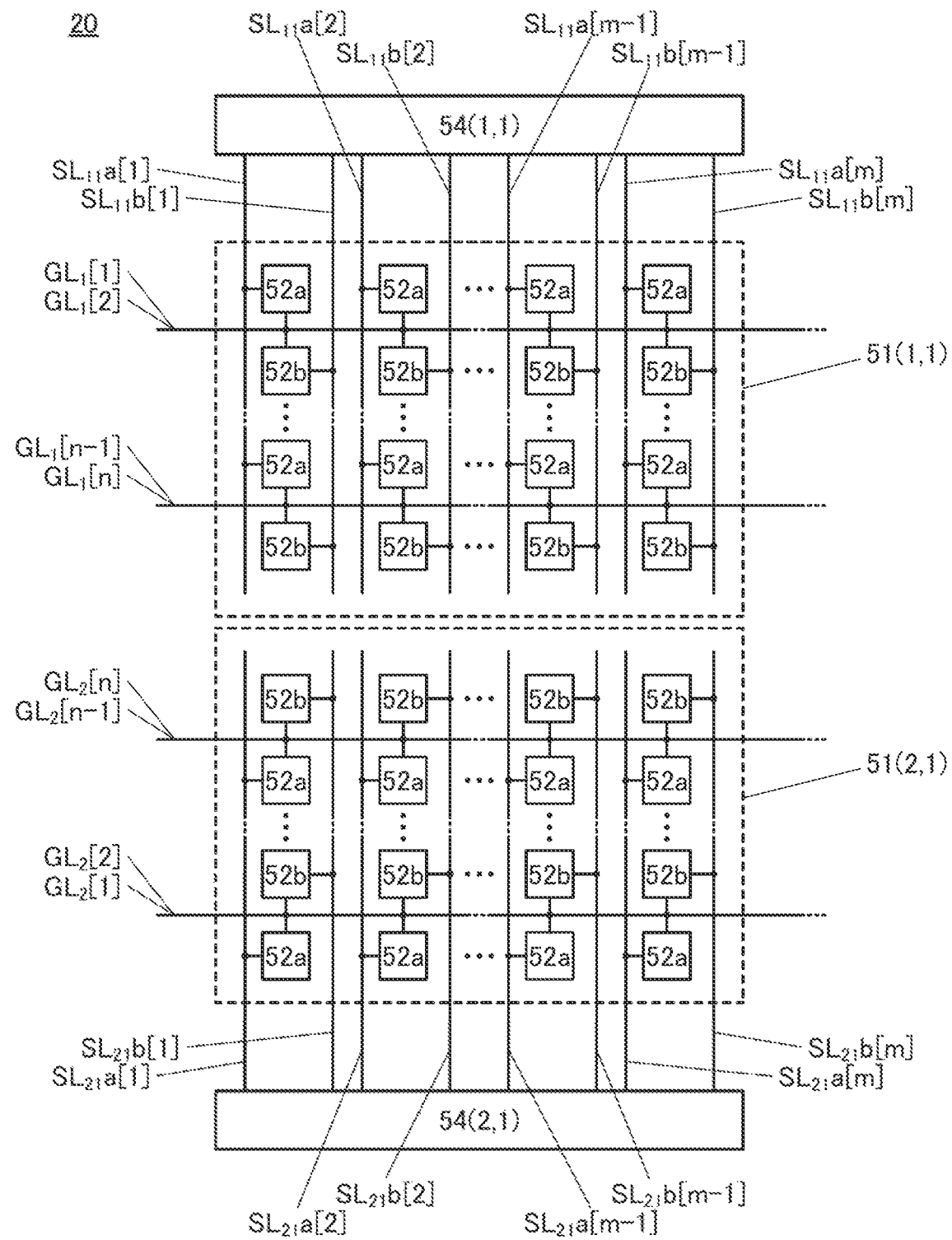
FIG. 19 illustrates a structure example of a display portion.

FIG. 19 illustrates another structure example of the display portion 20. The display portion 20 illustrated in FIG. 19 is different from that in FIG. 2 in that the number of wirings SL is an integral multiple of the number of columns of the pixels 52 (2m×L; L is an integer of 2 or more). Here, as an example, a structure in which the number of wirings SL is twice the number of columns of the pixels 52 (L=2) will be described. Although FIG. 19 illustrates the regions 51(1, 1) and 51(2, 1) as a typical example, the same structure can also be used for the other regions 51.

The display portion 20 includes 2m wirings SLa ($SL_{11}a$[1] to $SL_{11}a$[m] and $SL_{21}a$[1] to $SL_{21}a$[m]) and 2m wirings $SL_{11}b$[1] to $SL_{21}b$[m] and $SL_{21}b$[1] to $SL_{21}b$[m]). Each of the pixels 52 is connected to, one of the wiring SLa or the wiring SLb. In the structure example of FIG. 19, the pixels 52a belonging to odd-numbered rows are connected to the wirings SLa and the pixels 52b belonging to even-numbered rows are connected to the wirings SLb.

Image signals are supplied from different wirings SL to the pixels 52a and 52b. Therefore, selection signals can be simultaneously supplied to the pixels 52a and 52b. For example, in FIG. 19, selection signals can be simultaneously supplied to the wirings $GL_1$[1] and $GL_1$[2], the wirings $GL_1$[n−1] and $GL_1$[n], the wirings $GL_2$[1] and $GL_2$[2], and the wirings $GL_2$[n−1] and $GL_2$[n]. Thus, the scan period of the wirings GL can be shortened, improving the operating speed of the display portion 20.

Note that the wirings GL to which the selection signals are simultaneously supplied can be shared. In FIG. 19, the wirings $GL_1$[1] and $GL_1$[2], the wirings $GL_1$[n−1] and $GL_1$[n], the wirings $GL_2$[1] and $GL_2$[2], and the wirings $GL_2$[n−1] and $GL_2$[n] are each shared. Thus, the number of wirings GL can be reduced, and accordingly the area of the display portion 20 can be reduced.

Although the example in which the number of wirings SL is twice the number of columns of the pixels 52 (L=2) has been described here, L may be 3 or more. In that case, selection signals can be simultaneously supplied to L wirings GL. In addition, a structure in which the L wirings GL are shared can be used.

In particular, when an amorphous semiconductor is used as the semiconductor of transistors included in the pixels 52, the structure illustrated in FIG. 19 is preferably used to maintain a high-speed operation of the display portion 20.

This embodiment can be implemented in combination with any of the other embodiments as appropriate.

Embodiment 4

In this embodiment, structure examples of a display device that can be used for the display portion described in the above embodiments are described.

Structure Example 1

Figure 20:
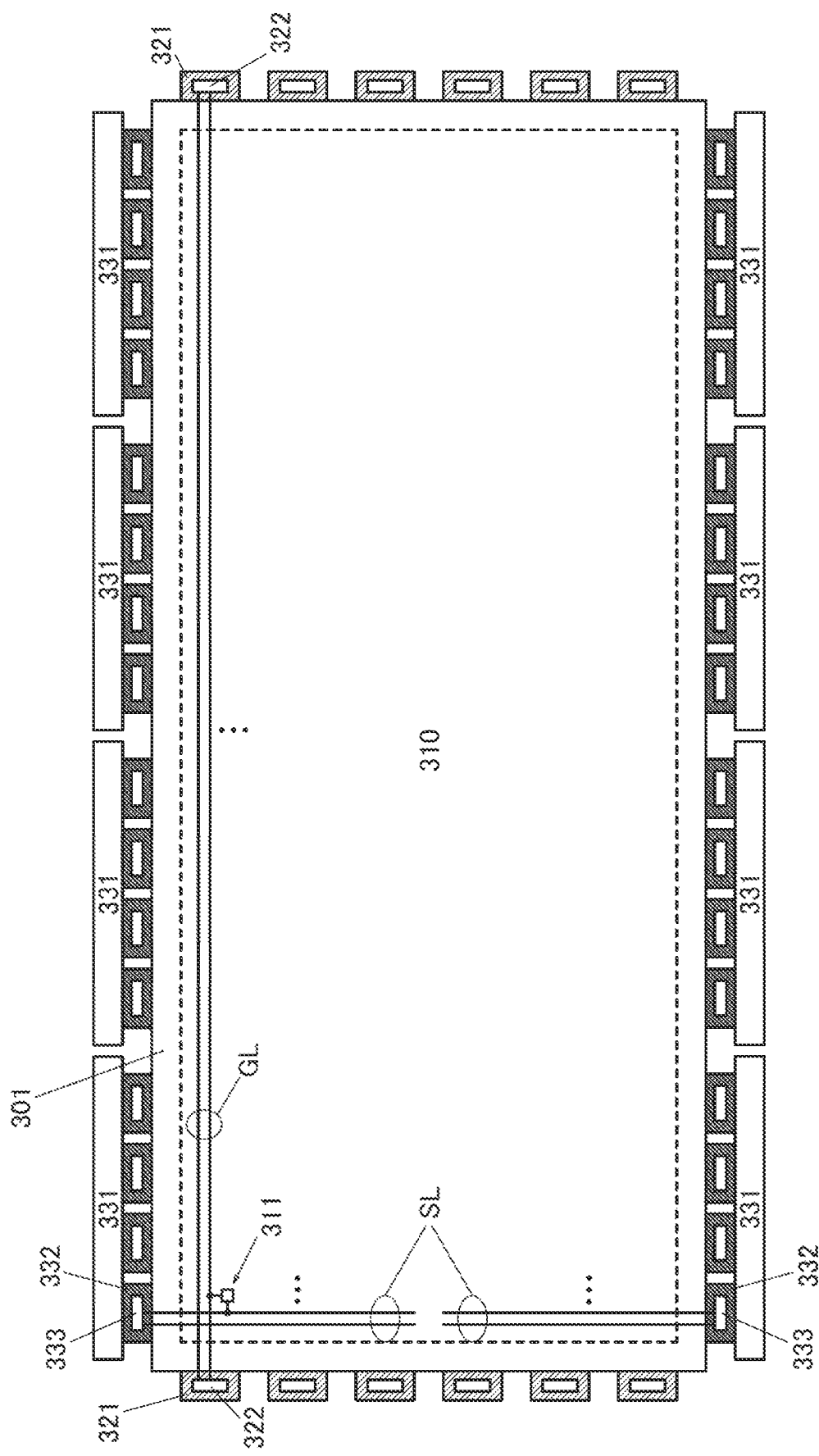
FIG. 20 illustrates a structure example of a display device.

FIG. 20 illustrates a structure example of a display device. A display device 300 includes a display portion 310 provided over a substrate 301. The display portion 310 includes a plurality of pixels 311 connected to the wirings GL and the wirings SL. Note that the display portion 310 corresponds to the pixel portion 21 in FIGS. 1A and 1B.

Furthermore, the display device 300 is provided with a plurality of tape automated bonding (TAB) tapes 321. Integrated circuits 322 are mounted on the TAB tapes 321, and the driver circuit 22 FIGS. 1A and 1B is formed in each of the integrated circuits 322. The integrated circuits 322 are connected to the plurality of wirings GL and configured to supply selection signals to the wirings GL.

Furthermore, the display device 300 is provided with a plurality of printed boards 331 and plurality of TAB tapes 332. The primed boards 331 are each connected to the plurality of TAB tapes 332 and configured to distribute signals input from the outside to the TAB tapes 332. Moreover, integrated circuits 333 are mounted on the TAB tapes 332, and the driver circuit 23 in FIGS. 1A and 1B is formed in each of the integrated circuits 333. The integrated circuits 333 are connected to the plurality of wirings SL and configured to supply selection signals to the wirings SL.

In the case where a large-sized display panel which is compatible with 2K or 8K broadcasting or the like is formed, the display panel is preferably provided with the plurality of printed boards 331 as illustrated in FIG. 20. Accordingly, input of image data to the display device 300 is facilitated.

Note that the integrated circuits 322 and the integrated circuits 333 can also be provided over the substrate 301 by a chip on glass (COG) method, a chip on film (COF) method, or the like.

As illustrated in FIG. 20, it is preferable that the driver circuits 22, the driver circuits 23, and the like be separately formed using the integrated circuits 322 and the integrated circuits 333 in the case where an amorphous semiconductor is used in a transistor included in the pixel 311. Such a structure can improve the operation speed.

In the case where an OS transistor is used as transistor included in the pixel 311, an OS transistor included in the driver circuit 22 or the like can be formed over the substrate 301 at the same time. Since an OS transistor has a high field-effect mobility, the driver circuit 22 or the like can be formed using an OS transistor. In this case, a structure not provided with the integrated circuits 322 can be employed.

Structure Example 2

Figure 21:
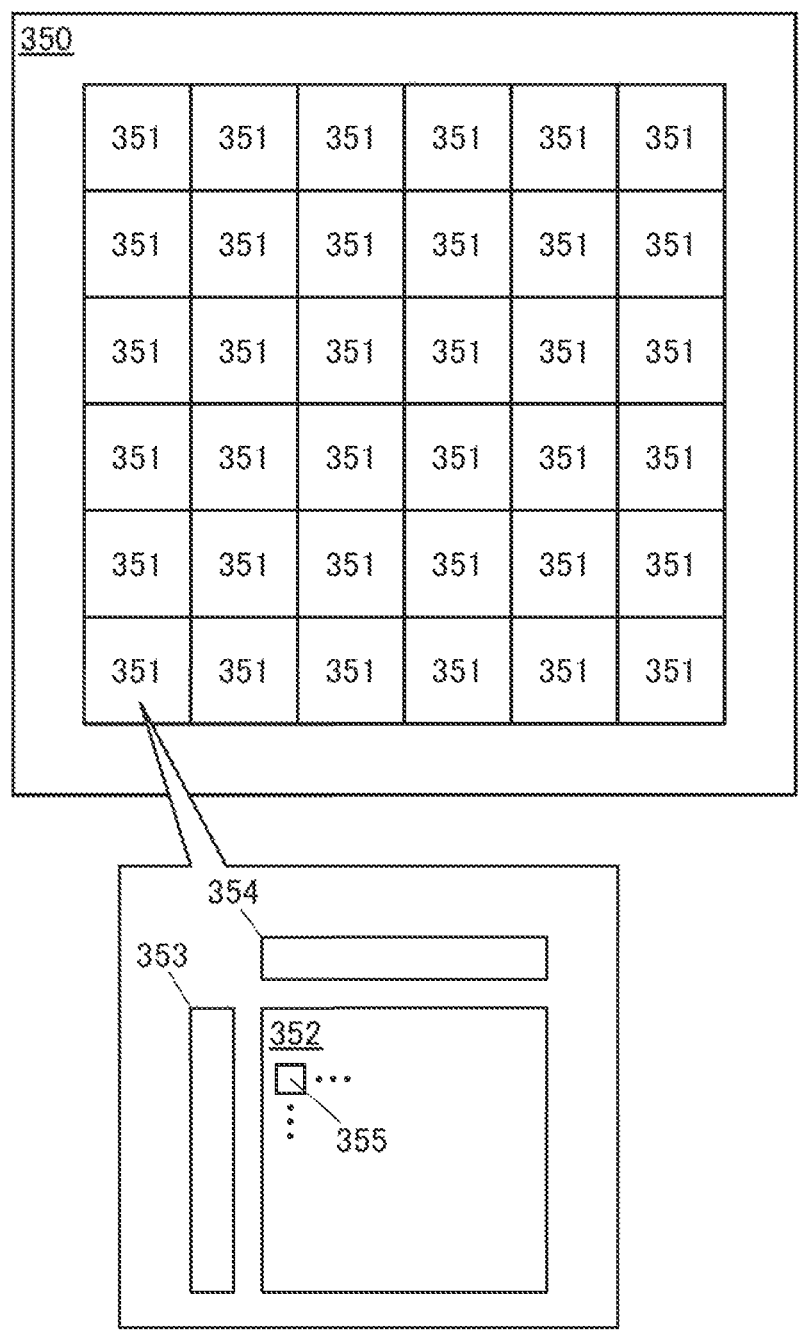
FIG. 21 illustrates a structure example of a display device.

Next, a display device formed of a plurality of display panels will be described. FIG. 21 illustrates a structure example of a display device 350 in which a plurality of display panels 351 are arranged in a matrix. Although 36 display panels 351 are provided in a matrix of six rows and six columns in the example illustrated in FIG. 21, the number of display panels 351 can be determined freely. The display panels 351 can be controlled independent of each other.

The display device 350 can display one image using the plurality of display panels 351. Thus, an image display region of the display device 350 can be enlarged. Since the display device 350 includes the plurality of display panels 351, the individual display panels 351 are not required to be large. Thus, an apparatus for manufacturing the display panel does not need to be increased in size, whereby space-saving can be achieved. In addition, since an apparatus for manufacturing small- and medium-size display panels can be used, there is no need to prepare another manufacturing apparatus for a large-size display device, which leads to a reduction in manufacturing cost. In addition, a decrease in yield caused by an increase in the size of a display panel can be suppressed.

Each of the display panels 351 includes a pixel portion 352, a driver circuit 353, and a driver circuit 354. For the structures and functions of the pixel portion 352, the driver circuit 353, and the driver circuit 354, the description of the pixel portion 21, the driver circuit 22, and the driver circuit 23 in FIGS. 1A and 1B can be referred to. Moreover, the pixel portion 352 includes a plurality of pixels 355. For the structure and the function of the pixels 355, the description of the pixels 52 in FIG. 2 can be referred to. Note that the driver circuit 353 and the driver circuit 554 may be provided outside the display panel 351.

Figure 22A:
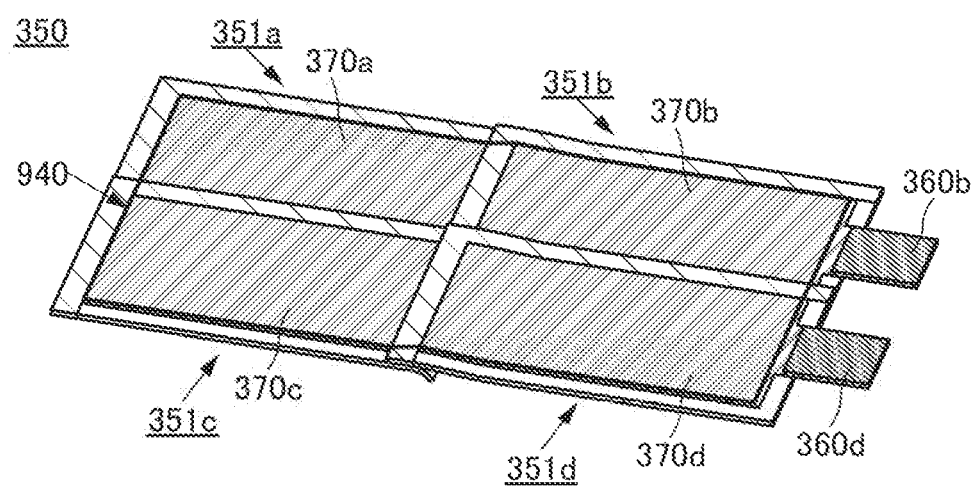
FIGS. 22A and 22B illustrate a structure example of a display device.
Figure 22B:
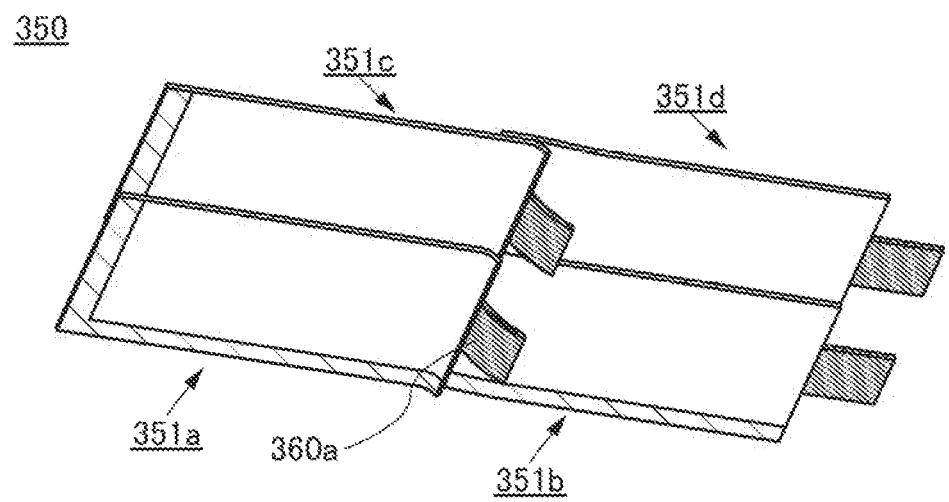

FIG. 22A is a perspective view illustrating a display surface side of the display device 350. FIG. 22B is a perspective view illustrating the side opposite from the display surface side of the display device 350. Note that FIGS. 22A and 22B illustrate adjacent four display panels 351a, 351b, 351c, and 351d as a typical example. The display panels 351 illustrated in FIGS. 22A and 22B are each connected to their respective FPCs.

The display panel 351 tray is flexible. When the flexible display panels 351 are used, as illustrated in FIGS. 22A and 22B, a region near an FPC 360a connected to the display panel 351a can be bent so that part of the display panel 351a and part of the FPC 360a can be placed under the display region 370b of the display panel 351b adjacent to the FPC 360a. As a result, the FPC 360a can be placed without physical interference with the rear surface of the display panel 351b.

Moreover, each display panel 351 is made flexible, in which case the display panel 351b can be curved gently so that the top surface of the display region 370b of the display panel 351b and the top surface of the display region 370a of the display panel 351a are leveled. Thus, the display regions can be leveled except the vicinity of a region where the display panel 351a and the display panel 351b overlap with each other.

Although, the relation between the display panel 351a and the display panel 351b is taken as an example in, the above description, the same can apply to the relation between any other two adjacent display panels.

Furthermore, to reduce the step between the adjacent panels 351, the thickness of the display panel 351 is preferably small. For example, the thickness of the display panel 351 is preferably less than or equal to 1 mm further preferably less than or equal to 300 μm, still further preferably less than or equal to 100 μm. The display panel is preferably thin because the thickness or weight of the whole display device can also be reduced.

The display device 350 can display an image on a display region 940 including the plurality of display regions 370.

Here, image signals are supplied to the display panels 351 from different driver circuits 354 from each other. Therefore, at junctions of the display panels 351 (regions where the pixels 355 of different display panels 351 are adjacent), an error occurs in image signals owing to variations in characteristics between the display panels 351, so that a discontinuous image is produced. The variations in characteristics between the display panels 351 are, for example, variations in characteristics in transistors or capacitors included in the pixels 355, variations in parasitic resistance or parasitic capacitance that is added to the wirings, and variations in drive capability between the driver circuits 354.

Here, by correcting the image signals supplied to the display panels 351 by using the neural network in a manner similar to that of Embodiment 1, image discontinuity in the vicinity of the junctions of the display panels 351 can be reduced. Thus, the correction of images in one embodiment of the present invention is effective in the display device 350 that is formed of the plurality of display panels 351.

This embodiment can be implemented in combination with any of the other embodiments as appropriate.

Embodiment 5

In this embodiment, specific structure examples of a display device that can be used in the display portions described in the above embodiments will be described. In particular, a display device including a liquid crystal element as a display element will be described here.

Structure Example 1 of Display Device

Figure 23:
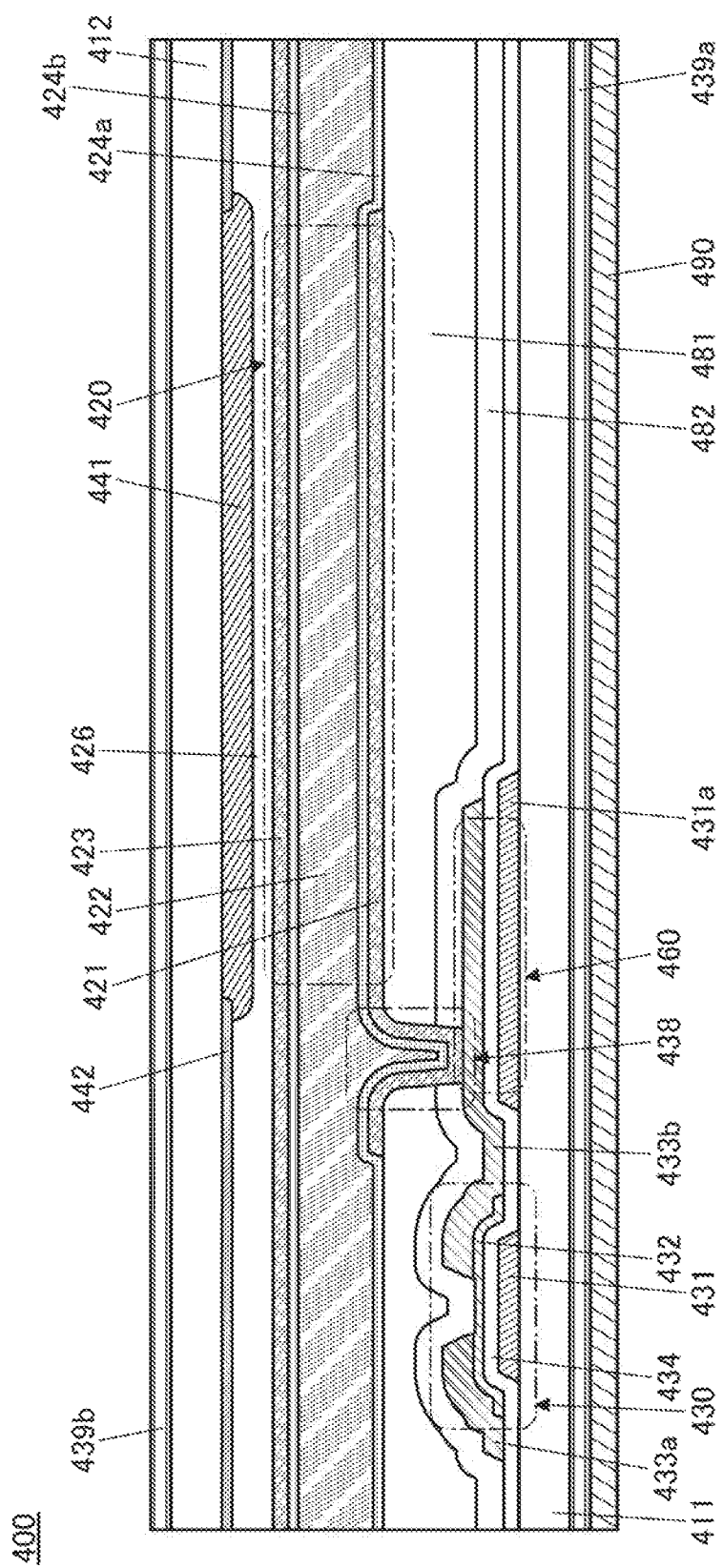
FIG. 23 illustrates a structure example of a display device.

FIG. 23 illustrates an example of a cross-sectional structure of a display device 400. Here, an example where a transmissive liquid crystal element 420 is used as a display element is shown. In FIG. 23, the substrate 412 side is the display surface side.

In the display device 400, a liquid crystal layer 422 is provided between a substrate 411 and the substrate 412. The liquid crystal element 420 includes a conductive layer 421 provided on the substrate 411 side, a conductive layer 423 provided on the substrate 412 side, and the liquid crystal layer 422 provided between the conductive layers 421 and 423. Furthermore, an alignment film 424a is provided, between the liquid crystal layer 422 and the conductive layer 421 and an alignment film 424b is provided between the liquid crystal layer 422 and the conductive layer 423.

The conductive layer 421 functions as a pixel electrode. The conductive layer 423 functions as a common electrode or the like. The conductive layer 421 and the conductive layer 423 each have a function of transmitting visible light. Thus, the liquid crystal element 420 is a transmissive liquid crystal element.

A coloring layer 441 and a light-blocking layer 442 are provided on a surface of the substrate 412 on the substrate 411 side. An insulating layer 426 is provided to cover the coloring layer 441 and the light-blocking layer 442, and the conductive layer 423 is provided to cover the insulating layer 426. Furthermore, the coloring layer 441 is provided in a region overlapping with the conductive layer 421. The light-blocking layer 441 is provided in a region overlapping with a transistor 430 and a connection portion 438.

A polarizing plate 439a is located outward from the substrate 411, and a polarizing plate 439b is located outward from the substrate 412. Furthermore, a backlight unit 490 is located outward from the polarizing plate 439a. The display surface of the display device 400 illustrated in FIG. 23 is on the substrate 412 side.

Over the substrate 411, a semiconductor layer, the transistor 430, a capacitor 460, and the like are provided. The transistor 430 functions as a selection transistor for a pixel. The transistor 43 connected to the liquid crystal element 420 through the connection portion 438.

The transistor 430 illustrated in FIG. 23 is what is called a channel-etched bottom-gate transistor. The transistor 430 includes a conductive layer 431 functioning as a gate electrode, an insulating layer 434 functioning as a gate insulating layer, a semiconductor layer 432, and a pair of conductive layers 433a and 433b functioning as a source electrode and a drain electrode. A region of the semiconductor layer 432 overlapping with the conductive layer 431 functions as a channel formation region. The semiconductor layer 432 is connected to the conductive layers 433a and 433b.

The capacitor 460 is formed of a conductive layer 431a, the insulating layer 434, and the conductive layer 433b.

An insulating layer 482 and an insulating layer 481 are stacked to cover the transistor 430 and the like. The conductive layer 421 functioning as a pixel electrode is provided over the insulating layer 481. In the connection portion 438, the conductive layer 421 is electrically connected to the conductive layer 433b through an opening in the insulating layers 481 and 482. The insulating layer 481 preferably functions as a planarization layer. The insulating layer 482 preferably functions as a protective film that inhibits diffusion of impurities or the like to the transistor 430 and the like. The insulating layer 482 can be thrilled using an inorganic insulating material, and the insulating layer 481 can be formed using an organic insulating material, for example.

Structure Example 2 of Display Device

Figure 24:
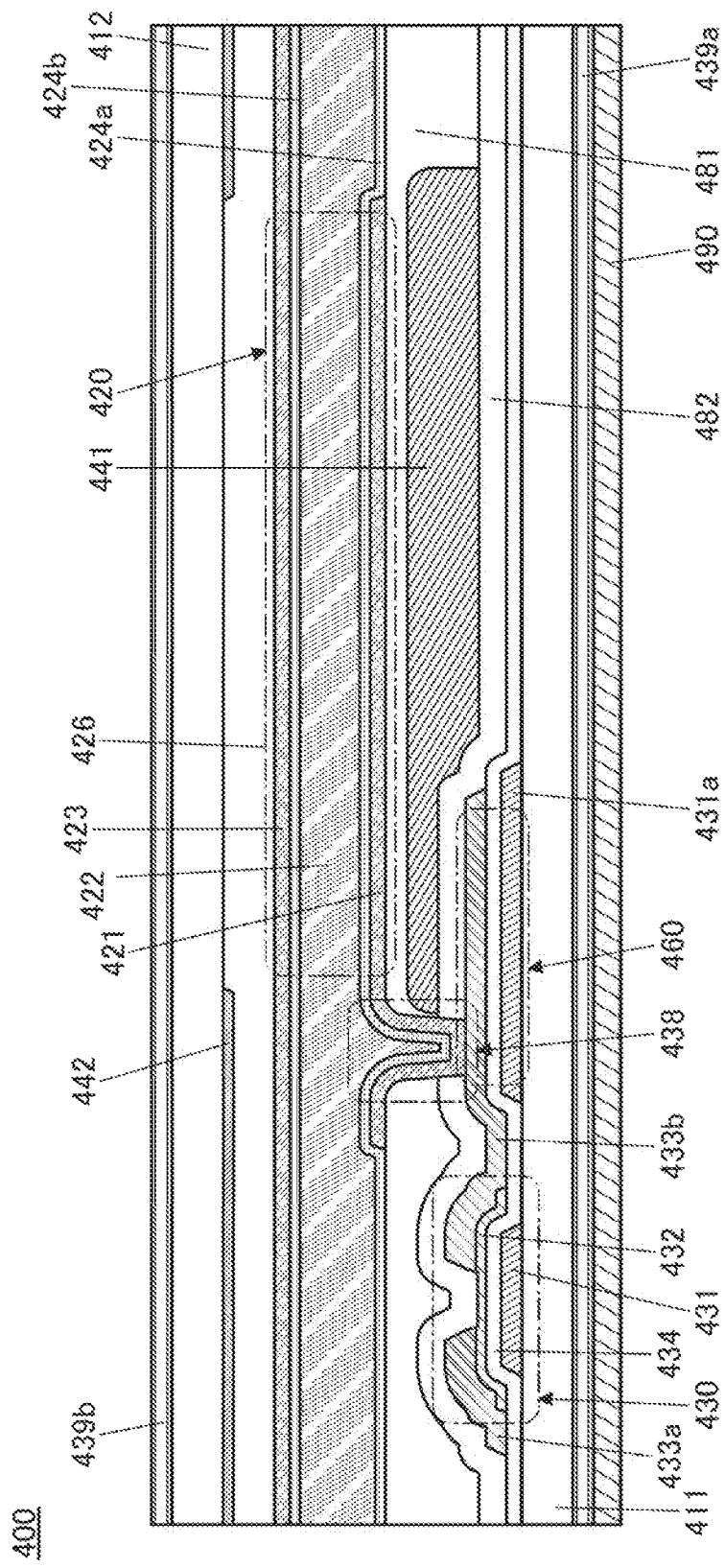
FIG. 24 illustrates a structure example of a display device.

FIG. 24 illustrates an example where the coloring layer 441 is provided the substrate 411 side. Thus, the structure on the substrate 412 side can be simplified.

Note that in the case where the coloring layer 441 is used as a planarization film, the insulating layer 481 is not necessarily provided.

Structure Example 3 of Display Device

In each of the above examples, a vertical electric field mode liquid crystal element in which a pair of electrodes is provided over and under a liquid crystal layer is used as the liquid crystal element: the structure of the liquid crystal element is not limited thereto and any of a variety of liquid crystal elements can be used.

Figure 25:
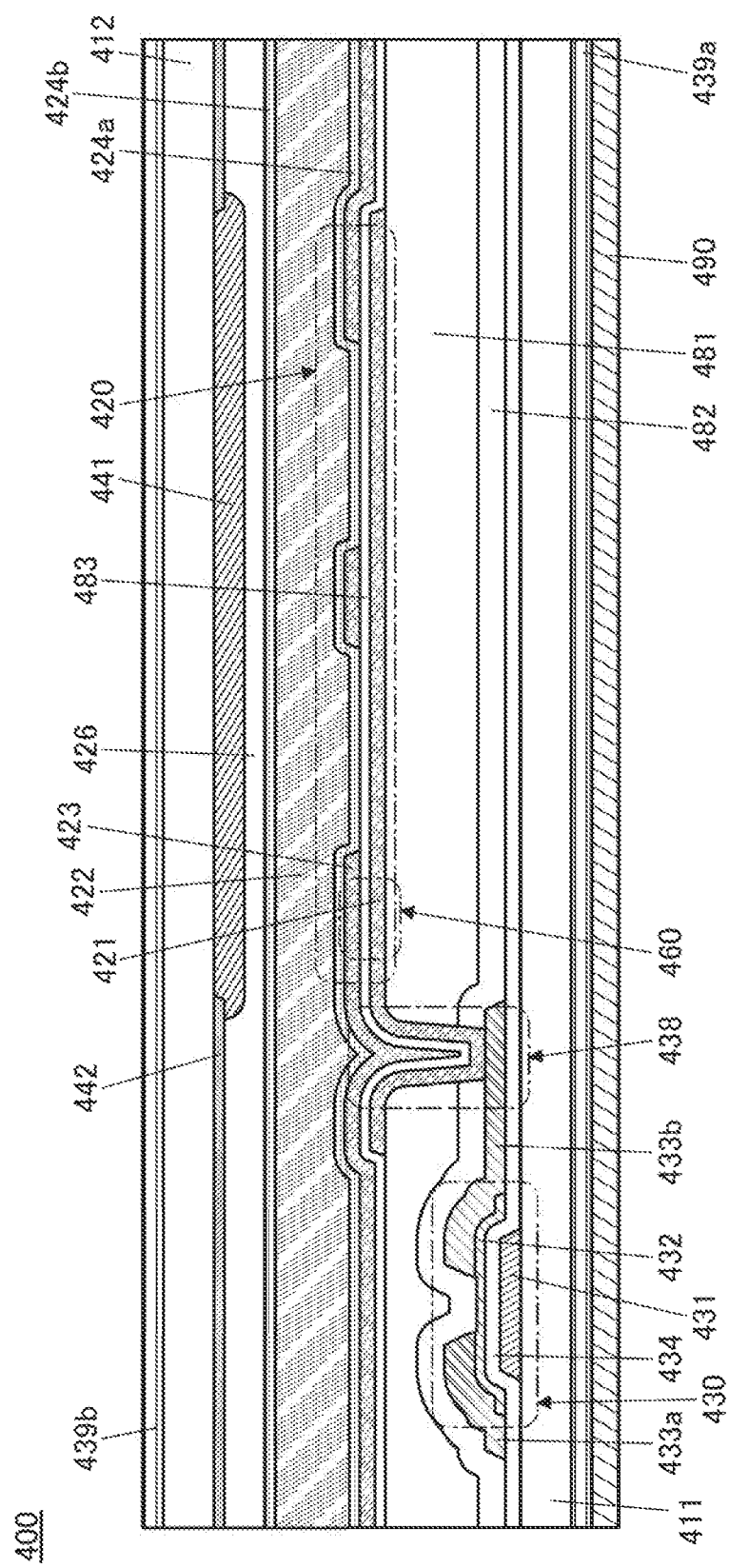
FIG. 25 illustrates a structure example of a display device.

FIG. 25 is a schematic cross-sectional view of a display device including a liquid crystal element using a fringe field switching (FFS) mode.

The liquid crystal element 420 includes the conductive layer 421 functioning as a pixel electrode and the conductive layer 423 overlapping with the conductive layer 421 with an insulating layer 483 provided therebetween. The conductive layer 423 has a slit-like or comb-like top surface.

In such a structure, a capacitor, which can be used as the capacitor 460, is formed in a region where the conductive layer 421 and the conductive layer 423 overlap with each other. Thus, the area occupied by the pixel can be reduced, leading to a high-resolution display device. Accordingly, the aperture ratio can be improved.

Figure 26:
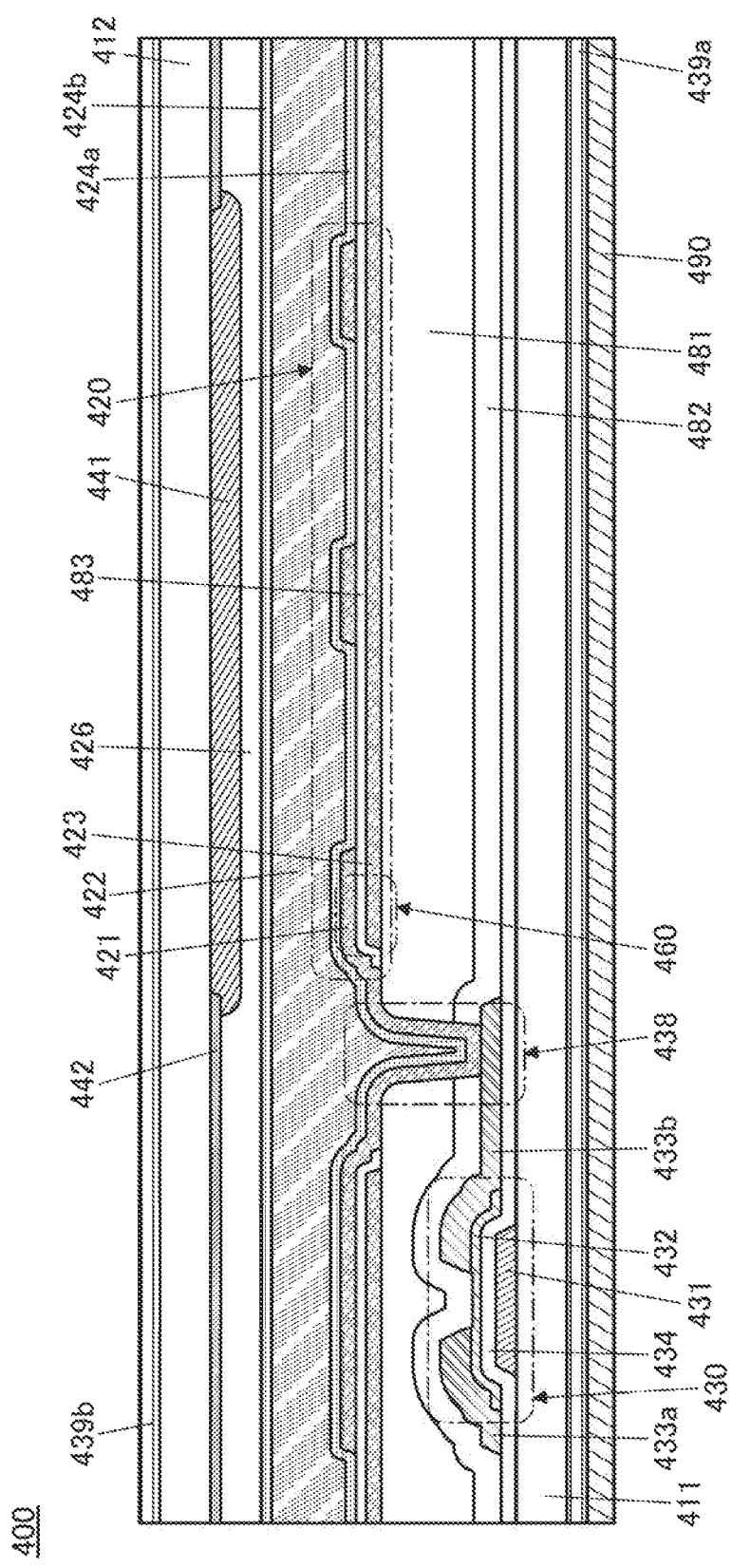
FIG. 26 illustrates a structure example of a display device.

Although a structure in which the conductive layer 423 functioning as it common electrode is positioned between the liquid crystal layer 422 and the conductive layer 421 functioning as a pixel electrode is illustrated in FIG. 25, a structure illustrated in FIG. 26 in which the conductive layer 421 is positioned between the liquid crystal layer 422 and the conductive layer 423 may also be used. In this case, the conductive layer 421 has a slit-like or comb-like top surface.

Here, the smaller the number of photolithography steps in a manufacturing process of a display device is, i.e., the smaller the number of photomasks is, the lower the manufacturing cost can be.

For example, the display device having the structure illustrated in FIG. 23 can be manufactured through five photolithography steps, i.e., a formation step of the conductive layer 431 and the like, a formation step of the semiconductor layer 432, a formation step of the conductive layer 433a and the like, a formation step of the opening to be the connection portion 438, and a formation step of the conductive layer 421, among steps on the substrate 411 side. That is, a back plane substrate can be manufactured with five photomasks. On the substrate 412 (counter substrate) side, an ink-jet method, a screen printing method, or the like is preferably used as the formation methods of the coloring layer 441 and the light-blocking layer 442, in which case a photomask becomes unnecessary. For example, in the case where the three-color coloring layers 441 and the light-blocking layer 442 are provided, four photomasks can be reduced compared with the case where these are formed by a photolithography process.

Structure Example 1 of Transistor

Next, a specific structure example of the transistor 430 will be described. A semiconductor containing silicon can be used for the semiconductor layer 432 of the transistor described below. For example, hydrogenated amorphous silicon, microcrystalline silicon, polycrystalline silicon, or the like be used as the semiconductor containing silicon. Hydrogenated amorphous silicon is particularly preferable because it can be formed over a large substrate with a high yield. A display device of this embodiment can perform favorable display even with a transistor including amorphous silicon having relatively low field-effect mobility.

Figure 27A:
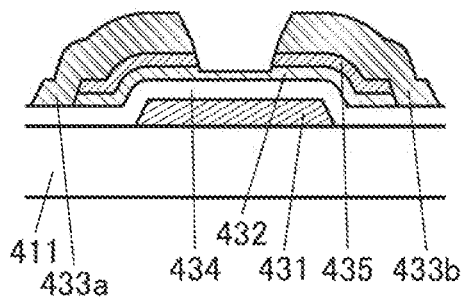
FIGS. 27A to 27D each illustrate a structure example of a transistor.

A transistor illustrated in FIG. 27A includes a pair of impurity semiconductor layers 435 functioning as a source region and a drain region. The impurity semiconductor layers 435 are provided between the semiconductor layer 432 and the conductive layer 433a and between the semiconductor layer 432 and the conductive layer 433b. The semiconductor layer 432 and the impurity semiconductor layers 435 are provided in contact with each other. The impurity semiconductor layer 435 is provided in contact with the conductive layer 433a or the conductive layer 433b.

The impurity semiconductor film to form the impurity semiconductor layer 435 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Note that the impurity semiconductor layer may be formed using an amorphous semiconductor or a crystalline semiconductor such as a microcrystalline semiconductor.

Figure 27B:
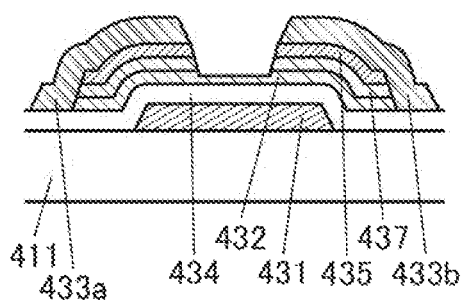

A transistor illustrated in FIG. 27B includes a semiconductor 437 between the semiconductor layer 432 and the impurity semiconductor layer 435.

The semiconductor layer 437 may be formed using the same semiconductor film as the semiconductor layer 432. The semiconductor layer 437 can function as an etching stopper for preventing the semiconductor layer 432 from being removed at the time of etching for forming the impurity semiconductor layer 435. Although FIG. 27A illustrates an example where the semiconductor layer 437 is divided into a right portion and a left portion, part of the semiconductor layer 437 may cover a channel formation region of the semiconductor layer 432.

Furthermore, the concentration of an impurity contained in the semiconductor layer 437 may be lower than that contained in the impurity semiconductor layer 435. Thus, the semiconductor layer 437 can function as a lightly doped drain (LDD) region and can suppress hot carrier degradation when the transistor is driven.

Figure 27C:
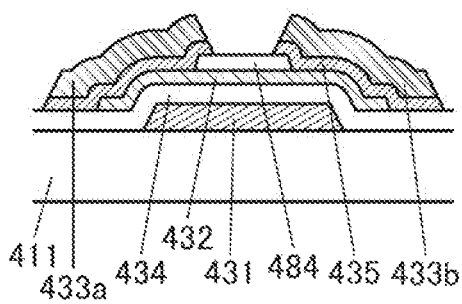

In a transistor illustrated in FIG. 27C, the insulating layer 484 is provided over a channel formation region of the semiconductor layer 432. The insulating layer 484 functions as an etching stopper at the time of etching for forming the impurity semiconductor layers 435.

Figure 27D:
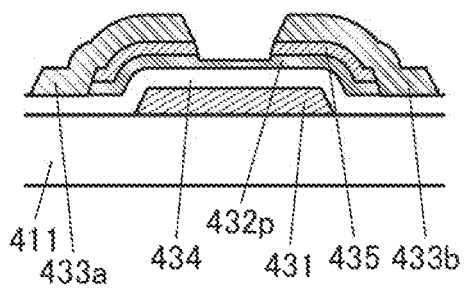

A transistor illustrated in FIG. 27D includes a semiconductor layer 432p instead of the semiconductor layer 432. The semiconductor layer 432p includes a semiconductor film having high crystallinity. For example, the semiconductor layer 432p includes a polycrystalline semiconductor or a single crystal semiconductor. Thus, a transistor having high field-effect mobility can be provided.

Figure 27E:
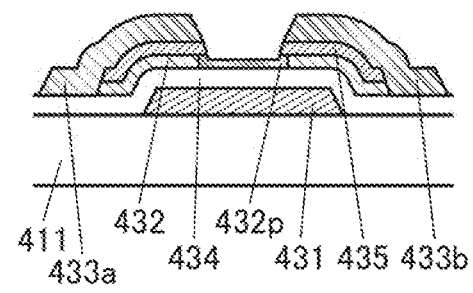

A transistor illustrated in FIG. 27E includes: the semiconductor layer 432p in a channel formation region of the semiconductor layer 432. For example, the transistor illustrated in FIG. 27E can be formed by irradiating a semiconductor film to be the semiconductor layer 432 with laser light or the like so that the semiconductor film is crystallized locally. Thus, a transistor having high field-effect mobility can be provided.

Figure 27F:
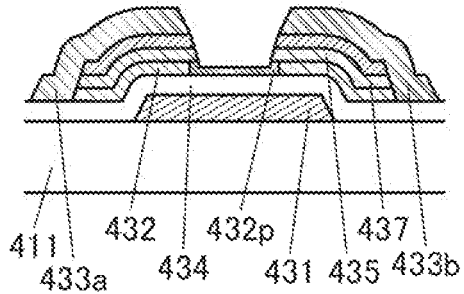

A transistor illustrated in FIG. 27F includes the semiconductor layer 432p having crystallinity in a channel formation region of the semiconductor layer 432 of the transistor illustrated in FIG. 27B.

Figure 27G:
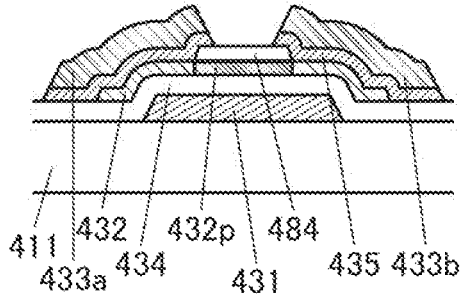

A transistor illustrated in FIG. 27G includes the semiconductor layer 432p having crystallinity in a channel formation region of the semiconductor layer 432 of the transistor illustrated in FIG. 27C.

Structure Example 2 of Transistor

Next, another structure example of the transistor 430 will be described. An OS transistor can be formed by using a metal oxide as the semiconductor layer 432 of the transistor described below. When an OS transistor is used, the update frequency of an image signal can be set to be extremely low in a period when there is no change in the image or a period when the change is at a certain level or lower accordingly, power consumption can e reduced.

Figure 28A:
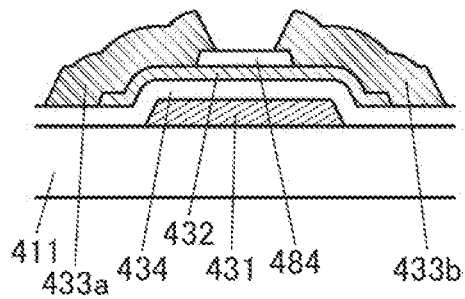
FIGS. 28A to 28E each illustrate a structure example of a transistor.

In a transistor illustrated in FIG. 28A, the insulating layer 484 is provided over a channel formation region of the semiconductor layer 432. The insulating layer 484 functions as an etching stopper at the time of etching the conductive layer 433a and the conductive layer 433b.

Figure 28B:
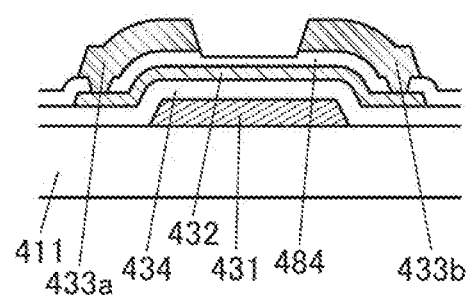

A transistor illustrated in FIG. 28B has a structure in which the insulating layer 484 is provided over the insulating layer 434 while covering the semiconductor layer 432. In this case, the conductive layer 433a and the conductive layer 433b are connected to the semiconductor layer 432 through openings provided in the insulating layer 484.

Figure 28C:
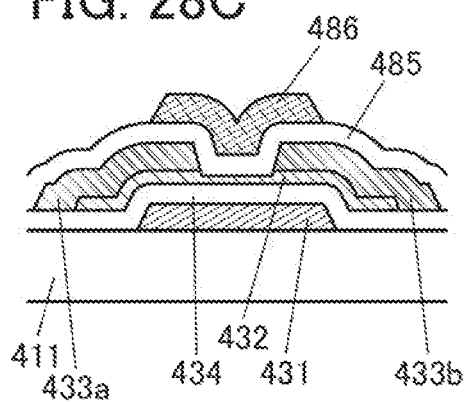

A transistor illustrated in FIG. 28C includes an insulating layer 485 and a conductive layer 486. The insulating layer 485 is provided so as to cover the semiconductor layer 432, the conductive layer 433a, and the conductive layer 433b. Furthermore, conductive layer 486 is provided over the insulating layer 485 and has a region overlapping with the semiconductor layer 432.

The conductive, layer 486 is positioned to lace the conductive layer 431 with the semiconductor layer 432 therebetween. In the case where the conductive layer 431 is used as a first gate electrode, the conductive layer 486 can serve as a second gate electrode. By supplying the same potential to the conductive layers 431 and 486, the on-state current of the transistor can be increased. When a potential for controlling the threshold voltage is supplied to one of the conductive layers 431 and 486 and a potential for driving is supplied to the other, the threshold voltage of the transistor can be controlled.

Figure 28D:
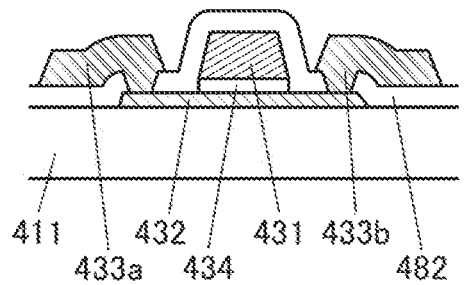

A transistor illustrated in FIG. 28D is a top-gate transistor, and the conductive layer 431 serving as a gate electrode is provided on the top side of the semiconductor layer 432 (opposite side from the substrate 411 side of the semiconductor layer 432). The insulating layer 434 and the conductive layer 431 are stacked over the semiconductor layer 432. The insulating layer 482 is provided so as to cover the conductive layer 431 and a top surface and an edge portion of the semiconductor layer 432. The conductive layers 433a and 433b are provided over the insulating layer 482. The conductive layers 433a and 433b are connected to the semiconductor layer 432 through openings provided in the insulating layer 482.

Note that although the insulating layer 434 is not present in a portion that does not overlap with the conductive layer 431 in this example, the insulating layer 434 may be provided to cover the top surface and the edge portion of the semiconductor layer 432.

In the transistor illustrated in FIG. 28D, the physical distance between the conductive layer 431 and the conductive layer 433a or 433b can be easily increased, so that the parasitic capacitance therebetween can be reduced.

Figure 28E:
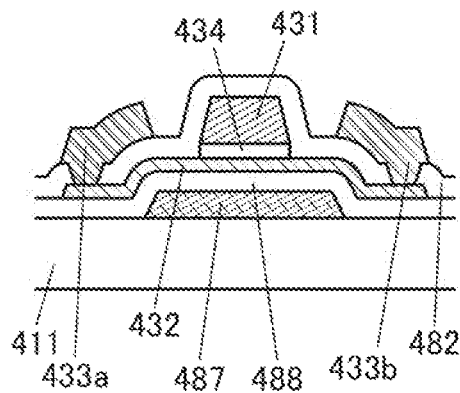

A transistor illustrated in FIG. 28E is different from the transistor illustrated in FIG. 28D in including a conductive layer 487 and an insulating layer 488. The conductive layer 487 includes a region overlapping with the semiconductor layer 432. The insulating layer 488 is provided so as to cover the conductive layer 487.

The conductive layer 487 serves as a second gate electrode. Thus, the on-state current can be increased and the threshold voltage can be controlled, for example.

<Components>

The above-described components will be described below.

[Substrate]

A material having a flat surface can be used as the substrate included in the display device. The substrate through which light emitted from the display element is extracted is formed using a material that transmits the light. For example, a material such as glass, quartz, ceramics, sapphire, or an organic resin can be used.

The weight and thickness of the display panel can be decreased by using a thin substrate. Furthermore, a flexible display panel can be obtained by using a substrate that is thin enough to have flexibility. Alternatively, glass or the like that is thin enough to have flexibility can be used as the substrate. Alternatively, a composite material in which glass and a resin material are attached to each other with an adhesive layer may be used.

[Transistor]

The transistors each include a conductive layer functioning as the gate electrode, the semiconductor layer, a conductive layer functioning as the source electrode, a conductive layer functioning as the drain electrode, and an insulating layer functioning as the gate insulating layer.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

For example, silicon can be used as a semiconductor in winch a channel of the transistor is formed. In particular, amorphous silicon is preferably used as the silicon. By using amorphous silicon, a transistor can be formed over a large-sized substrate in high yield, resulting in excellent mass productivity.

Furthermore, silicon having crystallinity such as microcrystalline silicon, polycrystalline silicon, or single crystal silicon can also be used. In particular, polycrystalline silicon can be formed at, a lower temperature than single crystal silicon and has higher field-effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate or the like can be favorably used. Meanwhile, the top-gate transistor is preferable because an impurity region is easily formed in a self-aligned manner and variation in characteristics can be reduced. In that case, the use of polycrystalline silicon, single crystal silicon, or the like might be particularly preferable.

As a semiconductor material used for the transistor, an element of Group 14 (e.g., silicon or germanium) or a metal oxide can be used, for example. A semiconductor containing silicon, a semiconductor containing gallium arsenide, a metal oxide containing indium, or the like can be typically used.

In particular, a metal oxide having a wider band gap than silicon is preferably used. A semiconductor material having a wider band gap and a lower carrier density than silicon is preferably used because the off-state current of the transistor can be reduced.

A transistor with a metal oxide whose band gap is wider than that of silicon can hold charge stored in a capacitor that is series-connected to the transistor for a long time, owing to a low off-state current of the transistor. The use of such a transistor in pixels allows a driver circuit to stop while the gray level of an image displayed on display regions is maintained. As a result, a display device with an extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electric characteristics of the transistor including the semiconductor layer, the semiconductor layer preferably contains a stabilizer in addition to the above.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the metal oxide included in the semiconductor layer is greater than or equal to 2 eV, preferably greater than or equal to 2.5 eV further preferably greater than or equal to 3 eV. With the use of a metal oxide having such a wide energy gap, the off-state current of the transistor can be reduced.

In the case where the metal oxide contained in the semiconductor layer contains an In-M-Zn-based oxide, it is preferable that the atomic ratio of metal elements of a sputtering target used for forming a film of the In-M-Zn oxide satisfy In M and Zn M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

A metal oxide with a low carrier density is preferably used for the semiconductor layer. For example, the semiconductor layer is a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{-9}/cm^3$. Such a semiconductor layer has a low impurity concentration and a low density of defect states and thus has stable characteristics.

Note that without limitation to the compositions and materials described above, a material with an appropriate composition can be used depending on required semiconductor characteristics and electric characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the metal oxide contained in the semiconductor layer, oxygen vacancies are increased in the semiconductor layer, and the semiconductor layer might become n-type. Thus, the concentration of silicon or carbon (measured by secondary ion mass spectrometry) in the semiconductor layer is preferably lower than or equal to $2\times10^{18}$ atoms/cm$^3$, further preferably lower than or equal to $2\times10^{17}$ atoms/cm$^3$.

An alkali metal and an alkaline earth metal might generate carriers when bonded to a metal oxide, in which case the off-state current of the transistor might be increased. Therefore, the concentration of an alkali metal or alkaline earth metal of the semiconductor layer, which measured by secondary ion mass spectrometry, is preferably lower than or equal to $1\times10^{18}$ atoms/cm$^3$, further preferably lower than or equal to $2\times10^{16}$ atoms/cm$^3$.

The semiconductor layer a may have non-single-crystal structure, for example. Non-single-crystal structures include a polycrystalline structure, a microcrystalline structure, and an amorphous structure, for example. Among the non-single-crystal structures, the amorphous structure has the highest density of defect states.

A metal oxide having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, and a region having a single crystal structure. The mixed film has, for example, a single-layer structure or a stacked-layer structure including two or more of the above regions in some cases.

[Conductive Layer]

As material for gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, an alloy containing any of these metals as its main component, or the like can be used. A single layer structure or stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of the shape by etching is increased.

As a light-transmitting conductive material that can be used for the gate, source, and drain of the transistor and conductive layers such as wiring s and electrodes included in the display device, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the film thickness is set small enough to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as an acrylic or epoxy resin, a resin having a siloxane bond such as silicone, and an inorganic insulating material such as silicon oxide, silicon oxynitride, silicon nitride oxide, silicon nitride, or aluminum oxide.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode, or the like can be used.

The liquid crystal element controls transmission or non-transmission of light utilizing an optical modulation action of liquid crystal. The optical modulation action of liquid crystal is controlled by an electric field applied to the liquid crystal (including a horizontal electric field, a vertical electric field, and a diagonal electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one or liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition which includes liquid crystal exhibiting a blue phase and a chiral material has a short response time and optical isotropy. In addition, the liquid crystal composition that includes liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

The liquid crystal element may be a transmissive liquid crystal element, a reflective liquid crystal element, a transflective liquid crystal element, or the like.

In one embodiment of the present invention, in particular, a transmissive liquid crystal element can be suitably used.

In the case where a transmissive or transflective liquid crystal element is used, two polarizing plates are provided such that pair of substrates are sandwiched therebetween. Furthermore, a backlight is provided on the outer side of the polarizing plate. As the backlight, a direct-below backlight or an edge-light type backlight may be used. The direct-below backlight including a light-emitting diode (LED) is preferably used because local dimming is easily performed to improve the contrast. The edge-light type backlight is preferably used because the thickness of a module including the backlight can be reduced.

When an edge-light type backlight is off, see-through display can be performed.

[Coloring Layer]

As examples of a material that can be used for the coloring layers, a metal material, a resin material, and a resin material containing a pigment or dye can be given.

[Light-Blocking Layer]

Examples of a material that can be, used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The display device in which the liquid crystal element is used as a display element is described in this embodiment; however, a light-emitting element can also be used as a display element.

This embodiment, can be implemented in combination with any of the other embodiments as appropriate.

Embodiment 6

In this embodiment, an example of a method for crystallizing polycrystalline silicon that can be used in a semiconductor layer of a transistor and an example of a laser crystallization apparatus will be described.

To form a polycrystalline silicon layer having favorable crystallinity, the following method is preferable in which an amorphous silicon layer is provided over a substrate and crystallized by being irradiated with laser light. For example, a linear beam used as the laser light is emitted to the amorphous silicon layer while being moved over the substrate; thus, the polycrystalline silicon layer can be formed in a desired region over the substrate.

The method using a linear beam is relatively favorable throughput. On the other hand, the method tends to produce variations in crystallinity owing to a change m the output of laser light and a change in the beam profile caused by the output change because laser light is moved relative to a region and is emitted to the region a plurality of times. For example, a display device that uses a transistor including a semiconductor layer crystallized by this method in a pixel might display a random stripe pattern caused by variations in crystallinity.

Furthermore, the length of the linear beam is ideally more than or equal to that of one side of the substrate; however, the output of a laser oscillator and the structure of an optical system limit the length of the linear beam. Therefore, in processing a large-sized substrate, moving laser light back and forth over the substrate is down-to-earth. However, in this case, a region irradiated with laser light a plurality of times is produced and the region tends to have different crystallinity from the other region, causing display unevenness in the region.

To prevent the above-mentioned problem, an amorphous silicon layer formed over a substrate may be crystallized by being locally irradiated with laser light. The local laser irradiation tends to form a polycrystalline silicon layer having few variations in crystallinity.

Figure 29A:
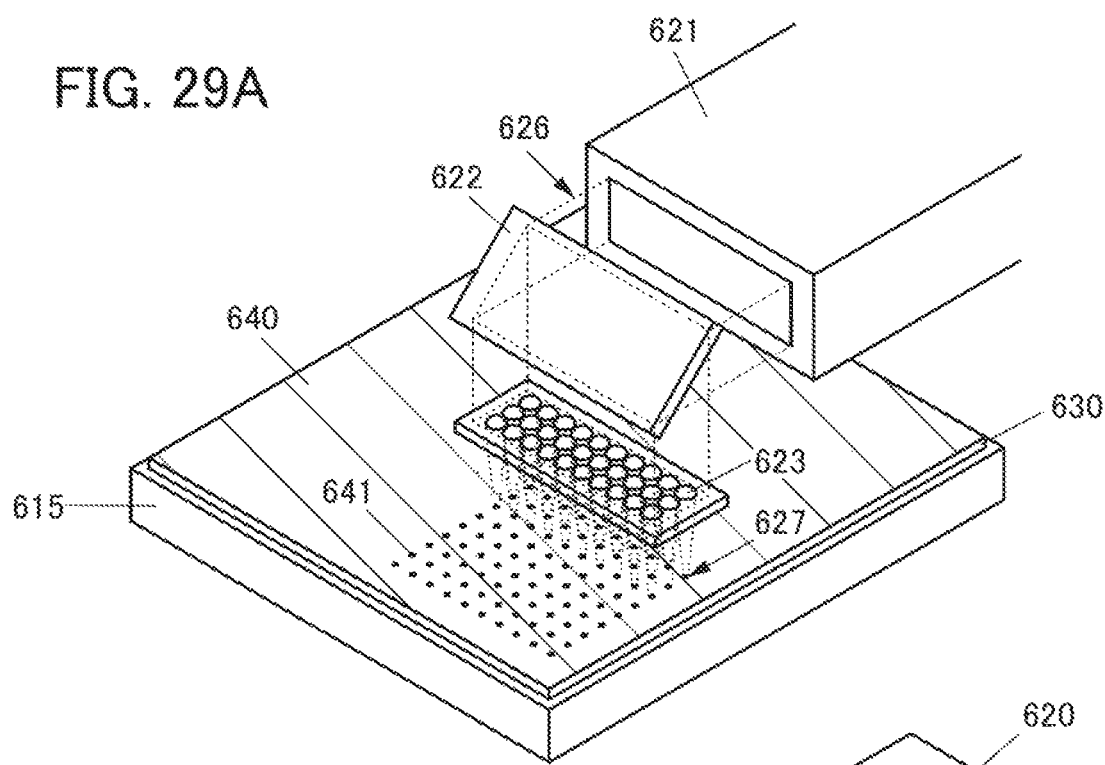
FIGS. 29A and 29B illustrate a laser irradiation method and a laser crystallization apparatus.

FIG. 29A illustrates a method, for locally irradiating an amorphous silicon layer formed over a substrate with laser light.

Laser light 636 emitted from an optical system unit 621 is reflected by a mirror 622 and enters a microlens array 623. The microlens array 623 condenses the laser light 626 to form a plurality of laser beams 627.

A substrate 630 over which an amorphous silicon layer 640 is formed is fixed to a stage 615. By irradiating, the amorphous silicon layer 640 with the plurality of laser beams 627, a plurality of polycrystalline silicon layers 641 can be formed at the same time.

The individual microlenses included in the microlens array 623 are preferably provided to match with the pixel pitch of the display device. Alternatively, the microlenses may be provided at intervals which are each an integral multiple of the pixel pitch. In either case, a repetition of the laser irradiation and the movement of the stage 615 in X or Y direction can form polycrystalline silicon layers in regions corresponding to all the pixels.

For example, in the case where the microlens array 623 includes the microlenses in I rows and J columns (I and J are natural numbers) at pixel pitches, laser light irradiation starts, from a predetermined position and the polycrystalline silicon layers 641 in I rows and J columns are formed. Then, the movement in the row direction is performed by a distance of J columns, and laser light irradiation is performed to form polycrystalline silicon layers 641 in I rows and J columns. Thus, the polycrystalline silicon layers 641 in I rows and 2J columns are formed. The repetition of this step can form the plurality of polycrystalline silicon layers 641 in a desired region. In the case where laser irradiation is performed back and forth, after the movement in the row direction is performed by a distance of J columns and laser light irradiation is performed, the movement in the column direction by a distance of I rows and laser light irradiation are repeatedly performed.

Note that if the frequency of the laser light, and the moving speed of the stage 615 are adjusted as appropriate, even the laser irradiation method with the movement of the stage 615 in one direction can form polycrystalline silicon layers at pixel pitches.

The size of the laser beam 627 can be, for example, an area which includes an semiconductor layer in one transistor, an area which includes an entire channel region in one transistor, or an area which includes part of a channel region in one transistor. The size can be selected from these in accordance with necessary electric characteristics of transistors.

Note that in the case where a display device including a plurality of transistors in one pixel is the laser irradiation target, the laser beam 627 may have an area including all the semiconductor layers of the transistors in one pixel. The laser beam 627 may have an area including all the semiconductor layers of transistors a plurality of pixels.

Figure 30A:
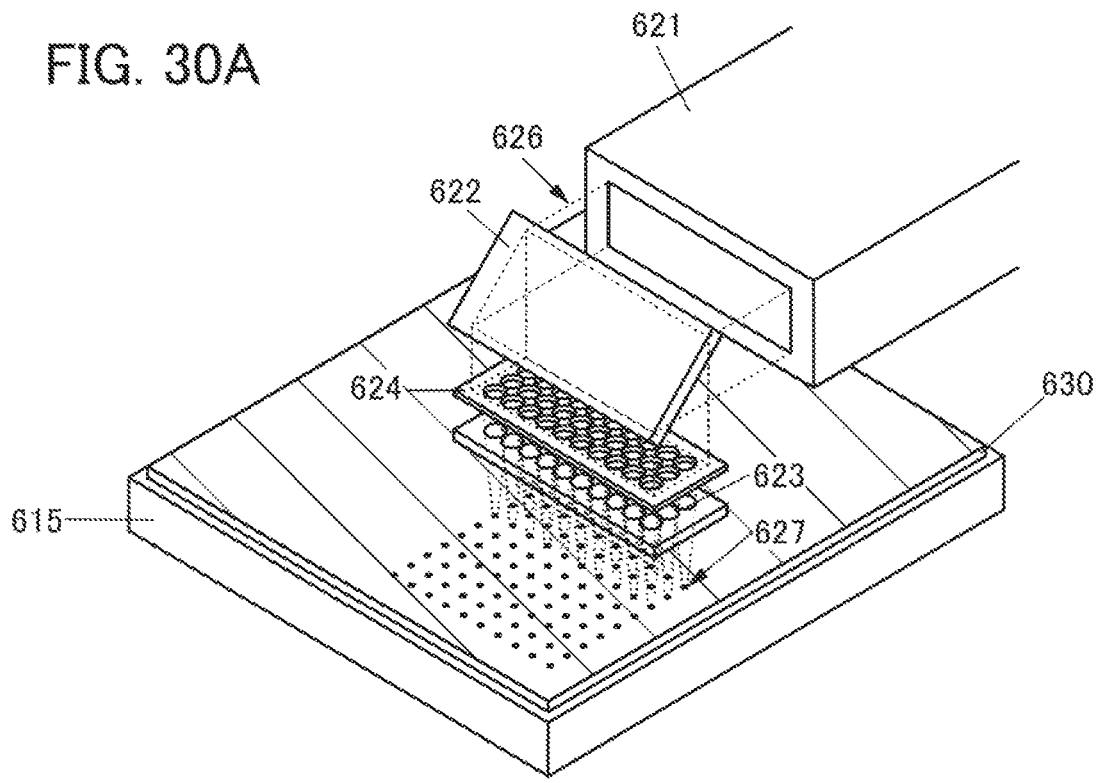
FIGS. 30A and 30B each illustrate a laser irradiation method.
Figure 30B:
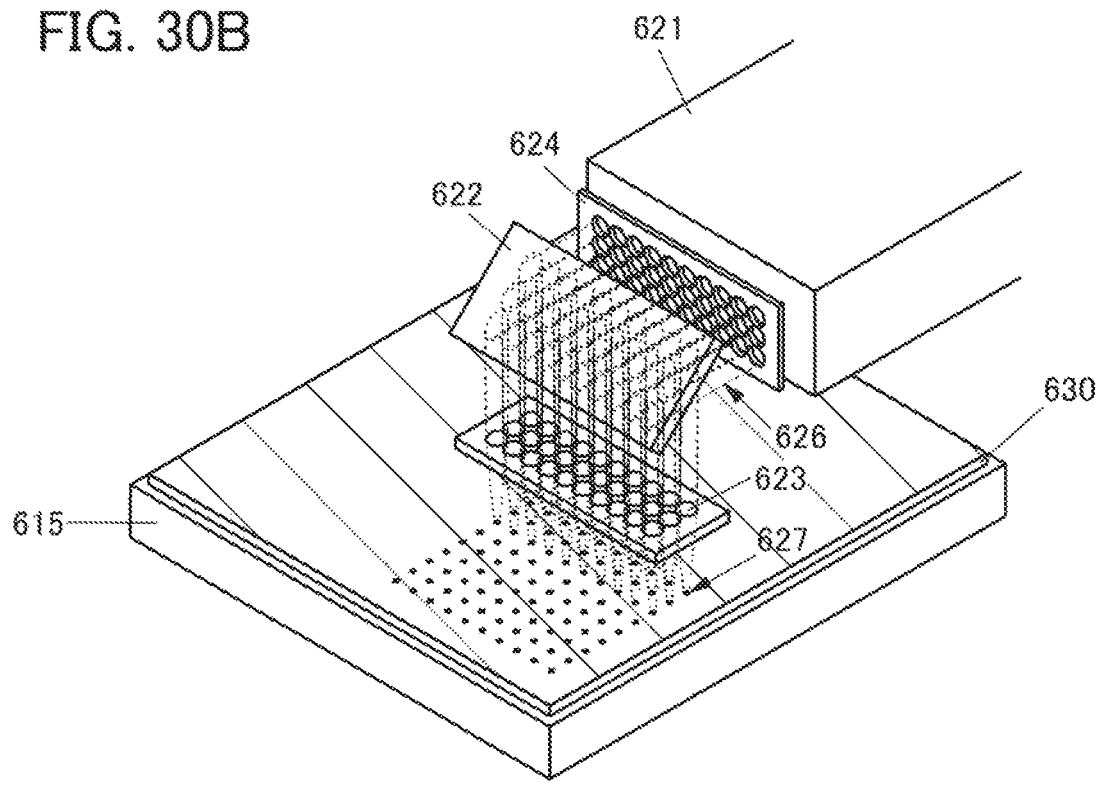

As illustrated in FIG. 30A, a mask 624 may be provided between the mirror 622 and the microlens array 623. The mask 624 is provided with a plurality of openings which correspond to the microlenses. The shape of the openings affects the shape of the laser beams 627. In the case where the mask 624 includes circular openings as in FIG. 30A, the laser beams 627 are circular. In the case where the mask 624 includes rectangular openings, the laser beams 627 are rectangular. The mask 624 is effective when only a channel region of a transistor is crystallized, for example. As illustrated in FIG. 30B, mask 624 may be provided between the optical system unit 621 and the mirror 622.

Figure 29B:
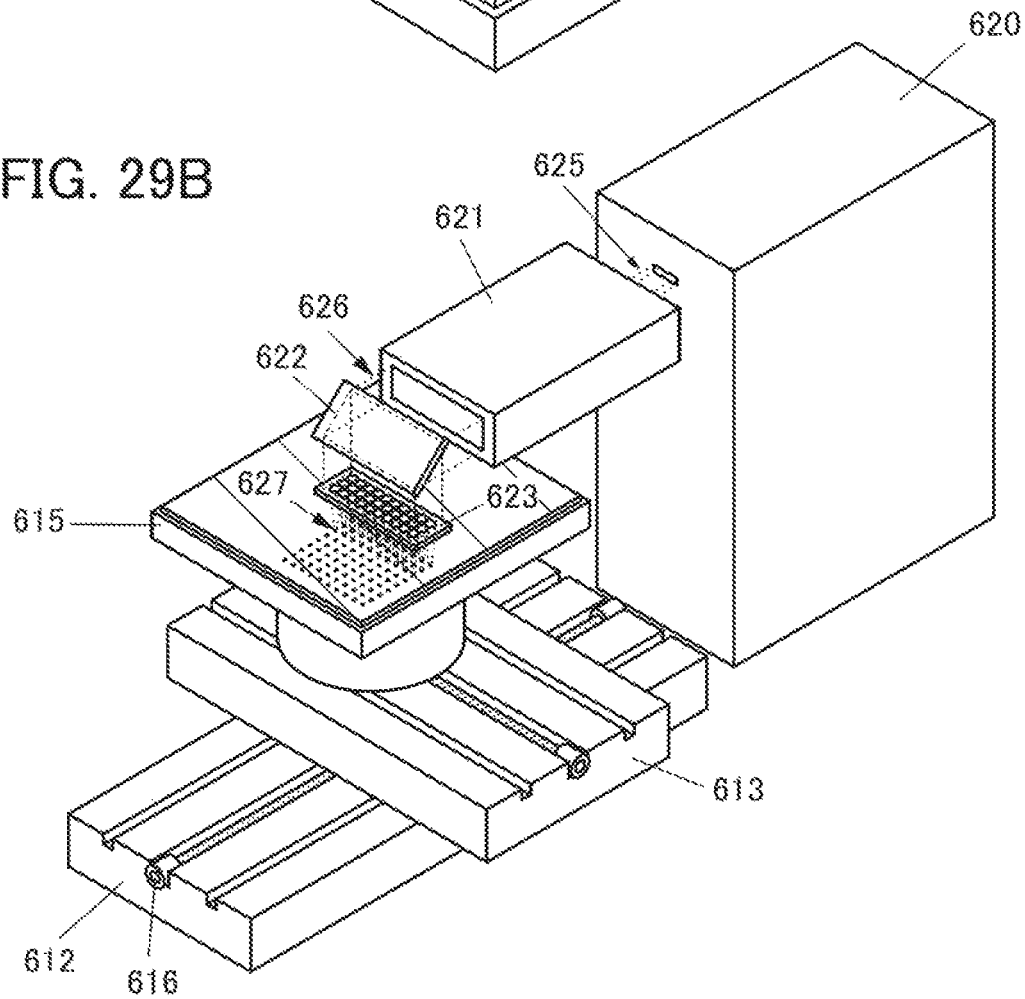

FIG. 29B is a perspective view illustrating a basic structure of a laser crystallization apparatus that can be used in the above-described local laser irradiation step. The laser crystallization apparatus includes a moving mechanism 612, a moving mechanism 613, and the stage 615 which are constituents of an X-Y stage. In addition, the laser crystallization apparatus includes a laser oscillator 620, the optical system unit 621, the mirror 622, and the microlens array 623 for forming the laser beams 627.

The moving mechanism 612 and the moving mechanism 613 each have a function of performing a reciprocating rectilinear motion in a horizontal direction. As a mechanism for supplying power to the moving mechanism 612 and the moving mechanism 613, a ball screw mechanism 616 which operates by a motor can be used, for example. The moving direction of the moving mechanism 612 is perpendicular to the moving direction of the moving mechanism 613, which gives a freedom of movement in X and Y directions to the stage 615 fixed to the moving mechanism 613.

The stage 615 includes a fixation mechanism such as a vacuum suction mechanism so as to fix the substrate 630 or the like to itself. Moreover, the stage 615 may include a heating mechanism as necessary. Although not shown, the stage 615 includes a pusher spring and its vertical movement mechanism. When the substrate 630 or the like is carried in or out, the substrate 630 or the like can be vertically moved.

The laser oscillator 620 outputs light with a wavelength and intensity suitable for the purpose of processing. A pulsed laser is preferable, or a CW laser may be used. Typically, an excimer laser capable of emitting ultraviolet light with a wavelength ranging from 351 nm to 353 nm (XeF), a wavelength of 308 nm (XeCl), or the like can be used. Alternatively, a second harmonic wave (515 nm, 532 nm, or the like) or a third harmonic wave (343 nm, 355 nm, or the like) of a solid-state laser such as a YAG laser or a fiber laser may be used. A plurality of laser oscillators 620 may be provided.

The optical system unit 621 includes a mirror, a beam expander, a beam homogenizer, or the like, for example, and can homogenize and expand the energy in-plane distribution of laser light 625 emitted from the laser oscillator 620.

As the mirror 622, a dielectric multilayer mirror can be used for example, and is set so that the incident angle or laser light can be substantially 45°. The microlens array 623 can be, for example, a quartz plate whose upper surface or both upper and lower surfaces have a shape of a plurality of convex lenses.

With the above-described laser crystallization apparatus, a polycrystalline silicon layer with few variations in crystallinity can be formed.

This embodiment can be implemented in combination with any of the other embodiments as appropriate.

Embodiment 7

In this embodiment, a structure example of an OS transistor that can be used in the above embodiment will be described.

Structure Example of Transistor

FIG. 31A is a top view illustrating a structure example of a transistor. FIG. 31B is a cross-sectional view taken along line X1-X2 in FIG. 31A. FIG. 31C is a cross-sectional view taken along line Y1-Y2 in FIG. 31A. In some cases, the direction of line X1-X2 is referred to as a channel length direction, and the direction of line Y1-Y2 is referred to as a channel width direction. FIG. 31B illustrates a cross-sectional structure of the transistor in the channel length direction, and FIG. 31C illustrates a cross-sectional structure of the transistor in the channel width direction. Note that to clarify the device structure, FIG. 31A does not illustrate some components.

The semiconductor device of one embodiment of the present invention includes insulating layers 812 to 820, metal oxide films 821 to 824, and conductive layers 850 to 853. A transistor 801 is formed over an insulating surface. FIGS. 31A to 31C illustrate the case where the transistor 801 is formed over an insulating layer 811. The transistor 801 is covered with the insulating layer 818 and an insulating layer 819.

Note that the insulating layers, the metal oxide films, the conductive layers, and the like that constitute the transistor 801 may each be a single film, or a stack including a plurality of films. They can be formed by any of a variety of deposition methods such as a sputtering method, a molecular beam epitaxy (MBE) method, a pulsed laser ablation (PLA) method, a CVD method, an atomic layer deposition (ALD) method, and the like, Note that examples of CVD methods include a plasma-enhanced CVD method, a thermal CVD method, and a metal organic CVD method.

The conductive layer 850 includes a region that functions as a gate electrode of the transistor 801. A conductive layer 851 and a conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer that is a stack of the insulating layers 814 to 816 includes a region that functions as a gate insulating layer on the back gate electrode side. The insulating layer 818 functions as an interlayer insulating layer. The insulating layer 819 functions as a barrier layer.

The metal oxide films 821 to 824 are collectively referred to as an oxide layer 830. As illustrated in FIGS. 31B and 31C, the oxide layer 830 includes a region where the metal oxide film 821, the metal oxide film 822, and the metal oxide film 824 are stacked in this order. In addition, a pair of the metal oxide films 823 are positioned over the conductive layer 851 and the conductive layer 852. When the transistor 801 is on, a channel formation region is mainly formed in the metal oxide film 822 of the oxide layer 830.

The metal oxide filthy 824 covers the metal oxide films 821 to 823, the conductive layer 851, and the conductive layer 852. The insulating layer 817 is positioned between the metal oxide film 823 and the conductive layer 850. The conductive layers 851 and 852 each include a region that overlaps with the conductive layer 850 with the metal oxide film 823, the metal oxide film 824, and the insulating layer 817 positioned therebetween.

The conductive layers 851 and 852 are formed from a hard mask that is used in the formation of the metal oxide films 821 and 822. Thus, the conductive layers 851 and 852 do not include a region that is in contact with the side surfaces of the metal oxide films 821 and 822. For example, the metal and 822 and the conductive layers 851 and 852 can be formed through the following conductive film is formed over a metal oxide film including a stack of two layers. The conductive film is processed (etched) into a desired shape so that a hard mask is formed. The hard mask is used to process the shape of the two-layered metal oxide film, forming the metal oxide films 821 and 822 that are stacked. Next, the hard mask is processed into a desired shape, forming the conductive layers 851 and 852.

Examples of insulating materials used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed using a single-layer structure or a stacked-layer structure containing any of these insulating materials. The layers used for the insulating layers 811 to 818 may include a plurality of insulating materials.

In this specification and the like, oxynitride refers to a compound in which the oxygen content is higher than the nitrogen content, and nitride oxide refers to a compound in which the nitrogen content is higher than the oxygen content.

In order to suppress an increase in oxygen vacancies in the oxide layer 830, the insulating layers 816 to 818 preferably contain oxygen. More preferably, the insulating layers 816 to 818 are formed using an insulating film from which oxygen is released by heating (hereinafter such an insulating film is also referred to as an insulating film containing excess oxygen). When oxygen is supplied from the insulating film containing excess oxygen to the oxide layer 830, the oxygen vacancies in the oxide layer 830 can be compensated. Thus, the reliability and electrical characteristics of the transistor 801 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment under an oxygen atmosphere, plasma treatment, or treatment using an ion implantation method, an ion doping method, or a plasma immersion ion implantation method, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 812 to 819 is preferably low in order to prevent an increase in the concentration of hydrogen in the oxide layer 830. In particular, the concentration of hydrogen in the insulating layers 813 to 818 is preferably low. Specifically, the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{19}$ atoms/cm$^3$.

The hydrogen concentration is measured by secondary ion mass spectrometry (SIMS).

In the transistor 801, the oxide layer 830 is preferably surrounded by an insulating layer with oxygen and hydrogen barrier properties (hereinafter such an insulating layer is also referred to as a barrier layer). The use of such a structure prevents release of oxygen from the oxide layer 830 and entry of hydrogen into the oxide layer 830. Thus, the reliability and electrical characteristics of the transistor 801 can be improved.

For example, the insulating layer 819 functions as a barrier layer and at least one of the insulating layers 811, 812, and 814 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 818 is described. In this example, each of the insulating layers 811, 812, 815, and 819 functions as a barrier layer. The insulating layers 816 to 818 are oxide layers containing excess oxygen. The insulating layer 811 is formed using silicon nitride. The insulating layer 812 is formed using aluminum oxide. The insulating layer 813 is formed using silicon oxynitride. The insulating layers 814 to 816 functioning as the gate insulating layers on the back gate electrode side are formed using a stack including silicon oxide, aluminum oxide, and silicon oxide. The insulating layer 817 functioning as the gate insulating layer on the front gate side is formed using silicon oxynitride. The insulating layer 818 functioning as the interlayer insulating layer is formed using silicon oxide. The insulating layer 819 is formed using aluminum oxide.

Examples of a conductive material used for the conductive layers 850 to 853 include a metal such as molybdenum, titanium, tantalum, tungsten, aluminum, copper, chromium, neodymium, or scandium; and a metal nitride containing any of the above metals as its component (e.g., tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 850 to 853 is described. The conductive layer 850 is a single layer of tantalum nitride or tungsten. Alternatively, the conductive layer 850 is a stack including tantalum nitride, tantalum, and tantalum nitride. The conductive layer 851 is formed with a single layer of tantalum nitride or a stack including tantalum nitride and tungsten. The structure of the conductive layer 852 is the same as that of the conductive layer 851. The conductive layer 853 is formed with a single layer of tantalum nitride or a stack including tantalum nitride and tungsten.

In order to reduce the off-state current of the transistor 801, for example, the energy gap of the metal oxide film 822 is preferably large. The energy gap of the metal oxide film 822 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 830 preferably exhibits crystallinity. At least the metal oxide film 822 preferably exhibits crystallinity. With the structure described above, the transistor 801 can have high reliability and favorable electrical characteristics.

As the glue oxide of the metal oxide film 822, for example an In—Ga oxide, an In—Zn oxide, or an In-M-Zn oxide (M is Al, Ga, Y, or Sn) can be used. The metal oxide film 822 is not limited to the oxide layer containing indium. The metal oxide film 822 can be formed using a Zn—Sn oxide, a Ga—Sn oxide, or a Zn—Mg oxide, for example. The metal oxide films 821, 823, and 824 can be formed using an oxide that is similar to the oxide of the metal oxide film 822. In particular, each of the metal oxide films 821, 823 and 824 can be formed with a Ga oxide.

When an interface state is formed at the interface between the metal oxide film 822 and the metal oxide film 821, a channel formation region is formed also in the vicinity of the interface, which causes a change in the threshold voltage of the transistor 801. It is preferable that the metal oxide film 821 contain at least one of the metal elements contained in the metal oxide film 822 as its component. Accordingly, an interface state is unlikely to be formed at the interface between the metal oxide film 822 and the metal oxide film 821, and variations in the electrical characteristics of the transistor 801, such as the threshold voltage, can be reduced.

The metal oxide film 824 preferably contains at least one of the metal elements contained in the metal oxide film 822 as its component because interface scattering is unlikely to occur at the interface between the metal oxide film 822 and the metal oxide film 824, and carrier transfer is not inhibited. Thus, the field-effect mobility of the transistor 801 can be increased.

It is preferable that the metal oxide film 822 have the highest carrier mobility among the metal oxide films 821 to 824. Accordingly, a channel can be formed in the metal oxide film 822 that is apart from the insulating layers 816 and 817.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content is increased, overlaps of the s orbitals of In atoms are increased; therefore, an oxide having a high content of indium has higher mobility than, an oxide having a low content of indium. Therefore, an oxide having a high content of indium is used as the metal oxide film, so that carrier mobility can be increased.

Thus, for example, the metal oxide film 822 is formed using an In—Ga—Zn oxide, and the metal oxide films 821 and 823 are formed using a Ga oxide. For example, when the metal oxide films 821 to 823 are formed using an In-M-Zn oxide, the In content of the metal oxide film 822 is made higher than the In content of the metal oxide films 821 and 823. In the case where the In-M-Zn oxide is formed by a sputtering method, the In content can be changed by a change in the atomic ratio of metal elements of a target.

For example, it is preferable that the atomic ratio of metal elements of a target used for depositing the metal oxide film 822 be In:M:Zn=1:1:1, 3:1:2, or 4:2:4.1. For example, it is preferable that the atomic ratio of metal elements of a target used for depositing the metal oxide films 821 and 823 be In:M:Zn=1:3:2, or 1:3:4. The atomic ratio of an In-M-Zn oxide deposited using a target of In:M:Zn=4:2:4.1 is approximately In:M:Zn=4:2:3.

In order that the transistor 801 can have stable electrical characteristics, it is preferable to reduce the concentration of impurities in the oxide layer 830. In the metal oxide, hydrogen, nitrogen, carbon, silicon, and a metal element other than a main component are impurities. For example, hydrogen and nitrogen form donor states to increase the carrier density. In addition, silicon and carbon form impurity states in the metal oxide. The impurity states serve as traps and might cause the electrical characteristics of the transistor to deteriorate.

For example, the oxide layer 830 includes a region where the concentration of silicon is lower than or equal to $2 \times 10^{18}$ atoms/cm$^3$, preferably lower than or equal to 2×10$^{16}$ atoms/cm$^3$. The same applies to the concentration of carbon in the oxide layer 830.

The oxide layer 830 includes a region where the concentration of an alkali metal is lower than or equal to 1×10$^{18}$ atoms/cm$^3$, preferably lower than or equal to 2×10$^{16}$ atoms/cm$^3$. The same applies to the concentration of an alkaline earth metal in the oxide layer 830.

The oxide layer 830 includes a region where the concentration of hydrogen is lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atom/cm$^3$.

The above concentrations of the impurities in the oxide layer 830 are measured by SIMS.

In the case where the metal oxide film 822 contains oxygen vacancies, donor states are formed by entry of hydrogen into sites of oxygen vacancies in some cases. The oxygen vacancy is a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by a reduction in hydrogen in the metal oxide film 822 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transistor 801 is likely to be normally-on when, the metal oxide film 822 contains hydrogen because the metal oxide film 822 includes a channel formation region. Accordingly, it is preferable that hydrogen in the metal oxide film 822 be reduced as much as possible.

FIGS. 31A to 31C illustrate an example in which the oxide layer 830 has a four-layer structure; however, one embodiment of the present invention is not limited thereto. For example, the oxide layer 830 can have a three-layer structure without the metal oxide film 821 or without the metal oxide film 823. Alternatively, the oxide layer 830 may include one or more metal oxide films that are similar to the metal oxide films 821 to 824 at two or more of the following positions: between given layers in the oxide layer 830, over the oxide layer 830, and below the oxide layer 830.

Figure 32:
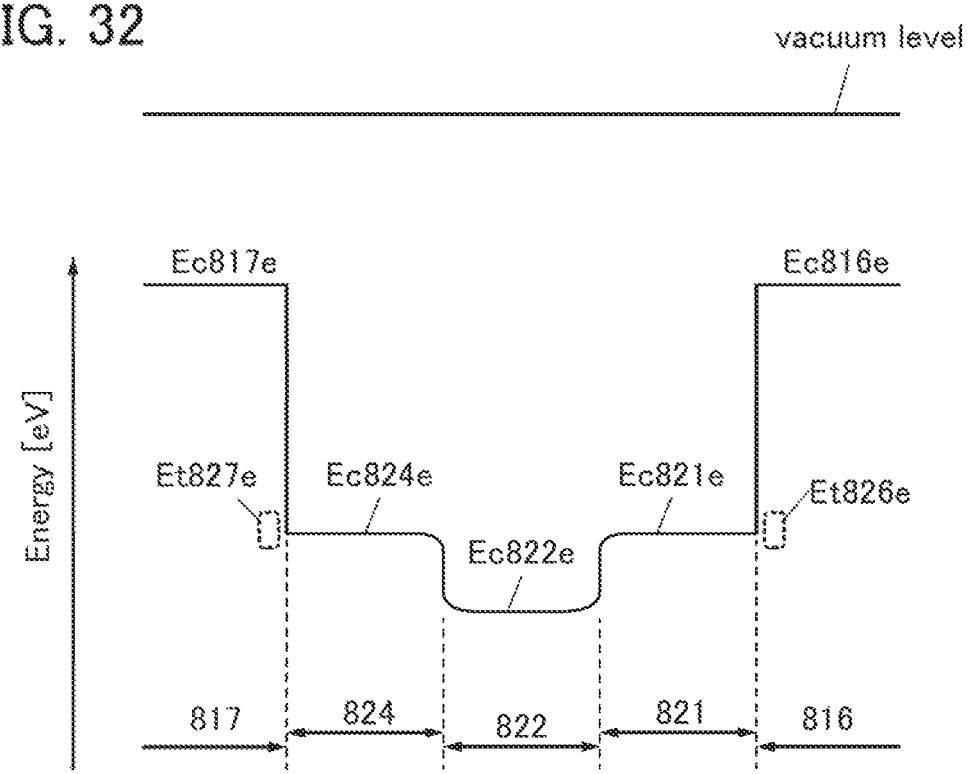
FIG. 32 shows an energy band diagram.

Effects of the stack including the metal oxide films 821, 822, and 824 are described with reference to FIG. 32. FIG. 32 is a schematic diagram showing the energy band structure of a channel formation region of the transistor 801.

In FIG. 32, Ec816e, Ec821e, Ec822e, Ec824e, and Ec817e indicate the energy of the conduction band minimums of the insulating layer 816, the metal oxide film 821, the metal oxide film 822, the metal oxide film 824, and the insulating layer 817, respectively.

Here, the energy difference between the vacuum level and the conduction band minimum (the difference is also referred to as electron affinity) corresponds to a value obtained by subtracting an energy gap from the energy difference between the vacuum level and the valence band maximum (the difference is also referred to as an ionization potential). The energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Since the insulating layers 816 and 817 are insulators, Ec816e and Ec817e are closer to the vacuum level than Ec821e, Ec822e, and Ec824e (i.e., the insulating layers 816 and 817 have lower electron affinities than the metal oxide films 821, 822, and 824).

The metal oxide film 822 as a higher electron affinity than the metal oxide films 821 and 824. For example, the difference in electron affinity between the metal oxide films 822 and 821 and the difference in electron affinity between the metal oxide films 822 and 824 are each greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV. Note that the electron affinity refers to an energy difference between the vacuum level and the conduction band minimum.

When voltage is applied to the gate electrode (the conductive layer 850) of the transistor 801, a channel is mainly formed in the metal oxide film 822 having the highest electron affinity among the metal oxide films 821, 822, and 824.

An indium gallium oxide has a small electron affinity and a high oxygen-blocking property. Therefore, the metal oxide film 824 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of e metal oxide films 821 and 822 between the metal oxide films 821 and 822. Furthermore, in some cases, there is a mixed region of the metal oxide films 824 and 822 between the metal oxide films 824 and 822. Because the mixed region has a low interface state density, a region with a stack formed with the metal oxide films 821, 822, and 824 has a band structure where energy at each interface and in the vicinity of the interface is changed continuously (continuous junction).

Electrons transfer mainly through then 822 in the oxide layer 830 having such an energy band structure. Therefore, even when an interface state exists at the interface between the metal oxide film 821 and the insulating layer 816 or the interface between the metal oxide film 824 and the insulating layer 817, electron transfer in the oxide layer 830 is less likely to be inhibited and the on-state current of the transistor 801 can be increased.

Although trap states Et826e and Et827e due to impurities or defects might be formed in the vicinity of the interface between the metal oxide film 821 and the insulating layer 816 and the vicinity of the interface between the metal oxide film 824 and the insulating layer 817 as illustrated in FIG. 32, the metal oxide film 822 and the trap states Et826e and Et827e can be separated from to each other owing to the existence of the metal oxide films 821 and 824.

Note that when a difference between Ec821e and Ec822e is small, an electron in the metal oxide film 822 might reach the trap state Et826e by passing over the difference in energy. Since the electron is trapped at the trap state Et826e, negative fixed charge is generated at the interface with the insulating film, causing the threshold voltage of the transistor to be shifted in a positive direction. The same applies to the case where a difference in energy between Ec822e and Ec824e is small.

Each of the difference in energy between Ec821e and Ec822e and the difference energy between Ec824e and Ec822e is preferably greater than or equal to 0.1 eV, further preferably greater than or equal to 0.15 eV so that a change in the threshold voltage of the transistor 801 can be reduced and the transistor 801 can have favorable electrical characteristics.

Note that the transistor 801 does not necessarily include a back gate electrode.

Example of Stacked-Layer Structure

Next, a structure of a semiconductor device in which an OS transistor and another transistor are stacked will be described. The structure described below can be used for the register 200 in FIG. 12 to FIG. 14 or the like. For example, a transistor Tr100 can be used as transistors M22 and M25 in FIG. 14, and a transistor Tr200 can be used as transistors M21 and M24 in FIG. 14.

Figure 33:
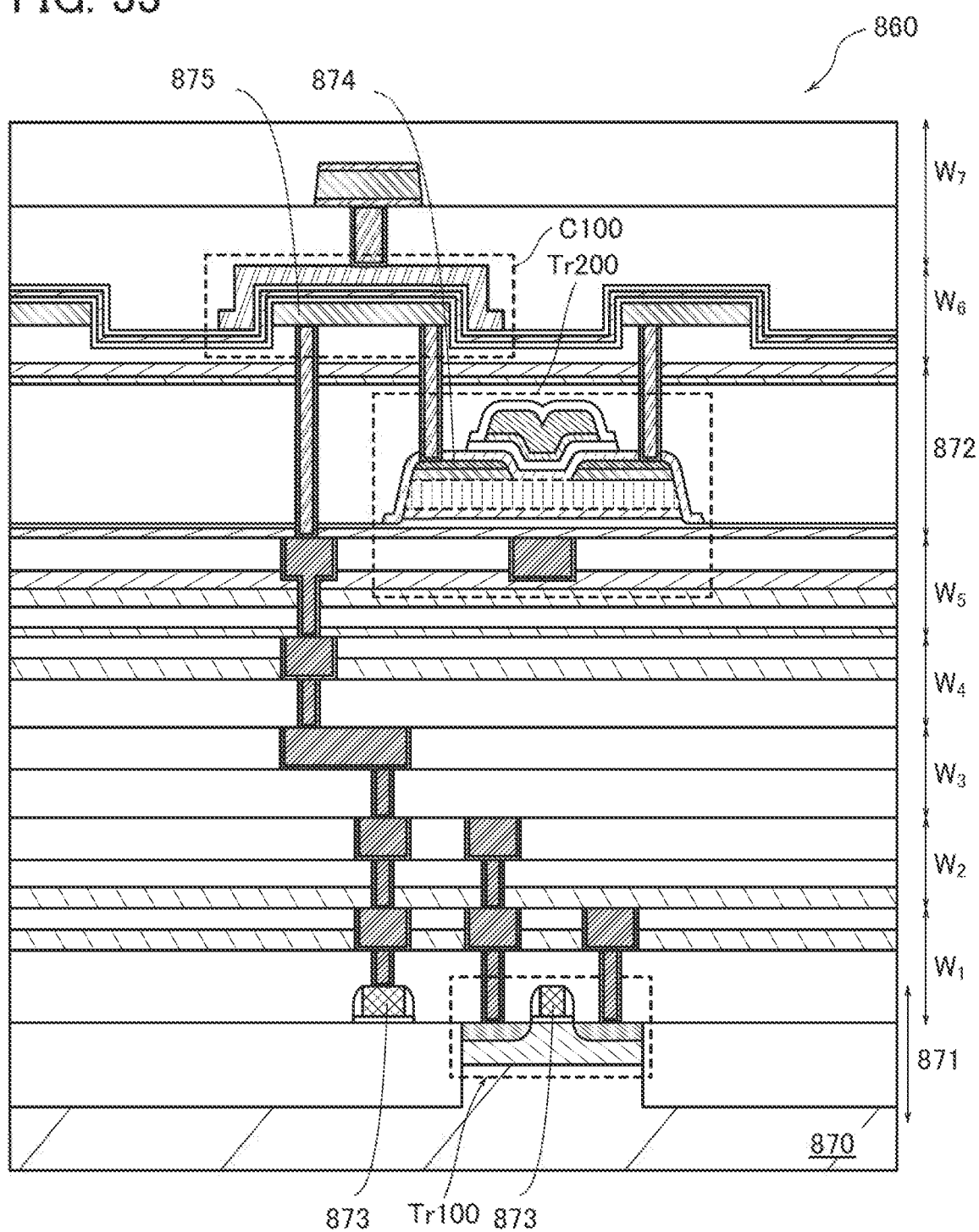
FIG. 33 illustrates a structure example of a semiconductor device.

FIG. 33 illustrates an example of a stacked-layer structure of a semiconductor device 860 in which a transistor Tr100 that is a Si Transistor, a transistor Tr200 that is an OS transistor, and a capacitor C100 are stacked.

The semiconductor device 860 includes a stack including a CMOS layer 871, wiring layers $W_1$ to $W_5$, as transistor layer 872, and wiring layers $W_6$ and $W_7$.

The transistor Tr100 is provided in the CMOS layer 871. A channel formation region of the transistor Tr100 is provided in a single crystal silicon wafer 870. A gate electrode 873 of the transistor Tr100 is connected to one electrode 875 of the capacitor 100 through the wiring layers $W_1$ to $W_5$.

The transistor Tr200 is provided in the transistor layer 872. In FIG. 33 the transistor Tr200 has a structure similar to that of the transistor 801 (FIGS. 31A to 31C). An electrode 874 corresponding to one of a source and a drain of the transistor Tr200 is connected to the one electrode 875 of the capacitor C100. Note that in FIG. 33, the transistor Tr200 includes its back gate electrode in the wiring layer $W_5$. The capacitor C100 is formed in the wiring layer $W_6$.

The OS transistor and other components are stacked in this manner, whereby the area of the circuit can be reduced.

This embodiment can be implemented combination with any of the embodiments as appropriate.

Embodiment 8

Described in this embodiment is a metal oxide applicable to an OS transistor described in the above embodiment. In particular, the details of a metal oxide and a cloud-aligned composite (CAC)-OS will be described below.

A CAC-OS or a CAC metal oxide has a conducting function in apart of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating: function, the CAC-OS or the CAC metal oxide can have a switching function (on/off) function). In the CAC-OS or CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, a CAC metal oxide can be called a matrix composite or a metal matrix composite.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such as In—Ga—Zn oxide may be particularly referred to as CAC-IGZO) has a composition in which materials separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystal (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has structure in which a region including $GaO_{X3}$ as a main component and as region including $In_{X2}Zn_{Y2}O_{Z2}$ or $InO_{X1}$ as a main component are unevenly distributed and mixed.

The CAC-OS structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$, or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{X2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{Y2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices.

This embodiment can be implemented in combination with any of the other embodiments as appropriate.

Embodiment 9

In this embodiment, an electronic device of one embodiment of the present invention will be described with reference to drawings.

The display system described in any of the above embodiments can be provided in any of the examples of the electronic device described below. Thus, an electronic device which can display a high-quality image can be provided.

The display portion of the electronic device of one embodiment of the present invention can display an image with a resolution of, for example, full high definition, 2K, 4K, 8K, 16K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of electronic devices include electronic devices having relatively large screens such as a television set, a desktop or laptop personal computer, a monitor of a computer, digital signage, and a large game machine (e.g., a pachinko machine); a digital camera; a digital video camera;

a digital photo frame; a mobile phone; a portable game console; a portable information terminal; an audio reproducing device; and the like.

The electronic device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 34A:
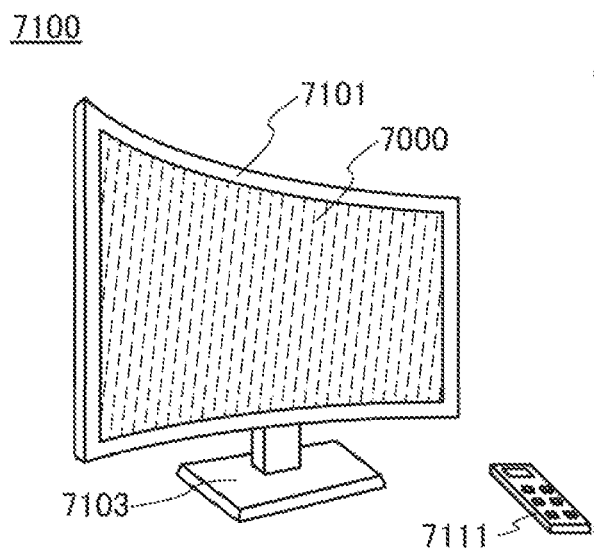
FIGS. 34A to 34D each illustrate a structure example of an electronic device.

FIG. 34A illustrates an example of a television device. In a television device 7100, a display portion 7000 is incorporated in a housing 7101. In addition, here, the housing 7101 is supported by a stand 7103.

The display system or semiconductor device of one embodiment of the present invention can be used in the display portion 7000.

The television device 7100 illustrated in FIG. 34A can be operated with an operation switch provided in the housing 7101 or a separate remote controller 7111. Furthermore, the display portion 7000 may include a touch sensor. The television device 7100 can be operated by touching the display portion 7000 with a finger or the like. Furthermore, the remote controller 7111 may be provided with a display portion for displaying data outputted from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 34B:
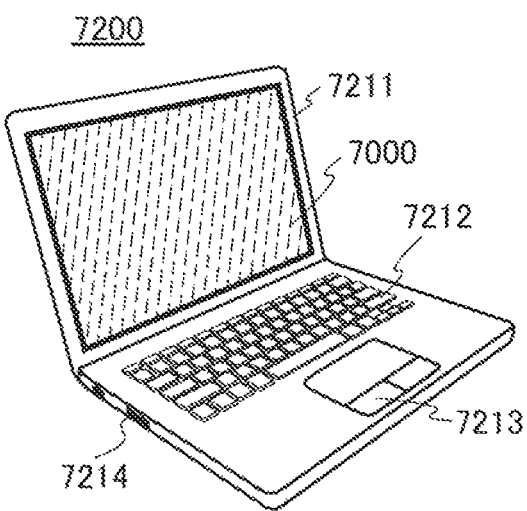

FIG. 34B illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display system or semiconductor device of one embodiment of the present invention can be used in the display portion 7000.

Figure 34C:
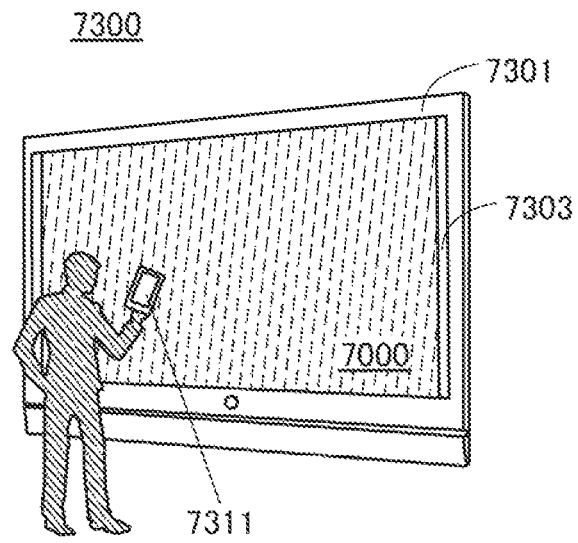
Figure 34D:
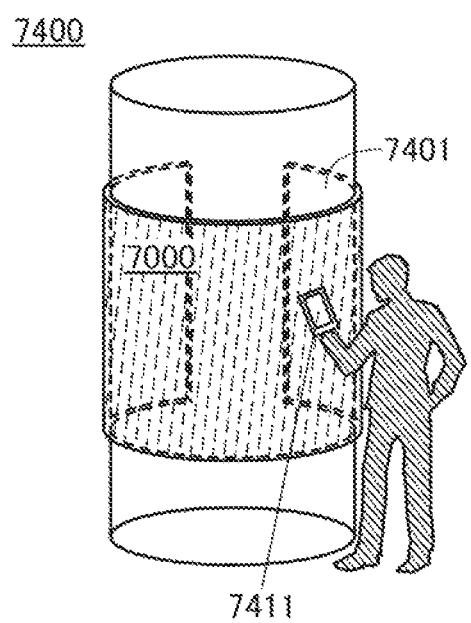

FIGS. 34C and 34D illustrate examples of digital signages.

A digital signage 7300 illustrated in FIG. 34C includes a housing 7301, the display portion 7000, a speaker 7303, and the like. Also, the digital signage can include an LED lamp, operation keys (including a power switch or an operation switch), a connection terminal, a variety of sensors, a microphone, and the like.

FIG. 34D illustrates a digital signage 7400 mounted on a cylindrical pillar 7401. The digital signage 7400 includes the display portion 7000 provided along a curved surface of the pillar 7401.

The display system or semiconductor device of one embodiment of the present invention can be used for each of the display portions 7000 illustrated in FIGS. 34C and 34D.

A larger area of the display portion 7000 can provide more information at a time. In addition, the larger display portion 7000 attracts more attention, so that the effectiveness of the advertisement can be increased, for example.

It is preferable to use a touch panel in the display portion 7000 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Furthermore, as illustrated in FIGS. 34C and 34D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the portable information terminal 7311 or 7411. Moreover, by operation of the portable information terminal 7311 or 7411, a displayed image on the display portion 7000 can be switched.

Furthermore, it is possible to make the digital signage 7300 or 7400 execute a game with use of the screen of the portable information terminal 7311 or 7411 as an operation means (controller). Thus, an unspecified number of people can join in and enjoy the game concurrently.

This embodiment can be implemented in combination with any of the other embodiments as appropriate.

REFERENCE NUMERALS

10: display system, 20: display portion, 21: pixel portion, 22: driver circuit, driver circuit, 24: timing controller, 30: signal generation portion, 31: front end portion, 32: decoder, 33: image processing circuit, 34: receiving portion, 35: interface, 36: control circuit, 40: correction circuit, 41: encoder, 42: decoder, 50: arithmetic processing device, 51: region, 52: pixel, 53: driver circuit, 54: driver circuit 130: product-sum operation element, multiplier element, 132: CM, 133: adder element, 134: activation function element, 135: CM, 140: programmable switch, 141: arithmetic layer, 142: switching layer, 160: switch, 161: CM, 162: switch, 200: register, 210: scan chain register portion, 211: register, 212: selector, 213: flip-flop circuit, 214: retention circuit, 215: memory circuit, 216: memory circuit, 220: register portion, 221: register, 222: latch circuit, 223: MUX, 300: display device, 301: substrate, 310: display portion, 311: pixel, 321: TAB tape, 322: integrated circuit, 331: printed board, 332: TAB tape, 333: integrated circuit, 350: display device, 351: display panel, 352: pixel portion, 353: driver circuit, 354: driver circuit, 355: pixel, 360: FPC, 370: display region, 400: display device, 411: substrate, 412: substrate, 420: liquid crystal element, 421: conductive layer, 422: liquid crystal layer, 423: conductive layer, 424: alignment film, 426: insulating layer, 430: transistor, 431: conductive layer, 432: semiconductor layer, 433: conductive layer, 434: insulating layer, 435: impurity semiconductor layer, 437: semiconductor layer, 438: connection portion, 439: polarizing plate, 441: coloring layer, 442: light-blocking layer, 460: capacitor, 481: insulating layer, 482: insulating layer, 483: insulating layer, 484: insulating layer, 485: insulating layer, 486: conductive layer, 487: conductive layer, 488: insulating, layer, 490 backlight unit, 612: moving mechanism, 613: moving mechanism, 615: stage, 616: ball screw mechanism, 620: laser oscillator, 621: optical system unit 622: mirror, 623: microlens array, 624: mask, 625: laser light, 626: laser light, 627: laser beam, 630: substrate, 640: amorphous silicon layer, 641: polycrystalline silicon layer, 801: transistor, 811: insulating layer, 812: insulating layer, 813: insulating layer, 814: insulating layer, 815: insulating layer, 816: insulating layer, 817: insulating layer, 818: insulating layer, 819: insulating layer, 820: insulating layer, 821: metal oxide film, 822: metal oxide film, 823: metal oxide film, 824: metal oxide film, 830: oxide layer, 850: conductive layer, 851: conductive layer, 852: conductive layer, 853: conductive layer, 860: semiconductor device, 870: single crystal silicon wafer, 871: CMOS layer, 872; transistor layer, 873: gate electrode, 874: electrode, 875: electrode, 940: display region, 7000: display portion, 7100: television device, 7101: housing, 7103: stand, 7111: remote controller, 7200: laptop personal computer, 7211: housing, 7212: keyboard, 7213: pointing, device, 7214: external connection port, 7300: digital signage, 7301: housing, 7303: speaker, 7311: portable information terminal, 7400: digital signage, 7401: pillar, and 7411: information terminal.

This application is based on Japanese Patent Application Serial. No. 2017-008039 filed with Japan Patent Office on Jan. 20, 2017 and Japanese Patent Application Serial No. 2017-008040 filed with Japan Patent Office on Jan. 20, 2017, the entire contents of which are hereby incorporated by reference.

The invention claimed is:

1. A display system comprising:
a signal generation portion configured to generate an image signal;
a display device comprising a first display panel and a second display panel, each of the first display panel and the second display panel comprising a plurality of pixels;
a first source driver circuit and a second source driver circuit configured to supply the image signal to the first display panel and the second display panel, respectively;
a correction circuit comprising a neural network; and
an arithmetic processing device configured to perform neural network learning and to supply a weight coefficient obtained by the learning to the correction circuit,
wherein the neural network is configured to correct the image signal so as to compensate for discontinuity of an image displayed on a boundary between the first display panel and the second display panel, and
wherein the learning is performed by updating the weight coefficient so that a difference between the image signal and a signal corresponding to an image displayed on the display device is equal to or lower than a certain value.

2. A display system comprising:
a signal generation portion configured to generate an image signal;
a display device comprising a first display panel and a second display panel, each of the first display panel and the second display panel comprising a plurality of pixels;
a first source driver circuit and a second source driver circuit configured to supply the image signal to the first display panel and the second display panel, respectively;
a correction circuit comprising a neural network; and
an arithmetic processing device configured to perform neural network learning and to supply a weight coefficient obtained by the learning to the correction circuit,
wherein the neural network is configured to correct the image signal for the pixels in a vicinity of a boundary between the first display panel and the second display panel, and
wherein the learning is performed by updating the weight coefficient so that a difference between the image signal and a signal corresponding to an image displayed on the display device is equal to or lower than a certain value.

3. The display system according to claim 1,
wherein the neural network comprises an autoencoder, and
wherein the autoencoder comprises a decoder and an encoder.

4. The display system according to claim 1, wherein each of the plurality of pixels comprises a transistor comprising amorphous silicon in a channel formation region.

5. The display system according to claim 1, wherein each of the plurality of pixels comprises a transistor comprising a metal oxide in a channel formation region.

6. An electronic device comprising the display system according to claim 1.

7. The display system according to claim 2,
wherein the neural network comprises an autoencoder, and
wherein the autoencoder comprises a decoder and an encoder.

8. The display system according to claim 2, wherein each of the plurality of pixels comprises a transistor comprising amorphous silicon in a channel formation region.

9. The display system according to claim 2, wherein each of the plurality of pixels comprises a transistor comprising a metal oxide in a channel formation region.

10. An electronic device comprising the display system according to claim 2.

* * * * *